United States Patent
Miura et al.

(10) Patent No.: US 12,160,085 B2
(45) Date of Patent: Dec. 3, 2024

(54) LASER SYSTEM AND ELECTRONIC DEVICE MANUFACTURING METHOD

(71) Applicant: Gigaphoton Inc., Tochigi (JP)

(72) Inventors: Taisuke Miura, Oyama (JP); Takashi Onose, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 916 days.

(21) Appl. No.: 17/220,993

(22) Filed: Apr. 2, 2021

(65) Prior Publication Data
US 2021/0226411 A1 Jul. 22, 2021

Related U.S. Application Data

(63) Continuation of application No. PCT/JP2018/043433, filed on Nov. 26, 2018.

(51) Int. Cl.
*H01S 5/0687* (2006.01)
*H01S 3/225* (2006.01)
(Continued)

(52) U.S. Cl.
CPC ............ *H01S 5/0687* (2013.01); *H01S 3/225* (2013.01); *H01S 3/2308* (2013.01);
(Continued)

(58) Field of Classification Search
CPC ...... H01S 5/0687; H01S 3/225; H01S 3/2308; H01S 3/2375; H01S 5/0092;
(Continued)

(56) References Cited

U.S. PATENT DOCUMENTS 6,614,584 B1 * 9/2003 Govorkov ............. G02F 1/3544
359/328
7,593,440 B2 * 9/2009 Spinelli ................. H01S 3/2383
372/9
(Continued)

FOREIGN PATENT DOCUMENTS

CN 103348286 A 10/2013
CN 107210576 A 9/2017
(Continued)

OTHER PUBLICATIONS

An Office Action mailed by China National Intellectual Property Administration on Sep. 13, 2022, which corresponds to Chinese Patent Application No. 201880094243.X and is related to U.S. Appl. No. 17/220,993; with English language translation.
(Continued)

*Primary Examiner* — M. A. Golub-Miller
(74) *Attorney, Agent, or Firm* — Studebaker & Brackett PC

(57) ABSTRACT

A laser system according to one aspect of the present disclosure includes a wavelength-variable first solid-state laser device configured to output a first pulse laser beam; a wavelength conversion system including a first nonlinear crystal configured to wavelength-convert the first pulse laser beam and a first rotation stage configured to change a first incident angle of the first pulse laser beam on the first nonlinear crystal; an excimer amplifier configured to amplify a pulse laser beam wavelength-converted by the wavelength conversion system; and a control unit configured to receive, from an external device, data of a target center wavelength of an excimer laser beam output from the excimer amplifier, control a wavelength of the first pulse laser beam in accordance with the instructed target center wavelength, and control the first incident angle on the first
(Continued)

nonlinear crystal in accordance with an average value of the target center wavelength.

7 Claims, 65 Drawing Sheets

(51) Int. Cl.
*H01S 3/23* (2006.01)
*H01S 5/00* (2006.01)
*H01S 5/042* (2006.01)
*H01S 5/0683* (2006.01)
*H01S 5/40* (2006.01)
*H01S 3/067* (2006.01)
*H01S 5/50* (2006.01)

(52) U.S. Cl.
CPC .......... *H01S 3/2375* (2013.01); *H01S 5/0092* (2013.01); *H01S 5/0428* (2013.01); *H01S 5/0683* (2013.01); H01S 3/06754 (2013.01); H01S 3/2366 (2013.01); H01S 5/4012 (2013.01); H01S 5/509 (2013.01)

(58) Field of Classification Search
CPC .. H01S 5/0428; H01S 5/0683; H01S 3/06754; H01S 3/2366; H01S 5/4012; H01S 5/509
See application file for complete search history.

(56) References Cited

U.S. PATENT DOCUMENTS

| | | | | |
|---|---|---|---|---|
| 8,503,068 | B2 * | 8/2013 | Sakuma | G02F 1/37 |
| | | | | 359/328 |
| 8,717,665 | B2 * | 5/2014 | Gerbier | G02F 1/3501 |
| | | | | 359/326 |
| 9,812,841 | B2 * | 11/2017 | Onose | H01S 3/2391 |
| 9,929,529 | B2 | 3/2018 | Onose et al. | |
| 10,095,084 | B2 * | 10/2018 | Kobayashi | H01S 3/0092 |
| 11,764,541 | B2 * | 9/2023 | Miura | H01S 5/06808 |
| | | | | 372/25 |
| 11,804,697 | B2 * | 10/2023 | Miura | H01S 5/06821 |
| 2008/0037599 | A1 * | 2/2008 | Ma | H01S 5/0092 |
| | | | | 372/21 |
| 2008/0037600 | A1 | 2/2008 | Ma et al. | |
| 2010/0128343 | A1 * | 5/2010 | Imai | G02F 1/3532 |
| | | | | 359/326 |
| 2013/0170509 | A1 * | 7/2013 | Tokuhisa | H01S 3/2391 |
| | | | | 372/5 |
| 2013/0215916 | A1 | 8/2013 | Kakizaki et al. | |
| 2013/0279526 | A1 * | 10/2013 | Kakizaki | H01S 3/2375 |
| | | | | 372/98 |
| 2013/0343410 | A1 | 12/2013 | Oshita et al. | |
| 2017/0244215 | A1 * | 8/2017 | Watanabe | H01S 3/10092 |
| 2017/0338619 | A1 | 11/2017 | Onose et al. | |
| 2019/0006817 | A1 | 1/2019 | Onose et al. | |
| 2019/0103725 | A1 | 4/2019 | Fuchimukai | |
| 2019/0245321 | A1 | 8/2019 | Kakizaki et al. | |
| 2021/0226411 | A1 * | 7/2021 | Miura | H01S 5/0687 |
| 2023/0178957 | A1 * | 6/2023 | Tanaka | H01S 5/022 |
| | | | | 372/22 |

FOREIGN PATENT DOCUMENTS

| | | |
|---|---|---|
| CN | 108780980 A | 11/2018 |
| EP | B 062 146 A1 | 8/2016 |
| JP | 2000-091205 A | 3/2000 |
| JP | 2003-043534 A | 2/2003 |
| JP | 2004-526334 A | 8/2004 |
| JP | 2013-062484 A | 4/2013 |
| WO | 02/093699 A1 | 11/2002 |
| WO | 2018/008142 A1 | 1/2018 |
| WO | 2018/105082 A1 | 6/2018 |

OTHER PUBLICATIONS

International Search Report issued in PCT/JP2018/043433; mailed Feb. 19, 2019.
International Preliminary Report On Patentability issued in PCT/JP2018/043433; issued Feb. 19, 2019.

* cited by examiner

TABLE DATA TDA

| No. | PULSE ENERGY E11xite OF FIRST PULSE EXCITATION LIGHT SOURCE E11xite | PULSE ENERGY E1 OF FIRST PULSE LASER BEAM E1 |
|---|---|---|
| 1 | E11xite(1) | E1(1) |
| 2 | E11xite(2) | E1(2) |
| 3 | E11xite(3) | E1(3) |
| ⋮ | ⋮ | ⋮ |
| p | E11xite(p) | E1(p) |

TABLE DATA TDB

| No. | PULSE ENERGY E22xite OF THIRD PULSE EXCITATION LIGHT SOURCE E22xite | PULSE ENERGY E2 OF SECOND PULSE LASER BEAM E2 |
|---|---|---|
| 1 | E22xite(1) | E2(1) |
| 2 | E22xite(2) | E2(2) |
| 3 | E22xite(3) | E2(3) |
| ⋮ | ⋮ | ⋮ |
| p | E22xite(p) | E2(p) |

Fig. 43

TABLE DATA TD1

| No. | WAVELENGTH RANGE A1≤ λ ct<B1 | | CENTER WAVELENGTH AT WHICH WAVELENGTH CONVERSION EFFICIENCY IS MAXIMUM VALUE (nm) | INCIDENT ANGLE $\theta 1$ ON CLBO1 $\theta 1(°)$ |
|---|---|---|---|---|
| | A1(nm) | B1(nm) | | |
| 1 | 193.2 | 193.2+4δλθ | 193.2+2δλθ | θ1(1) |
| 2 | 193.2+4δλθ | 193.2+8δλθ | 193.2+6δλθ | θ1(2) |
| 3 | 193.2+8δλθ | 193.2+12δλθ | 193.2+10δλθ | θ1(3) |
| .... | .... | .... | .... | .... |
| k | 193.2+(4k−4)δλθ | 193.2+4kδλθ | 193.2+(4k−2)δλθ | θ1(k) |
| .... | .... | .... | .... | .... |
| n | 193.2+(4n−4)δλθ | 193.2+4nδλθ | 193.2+(4n−2)δλθ | θ1(n) |

Fig. 44

TABLE DATA TD2

| No. | WAVELENGTH RANGE A2≤ λ ct<B2 | | CENTER WAVELENGTH AT WHICH WAVELENGTH CONVERSION EFFICIENCY IS MAXIMUM VALUE (nm) | INCIDENT ANGLE θ2 ON CLBO2 θ2(°) |
|---|---|---|---|---|
| | A2(nm) | B2(nm) | | |
| 1 | 193.2 | 193.2+ δλθ | 193.2 | θ2(1) |
| 2 | 193.2+ δλθ | 193.2+3 δλθ | 193.2+2 δλθ | θ2(2) |
| 3 | 193.2+3 δλθ | 193.2+5 δλθ | 193.2+4 δλθ | θ2(3) |
| 4 | 193.2+5 δλθ | 193.2+7 δλθ | 193.2+6 δλθ | θ2(4) |
| 5 | 193.2+7 δλθ | 193.2+9 δλθ | 193.2+8 δλθ | θ2(5) |
| 6 | 193.2+9 δλθ | 193.2+11 δλθ | 193.2+10 δλθ | θ2(6) |
| 7 | 193.2+11 δλθ | 193.2+13 δλθ | 193.2+12 δλθ | θ2(7) |
| .... | .... | .... | .... | .... |
| J-1 | 193.2+(2J-5) δλθ | 193.2+(2J-3) δλθ | 193.2+(2J-4) δλθ | θ2(J-1) |
| J | 193.2+(2J-3) δλθ | 193.2+(2J-1) δλθ | 193.2+(2J-2) δλθ | θ2(J) |
| J+1 | 193.2+(2J-1) δλθ | 193.2+(2J+1) δλθ | 193.2+(2J) δλθ | θ2(J+1) |
| .... | .... | .... | .... | .... |
| m-1 | 193.2+(2m-5) δλθ | 193.2+(2m-3) δλθ | 193.2+(2m-4) δλθ | θ2(m-1) |
| m | 193.2+(2m-3) δλθ | 193.2+(2m-1) δλθ | 193.2+(2m-2) δλθ | θ2(m) |
| m+1 | 193.2+(2m-1) δλθ | 193.2+(2m+1) δλθ | 193.2+(2m) δλθ | θ2(m+1) |

TABLE DATA TD3

| No. | CHARGING VOLTAGE Vhv (kV) | PULSE ENERGY E OF PULSE LASER BEAM AMPLIFIED BY EXCIMER AMPLIFIER E (mJ) | PULSE ENERGY Es OF THIRD PULSE LASER BEAM Es (mJ) |
|---|---|---|---|
| 1 | Vhv(1) | E(1) | Es(1) |
| 2 | Vhv(2) | E(2) | Es(1) |
| 3 | Vhv(3) | E(3) | Es(1) |
| 4 | Vhv(4) | E(4) | Es(1) |
| 5 | Vhv(1) | E(5) | Es(2) |
| 6 | Vhv(2) | E(6) | Es(2) |
| 7 | Vhv(3) | E(7) | Es(2) |
| 8 | Vhv(4) | E(8) | Es(2) |
| 9 | Vhv(1) | E(9) | Es(3) |
| 10 | Vhv(2) | E(10) | Es(3) |
| 11 | Vhv(3) | E(11) | Es(3) |
| 12 | Vhv(4) | E(12) | Es(3) |
| ⋮ | ⋮ | ⋮ | ⋮ |

Fig. 57

```
START
  ↓
CALL TABLE DATA TD4 DESCRIBING RELATIONSHIP
BETWEEN WAVELENGTH CONVERSION EFFICIENCY η FOR    — S351
PULSE ENERGY OF FIRST PULSE LASER BEAM AND δλct
  ↓
CALCULATE WAVELENGTH CONVERSION                    — S352
EFFICIENCY η AT δλct FROM TABLE DATA TD4
  ↓
TRANSMIT DATA OF WAVELENGTH CONVERSION             — S353
EFFICIENCY η TO LASER CONTROL UNIT
  ↓
RETURN
```

Fig. 58

TABLE DATA TD4

| No. | DIFFERENCE $\delta\lambda ct$ BETWEEN TARGET CENTER WAVELENGTH $\delta\lambda ct$ AND AVERAGE TARGET CENTER WAVELENGTH $\lambda ctav$ $\delta\lambda ct = \lambda ct - \lambda ctav$ | WAVELENGTH CONVERSION EFFICIENCY η OF WAVELENGTH CONVERSION SYSTEM |
|---|---|---|
| 1 | $\delta\lambda ct(1)$ | $\eta(1)$ |
| 2 | $\delta\lambda ct(2)$ | $\eta(2)$ |
| 3 | $\delta\lambda ct(3)$ | $\eta(3)$ |
| ⋮ | ⋮ | ⋮ |
| J | $\delta\lambda ct(J)$ | $\eta(J)$ |

LASER SYSTEM AND ELECTRONIC DEVICE MANUFACTURING METHOD

CROSS-REFERENCE TO RELATED APPLICATIONS

The present application is a continuation application of International Application No. PCT/JP2018/043433, filed on Nov. 26, 2018, the entire contents of which are hereby incorporated by reference.

BACKGROUND

1. Technical Field

The present disclosure relates to a laser system and an electronic device manufacturing method.

2. Related Art

Improvement in resolution of semiconductor exposure apparatuses (hereinafter simply referred to as "exposure apparatuses") has been desired due to miniaturization and high integration of semiconductor integrated circuits. For this purpose, exposure light sources that output light with shorter wavelengths have been developed. As the exposure light source, a gas laser apparatus is used in place of a conventional mercury lamp. As a gas laser apparatus for exposure, a KrF excimer laser apparatus that outputs ultraviolet light having a wavelength of 248 nm and an ArF excimer laser apparatus that outputs ultraviolet light having a wavelength of 193 nm are currently used.

As current exposure technology, immersion exposure is practically used in which a gap between a projection lens of an exposure apparatus and a wafer is filled with a liquid and a refractive index of the gap is changed to reduce an apparent wavelength of light from an exposure light source. When the immersion exposure is performed using the ArF excimer laser apparatus as the exposure light source, the wafer is irradiated with ultraviolet light having a wavelength of 134 nm in water. This technology is referred to as ArF immersion exposure (or ArF immersion lithography).

The KrF excimer laser apparatus and the ArF excimer laser apparatus have a large spectral line width of about 350 to 400 pm in natural oscillation. Thus, chromatic aberration of a laser beam (ultraviolet light), which is reduced and projected on a wafer by a projection lens of an exposure apparatus, occurs to reduce resolution. Then, a spectral line width (also referred to as a spectral width) of a laser beam output from the gas laser apparatus needs to be narrowed to the extent that the chromatic aberration can be ignored. For this purpose, a line narrowing module (LNM) having a line narrowing element is provided in a laser resonator of the gas laser apparatus to narrow the spectral width. The line narrowing element may be etalon, grating, or the like. A laser apparatus with such a narrowed spectral width is referred to as a line narrowing laser apparatus.

LIST OF DOCUMENTS

Patent Documents

Patent Document 1: U.S. Pat. No. 9,929,529
Patent Document 2: US Published Patent Application No. 2008/0037600
Patent Document 3: Japanese Unexamined Patent Application Publication No. 2003-43534

SUMMARY

A laser system according to one aspect of the present disclosure includes a wavelength-variable first solid-state laser device configured to output a first pulse laser beam; a wavelength conversion system including a first nonlinear crystal configured to wavelength-convert the first pulse laser beam output from the first solid-state laser device and a first rotation stage configured to change a first incident angle of the first pulse laser beam on the first nonlinear crystal; an excimer amplifier configured to amplify a pulse laser beam wavelength-converted by the wavelength conversion system; and a control unit configured to receive, from an external device, data of a target center wavelength of an excimer laser beam output from the excimer amplifier, control a wavelength of the first pulse laser beam in accordance with the target center wavelength, and control the first incident angle on the first nonlinear crystal in accordance with an average value of the target center wavelength.

An electronic device manufacturing method according to one aspect of the present disclosure includes generating an excimer laser beam with a laser system, the laser system including a wavelength-variable first solid-state laser device configured to output a first pulse laser beam, a wavelength conversion system including a first nonlinear crystal configured to wavelength-convert the first pulse laser beam output from the first solid-state laser device and a first rotation stage configured to change a first incident angle of the first pulse laser beam on the first nonlinear crystal, an excimer amplifier configured to amplify a pulse laser beam wavelength-converted by the wavelength conversion system, and a control unit configured to receive, from an external device, data of a target center wavelength of an excimer laser beam output from the excimer amplifier, control a wavelength of the first pulse laser beam in accordance with the target center wavelength, and control the first incident angle on the first nonlinear crystal in accordance with an average value of the target center wavelength; outputting the excimer laser beam to an exposure apparatus; and exposing the excimer laser beam onto a photosensitive substrate within the exposure apparatus to manufacture an electronic device.

A laser system according to one aspect of the present disclosure includes a wavelength-variable first solid-state laser device configured to output a first pulse laser beam; a wavelength conversion system including a first nonlinear crystal configured to wavelength-convert the first pulse laser beam output from the first solid-state laser device and a first rotation stage configured to change a first incident angle of the first pulse laser beam on the first nonlinear crystal; an excimer amplifier configured to amplify a pulse laser beam wavelength-converted by the wavelength conversion system; and a control unit configured to receive, from an external device, data of a target center wavelength of an excimer laser beam output from the excimer amplifier, and control the first incident angle on the first nonlinear crystal such that wavelength conversion efficiency of the first nonlinear crystal has a maximal value at a middle wavelength in a first wavelength range to which the target center wavelength belongs, the first wavelength range being separated to include, as a boundary wavelength in the first wavelength range, a wavelength at which a first allowable efficiency minimum value lower than maximum conversion efficiency of the first nonlinear crystal is obtained in accordance with a characteristic of the wavelength conversion efficiency of the first nonlinear crystal changing depending on the first incident angle and the wavelength, and the wavelength conversion efficiency of the first nonlinear crystal being determined to be equal to or higher than the first allowable efficiency minimum value at a specific first incident angle for each first wavelength range.

BRIEF DESCRIPTION OF THE DRAWINGS

With reference to the accompanying drawings, some embodiments of the present disclosure will be described below merely by way of example.

FIG. 43 is a table showing an example of table data TD1.

FIG. 44 is a table showing an example of table data TD2.

FIG. 57 is a flowchart of an example of a subroutine applied to step S235 in FIG. 56.

FIG. 58 is a table showing an example of table data TD4.

DESCRIPTION OF EMBODIMENTS

Figure 1:
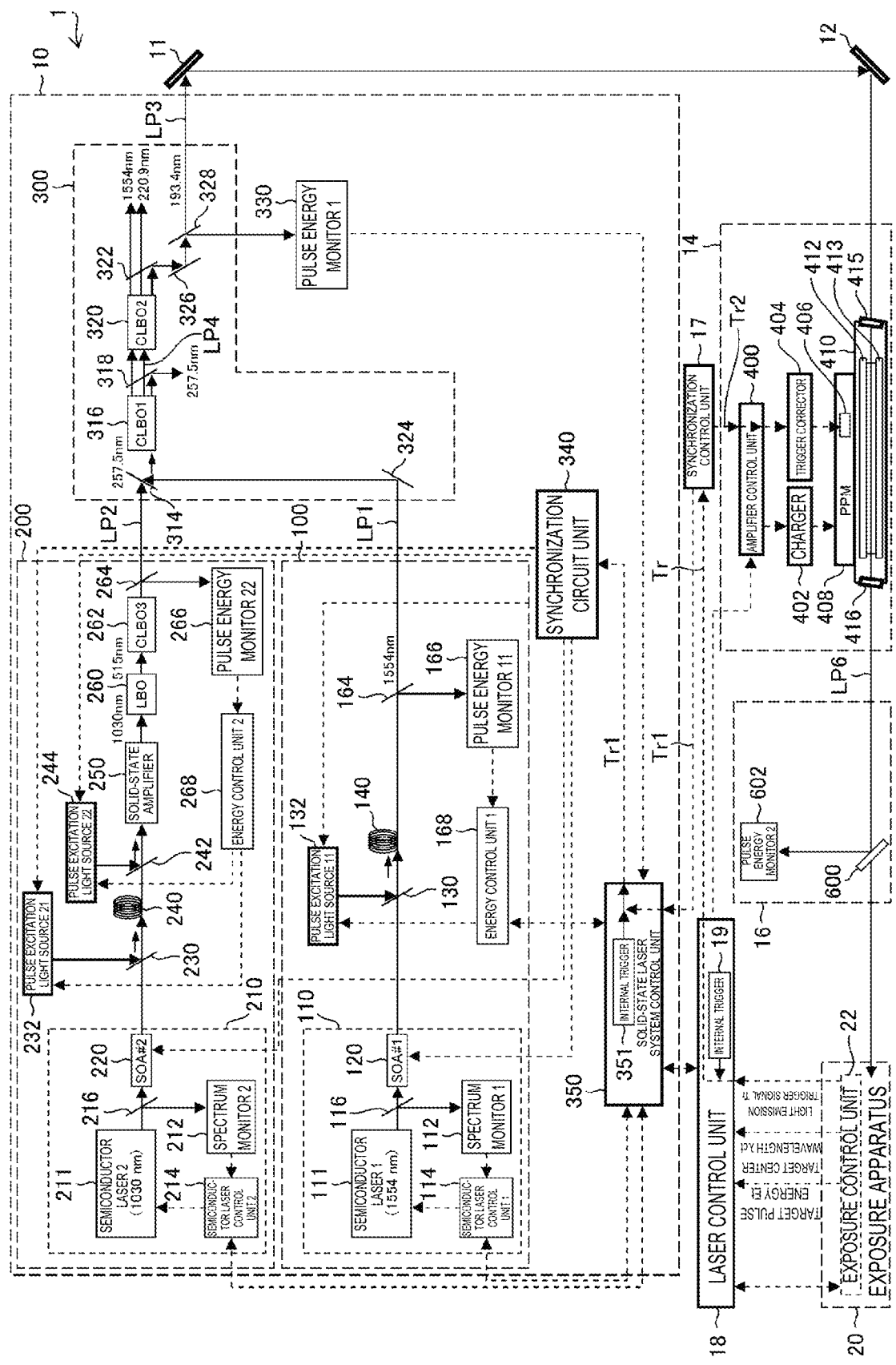
FIG. 1 schematically shows an exemplary configuration of a laser system.

<Contents>
1. Overview of laser system
    1.1 Configuration
    1.2 Operation
    1.3 Example of processing of laser control unit
    1.4 Example 1 of processing of solid-state laser system control unit
    1.5 Example of semiconductor laser system
        1.5.1 Configuration
        1.5.2 Operation
    1.6 Example of processing of first semiconductor laser control unit
    1.7 Example of processing of second semiconductor laser control unit
    1.8 Example of processing of first energy control unit
    1.9 Example of processing of second energy control unit
2. Problem
3. Embodiment 1
    3.1 Configuration
    3.2 Description of wavelength conversion efficiency of wavelength conversion system
    3.3 Wavelength dependence of wavelength conversion efficiency
    3.4 Operation
        3.4.1 Example 2 of processing of solid-state laser system control unit
        3.4.2 Example 1 of processing of wavelength conversion system control unit
    3.5 Effect
4. Embodiment 2
    4.1 Configuration
    4.2 Operation
        4.2.1 Example 2 of processing of wavelength conversion system control unit
        4.2.2 Example of processing for calculating, from target center wavelength $\lambda ct$, incident angle $\theta 1$ on first CLBO crystal and incident angle $\theta 2$ on second CLBO crystal
    4.3 Effect
5. Embodiment 3
    5.1 Configuration
    5.2 Operation
        5.2.1 Example of operation in saturation region with respect to injection pulse energy of excimer amplifier
        5.2.2 Example 2 of processing of laser control unit
    5.3 Effect
6. Embodiment 4
    6.1 Configuration
    6.2 Operation
        6.2.1 Example of controlling excitation intensity in accordance with injection pulse energy to excimer amplifier
        6.2.2 Example 3 of processing of laser control unit
        6.2.3 Example 3 of processing of wavelength conversion system control unit
    6.3 Effect
7. Embodiment 5
    7.1 Configuration
    7.2 Operation
        7.2.1 Example of suppressing pulse energy variation by pulse energy control of first solid-state laser device
        7.2.2 Example 3 of processing of solid-state laser system control unit
        7.2.3 Example 4 of processing of wavelength conversion system control unit
    7.3 Effect
8. Embodiment 6
    8.1 Configuration
    8.2 Operation
        8.2.1 Example of suppressing pulse energy variation by pulse energy control of second solid-state laser device
        8.2.2 Example 4 of processing of solid-state laser system control unit
    8.3 Effect
    8.4 Variant 9. Example of excimer amplifier
   9.1 Multipath amplification
   9.2 Amplification with ring resonator
10. Specific example of spectrum monitor
   10.1 Example of spectrum monitor using spectrometer and reference laser beam source
      10.1.1 Configuration
      10.1.2 Operation
   10.2 Example of spectrum monitor using heterodyne interferometer
      10.2.1 Configuration
      10.2.2 Operation
11. Example of CW oscillation reference laser beam source
   11.1 CW oscillation reference laser beam source of wavelength region of 1547.2 nm or 1554 nm
   11.2 CW oscillation reference laser beam source of wavelength region of 1030 nm
12. Example of semiconductor optical amplifier
   12.1 Configuration
   12.2 Operation
13. Example of semiconductor laser system suppressing stimulated Brillouin scattering (SBS) of optical fiber amplifier
   13.1 Configuration
   13.2 Operation
   13.3 Effect
   13.4 Others
14. Embodiment 7
   14.1 Configuration
   14.2 Operation
   14.3 Control example of wavelength
   14.4 Control example of pulse energy
      14.4.1 Case of operation in saturation region of input/output characteristic of excimer amplifier
      14.4.2 Case of correction of pulse energy by controlling excitation intensity of excimer amplifier
      14.4.3 Example of suppressing pulse energy variation by pulse energy control of first solid-state laser device
   14.5 Variant
15. Electronic device manufacturing method
16. Others Now, with reference to the drawings, embodiments of the present disclosure will be described in detail. The embodiments described below illustrate some examples of the present disclosure, and do not limit contents of the present disclosure. Also, all configurations and operations described in the embodiments are not necessarily essential as configurations and operations of the present disclosure. The same components are denoted by the same reference numerals, and overlapping descriptions are omitted.

1. Overview of Laser System 1.1 Configuration

FIG. 1 schematically shows an exemplary configuration of a laser system 1. The laser system 1 includes a solid-state laser system 10, a first highly reflective mirror 11, a second highly reflective mirror 12, an excimer amplifier 14, a monitor module 16, a synchronization control unit 17, and a laser control unit 18.

The solid-state laser system 10 includes a first solid-state laser device 100 that outputs a first pulse laser beam LP1, a second solid-state laser device 200 that outputs a second pulse laser beam LP2, a wavelength conversion system 300, a pulse energy monitor 330, a synchronization circuit unit 340, and a solid-state laser system control unit 350.

The first solid-state laser device 100 includes a first semiconductor laser system 110, a dichroic mirror 130, a first pulse excitation light source 132, a first fiber amplifier 140, a beam splitter 164, a pulse energy monitor 166, and a first energy control unit 168.

The first semiconductor laser system 110 includes a first semiconductor laser 111, a first spectrum monitor 112, a first semiconductor laser control unit 114, a first beam splitter 116, and a first semiconductor optical amplifier 120. In FIG. 1 and thereafter, for example, "semiconductor laser 1" and "SOA #1" with numerical values represent a first semiconductor laser and a first semiconductor optical amplifier (SOA), respectively. "SOA" is an abbreviation for "semiconductor optical amplifier".

The first semiconductor laser 111 is a light source that outputs a single longitudinal mode laser beam, and can change an oscillation wavelength near a wavelength of 1554 nm. The first semiconductor laser 111 may be, for example, a distributed feedback (DFB) semiconductor laser. The distributed feedback semiconductor laser is referred to as "DFB laser". The DFB laser can change an oscillation wavelength by current control and/or temperature control.

The first beam splitter 116 is arranged to reflect part of the laser beam output from the first semiconductor laser 111 and cause the laser beam to enter the first spectrum monitor 112. The first spectrum monitor 112 monitors a spectrum of the incident laser beam and detects the oscillation wavelength of the first semiconductor laser 111. The first semiconductor laser control unit 114 is connected to the first spectrum monitor 112 and the solid-state laser system control unit 350, and controls operation of the first semiconductor laser 111.

The first semiconductor optical amplifier 120 is arranged such that a laser beam having passed through the first beam splitter 116 enters the first semiconductor optical amplifier 120. The first semiconductor optical amplifier 120 pulse-amplifies the laser beam output from the first semiconductor laser 111.

The dichroic mirror 130 is coated with a film that highly transmits the beam having the wavelength of about 1554 nm output from the first semiconductor optical amplifier 120 and highly reflects light having a wavelength of excitation light output from the first pulse excitation light source 132. The dichroic mirror 130 is arranged in an optical path between the first semiconductor optical amplifier 120 and the first fiber amplifier 140. The dichroic mirror 130 is arranged such that the pulse laser beam output from the first semiconductor optical amplifier 120 and the excitation light output from the first pulse excitation light source 132 enter the first fiber amplifier 140.

The first fiber amplifier 140 may be an erbium (Er) fiber amplifier that uses an optical fiber doped with Er. The pulse laser beam amplified by the first fiber amplifier 140 enters the wavelength conversion system 300 via the beam splitter 164.

The beam splitter 164 is arranged in an optical path of the pulse laser beam output from the first fiber amplifier 140. The beam splitter 164 is arranged to reflect part of the pulse laser beam amplified by the first fiber amplifier 140 and cause the reflected light to enter the pulse energy monitor 166. The pulse energy monitor 166 is a detector that detects pulse energy of the incident laser beam, and is, for example, a pulse energy sensor including a photodiode or a pyroelectric element.

The first energy control unit 168 is connected to the pulse energy monitor 166, the first pulse excitation light source 132, and the solid-state laser system control unit 350.

The second solid-state laser device 200 includes a second semiconductor laser system 210, a dichroic mirror 230, a second pulse excitation light source 232, a second fiber amplifier 240, a dichroic mirror 242, a third pulse excitation light source 244, and a solid-state amplifier 250. The second solid-state laser device 200 includes an LBO crystal 260 and a CLBO crystal 262 that are nonlinear crystals, a beam splitter 264, a pulse energy monitor 266, and a second energy control unit 268. "LBO" is represented by a chemical formula $LiB_3O_5$. "CLBO" is represented by a chemical formula $CsLiB_6O_{10}$.

The second semiconductor laser system 210 includes a second semiconductor laser 211, a second spectrum monitor 212, a second semiconductor laser control unit 214, a beam splitter 216, and a second semiconductor optical amplifier 220.

The second semiconductor laser 211 is a light source that outputs a single longitudinal mode laser beam, and can change an oscillation wavelength near a wavelength of about 1030 nm. The second semiconductor laser 211 may be, for example, a DFB laser.

The beam splitter 216 is arranged to reflect part of the laser beam output from the second semiconductor laser 211 and cause the laser beam to enter the second spectrum monitor 212. The second spectrum monitor 212 monitors a spectrum of the incident laser beam and detects the oscillation wavelength of the second semiconductor laser 211. The second semiconductor laser control unit 214 is connected to the second spectrum monitor 212 and the solid-state laser system control unit 350, and controls operation of the second semiconductor laser 211.

The second semiconductor optical amplifier 220 is arranged such that the laser beam having passed through the beam splitter 216 enters the second semiconductor optical amplifier 220. The second semiconductor optical amplifier 220 pulse-amplifies the laser beam output from the second semiconductor laser system 210.

The dichroic mirror 230 is coated with a film that highly transmits the beam having the wavelength of about 1030 nm output from the second semiconductor optical amplifier 220 and highly reflects light having a wavelength of excitation light output from the second pulse excitation light source 232. The dichroic mirror 230 is arranged in an optical path between the second semiconductor optical amplifier 220 and the second fiber amplifier 240 such that the pulse laser beam output from the second semiconductor optical amplifier 220 and the excitation light output from the second pulse excitation light source 232 enter the second fiber amplifier 240.

The second fiber amplifier 240 may be an ytterbium (Yb) fiber amplifier that uses an optical fiber doped with Yb.

The dichroic mirror 242 is coated with a film that highly transmits the beam having the wavelength of about 1030 nm output from the second fiber amplifier 240 and highly reflects light having a wavelength of excitation light output from the third pulse excitation light source 244. The dichroic mirror 242 is arranged in an optical path between the second fiber amplifier 240 and the solid-state amplifier 250. The dichroic mirror 242 is arranged such that the pulse laser beam output from the second fiber amplifier 240 and the excitation light output from the third pulse excitation light source 244 enter the solid-state amplifier 250.

The solid-state amplifier 250 may be, for example, an Yttrium aluminum garnet (YAG) crystal doped with Yb.

The LBO crystal 260 and the CLBO crystal 262 are arranged to generate a second pulse laser beam LP2 having a wavelength of about 257.5 nm that is fourth harmonic light having a wavelength of about 1030 nm.

The beam splitter 264 is arranged in an optical path of the second pulse laser beam LP2 output from the CLBO crystal 262. The beam splitter 264 is arranged to reflect part of the second pulse laser beam LP2 output from the CLBO crystal 262 and cause the reflected light to enter the pulse energy monitor 266.

The second energy control unit 268 is connected to the pulse energy monitor 266, the second pulse excitation light source 232, the third pulse excitation light source 244, and the solid-state laser system control unit 350.

The wavelength conversion system 300 includes a highly reflective mirror 324, a dichroic mirror 314, a first CLBO crystal 316, a dichroic mirror 318, a second CLBO crystal 320, a dichroic mirror 322, a highly reflective mirror 326, and a beam splitter 328. The wavelength conversion system 300 generates a third pulse laser beam LP3 from the first pulse laser beam LP1 and the second pulse laser beam LP2 by wavelength conversion.

The highly reflective mirror 324 is arranged to highly reflect the first pulse laser beam LP1 output from the first solid-state laser device 100 and cause the first pulse laser beam LP1 to enter the dichroic mirror 314.

The dichroic mirror 314 is coated with a film that highly reflects the first pulse laser beam LP1 and highly transmits the second pulse laser beam LP2 output from the second solid-state laser device 200. The dichroic mirror 314 is arranged in an optical path of the second pulse laser beam LP2 such that the first pulse laser beam LP1 and the second pulse laser beam LP2 enter the first CLBO crystal 316 with their optical path axes being aligned.

The first CLBO crystal 316, the dichroic mirror 318, the second CLBO crystal 320, and the dichroic mirror 322 are arranged in this order in the optical path of the pulse laser beam.

The first CLBO crystal 316 generates a fourth pulse laser beam LP4 (wavelength of about 220.9 nm) that is a sum frequency wave of the first pulse laser beam LP1 (wavelength of about 1554 nm) and the second pulse laser beam LP2 (wavelength of about 257.5 nm). The dichroic mirror 318 is coated with a film that highly reflects the second pulse laser beam LP2 (wavelength of about 257.5 nm) having passed through the first CLBO crystal 316 and highly transmits the first pulse laser beam LP1 (wavelength of about 1554 nm) and the fourth pulse laser beam LP4 (wavelength of about 220.9 nm).

The second CLBO crystal 320 generates a pulse laser beam (wavelength of about 193.4 nm) that is a sum frequency wave of the first pulse laser beam LP1 and the fourth pulse laser beam LP4. The pulse laser beam having the wavelength of about 193.4 nm output from the second CLBO crystal 320 is the third pulse laser beam LP3.

The dichroic mirror 322 is coated with a film that highly transmits the first pulse laser beam LP1 (wavelength of about 1554 nm) and the fourth pulse laser beam LP4 (wavelength of about 220.9 nm) having passed through the second CLBO crystal 320 and highly reflects the third pulse laser beam LP3 having the wavelength of about 193.4 nm.

The highly reflective mirror 326 is arranged such that the third pulse laser beam LP3 having the wavelength of about 193.4 nm is output from the wavelength conversion system 300.

The beam splitter 328 is arranged in an optical path between the highly reflective mirror 326 and the first highly reflective mirror 11 such that part of the laser beam reflected by the highly reflective mirror 326 enters the pulse energy monitor 330.

The pulse energy monitor 330 is a detector that detects pulse energy of ultraviolet light, and is, for example, a pulse energy sensor including a photodiode or a pyroelectric element. The pulse energy monitor 330 is connected to the solid-state laser system control unit 350.

The solid-state laser system control unit 350 is connected to the first semiconductor laser control unit 114, the first energy control unit 168, the second semiconductor laser control unit 214, the second energy control unit 268, and the synchronization circuit unit 340. The solid-state laser system control unit 350 is connected to the synchronization control unit 17 and the laser control unit 18. The solid-state laser system control unit 350 includes an internal trigger generator 351.

The synchronization circuit unit 340 has signal lines to receive delay data and a trigger signal Tr1 from the solid-state laser system control unit 350 and input a trigger signal delayed by a predetermined time to each of the first semiconductor optical amplifier 120, the second semiconductor optical amplifier 220, the first pulse excitation light source 132, the second pulse excitation light source 232, and the third pulse excitation light source 244.

When receiving the trigger signal Tr1 output from the synchronization control unit 17, the synchronization circuit unit 340 outputs a trigger signal to each of the first pulse excitation light source 132, the second pulse excitation light source 232, the third pulse excitation light source 244, the first semiconductor optical amplifier 120, and the second semiconductor optical amplifier 220 with predetermined delay time such that the light sources and the amplifiers synchronously operate.

The first highly reflective mirror 11 and the second highly reflective mirror 12 are arranged such that the third pulse laser beam LP3 having the wavelength of about 193.4 nm output from the solid-state laser system 10 enters the excimer amplifier 14.

The excimer amplifier 14 includes an amplifier control unit 400, a charger 402, a trigger corrector 404, a pulse power module (PPM) 408 including a switch 406, and a chamber 410.

The chamber 410 contains, for example, ArF laser gas containing Ar gas, $F_2$ gas, and Ne gas. A pair of discharge electrodes 412, 413 are arranged in the chamber 410. The discharge electrodes 412, 413 are connected to an output terminal of the PPM 408.

Two windows 415, 416 that transmit a laser beam having a wavelength of around 193.4 nm is arranged in the chamber 410.

The monitor module 16 includes a beam splitter 600 and a pulse energy monitor 602. The beam splitter 600 is arranged in an optical path of the pulse laser beam LP6 output from the excimer amplifier 14 such that the pulse laser beam reflected by the beam splitter 600 enters the pulse energy monitor 602. The excimer laser beam (pulse laser beam LP6) output from the excimer amplifier 14 is herein sometimes referred to as "excimer beam".

The pulse energy monitor 602 is a detector that detects pulse energy of ultraviolet light, and is, for example, a pulse energy sensor including a photodiode or a pyroelectric element. Information detected by the pulse energy monitor 602 is transmitted to the laser control unit 18.

The laser control unit 18 is connected to the solid-state laser system control unit 350, the synchronization control unit 17, the amplifier control unit 400, and the exposure control unit 22 of the exposure apparatus 20. The laser control unit 18 includes an internal trigger generator 19.

The synchronization control unit 17 outputs a first trigger signal Tr1 and a second trigger signal Tr2 at timing with delay time set such that when the pulse laser beam output from the solid-state laser system 10 passes through the excimer amplifier 14, the excimer amplifier 14 synchronously discharges to amplify the pulse laser beam.

In the present disclosure, a control device that functions as the first semiconductor laser control unit 114, the first energy control unit 168, the second semiconductor laser control unit 214, the second energy control unit 268, the solid-state laser system control unit 350, the amplifier control unit 400, the synchronization control unit 17, the laser control unit 18, the exposure control unit 22, the wavelength conversion system control unit 380, and other control units may be realized by a combination of hardware and software of one or more computers. Software is synonymous with program. Programmable controllers are included in the concept of computers. The computer may include a central processing unit (CPU) and a memory. The CPU included in the computer is an example of a processor.

Some or all of processing functions of the control device may be realized using an integrated circuit represented by a field programmable gate array (FPGA) or an application specific integrated circuit (ASIC).

Functions of a plurality of control devices may be realized by one control device. Further, in the present disclosure, the control devices may be connected to each other via a communication network such as a local area network or the Internet. In a distributed computing environment, program units may be stored in both local and remote memory storage devices.

1.2 Operation

The laser control unit 18 of the laser system 1 in FIG. 1 receives a light emission trigger signal Tr and data of target pulse energy Et and a target center wavelength λct from the exposure control unit 22 of the exposure apparatus 20. The laser control unit 18 transmits and receives data to and from the exposure control unit 22 as required, and notifies the exposure control unit 22 of an exposure NG signal or an exposure OK signal.

The light emission trigger signal Tr is input to the synchronization control unit 17 via the laser control unit 18.

The solid-state laser system control unit 350 receives data of the target center wavelength λct from the laser control unit 18. The solid-state laser system control unit 350 calculates a target center wavelength λ1ct of the first semiconductor laser system 110 from the received target center wavelength λct and a target center wavelength λ2ct (=λ2c0=1030 nm) of the second semiconductor laser system 210.

The solid-state laser system control unit 350 transmits data of the target center wavelengths λ1ct and λ2ct to the first semiconductor laser control unit 114 and the second semiconductor laser control unit 214, respectively, and causes continuous wave (CW) oscillation of the first semiconductor laser 111 and the second semiconductor laser 211. The term "CW" refers to continuous wave, and the term "CW oscillation" refers to continuous wave oscillation.

The first semiconductor laser control unit 114 controls a current value A1 and/or a temperature T1 of the first semiconductor laser 111 such that a difference aλ between a center wavelength λ1c measured by the first spectrum monitor 112 and the target center wavelength λ1ct is close to 0.

Similarly, the second semiconductor laser control unit 214 controls a current value A2 and/or a temperature T2 of the second semiconductor laser 211 such that a difference δλ2 between a center wavelength λ2c measured by the second spectrum monitor 212 and the target center wavelength λ2ct is close to 0.

The first semiconductor laser control unit 114 and the second semiconductor laser control unit 214 determine whether or not the differences δλ1, δλ2 from the target center wavelengths are within their allowable ranges. When the differences are within the allowable ranges, the first semiconductor laser control unit 114 and the second semiconductor laser control unit 214 notify the solid-state laser system control unit 350 of spectrum OK signals.

When receiving the spectrum OK signals from both the first semiconductor laser control unit 114 and the second semiconductor laser control unit 214, the solid-state laser system control unit 350 causes the internal trigger generator 351 to generate a first trigger signal Tr1 having a predetermined repetition frequency. The internal trigger generator 351 can generate the first trigger signal Tr1 irrespective of the first trigger signal Tr1 from the synchronization control unit 17. The first trigger signal Tr1 generated by the internal trigger generator 351 among the first trigger signals Tr1 is hereinafter particularly referred to as "internal trigger signal Tr1". The first trigger signal Tr1 is input to the synchronization circuit unit 340.

The synchronization circuit unit 340 outputs, synchronously with the first trigger signal Tr1, a pulse excitation trigger signal to each of the first pulse excitation light source 132, the second pulse excitation light source 232, and the third pulse excitation light source 244 with predetermined delay time. Then, the synchronization circuit unit 340 outputs a signal indicating amplification timing with predetermined delay time to each of the first semiconductor optical amplifier 120 and the second semiconductor optical amplifier 220.

A trigger signal instructing light emission timing of the first pulse excitation light source 132 is output at timing when the pulse laser beam pulse-amplified by the first semiconductor optical amplifier 120 can be further sufficiently amplified by the first fiber amplifier.

Also, trigger signals instructing light emission timings of the second pulse excitation light source 232 and the third pulse excitation light source 244 are output at timings when the pulse laser beam pulse-amplified by the second semiconductor optical amplifier 220 can be sufficiently amplified by the second fiber amplifier 240 and the solid-state amplifier 250, respectively.

Trigger timing of each of the first semiconductor optical amplifier 120 and the second semiconductor optical amplifier 220 is set such that the first pulse laser beam LP1 output from the first solid-state laser device 100 and the second pulse laser beam LP2 output from the second solid-state laser device 200 enter the first CLBO crystal 316 at the same timing.

Here, a specific example will be described in which the target center wavelength λct of the laser system 1 is 193.4 nm, the target center wavelength λ1ct of the first semiconductor laser system 110 is 1554 nm, and the target center wavelength λ2ct of the second semiconductor laser system 210 is 1030 nm.

The first semiconductor laser 111 in the first solid-state laser device 100 outputs a CW oscillation laser beam (hereinafter referred to as "first CW laser beam") having a center wavelength of 1554 nm. The first semiconductor optical amplifier 120 pulse-amplifies the first CW laser beam and outputs a pulse laser beam. The pulse laser beam output from the first semiconductor optical amplifier 120 is amplified by the first fiber amplifier 140. The first pulse laser beam LP1 amplified by the first fiber amplifier 140 enters the highly reflective mirror 324 of the wavelength conversion system 300 via the beam splitter 164.

In the second solid-state laser device 200, the second semiconductor laser outputs a CW oscillation laser beam (hereinafter referred to as "second CW laser beam") having a center wavelength of 1030 nm.

The second semiconductor optical amplifier 220 pulse-amplifies the second CW laser beam and outputs a pulse laser beam. The pulse laser beam output from the second semiconductor optical amplifier 220 is amplified by the second fiber amplifier 240 and the solid-state amplifier 250. The pulse laser beam amplified by the second fiber amplifier 240 and the solid-state amplifier 250 enters the LBO crystal 260, and is converted into the second pulse laser beam LP2 (wavelength of 257.5 nm) that is fourth harmonic light having the wavelength of 1030 nm by the LBO crystal 260 and the CLBO crystal 262.

The second pulse laser beam LP2 enters the dichroic mirror 314 of the wavelength conversion system 300.

The first pulse laser beam LP1 is reflected by the highly reflective mirror 324 and enters the dichroic mirror 314.

With the dichroic mirror 314, the first pulse laser beam LP1 and the second pulse laser beam LP2 substantially simultaneously enter the first CLBO crystal 316, and overlap each other on the first CLBO crystal 316. As a result, the first CLBO crystal 316 generates a fourth pulse laser beam LP4 having a center wavelength of 220.9 nm, which is a sum frequency wave of the first pulse laser beam LP1 having a center wavelength of 1554 nm and the second pulse laser beam LP2 having a center wavelength of 257.5 nm.

The dichroic mirror 318 highly reflects the second pulse laser beam LP2 having the center wavelength of 257.5 nm, and highly transmits the first pulse laser beam LP1 having the center wavelength of 1554 nm and the fourth pulse laser beam LP4 having the center wavelength of 220.9 nm.

The first pulse laser beam LP1 and the fourth pulse laser beam LP4 having passed through the dichroic mirror 318 enter the second CLBO crystal 320. The second CLBO crystal 320 generates a third pulse laser beam LP3 having a center wavelength of 193.4 nm, which is a sum frequency wave of the first pulse laser beam LP1 (wavelength of 1554 nm) and the fourth pulse laser beam LP4 (wavelength of 220.9 nm).

The dichroic mirror 322 highly transmits the first pulse laser beam LP1 and the fourth pulse laser beam LP4 output from the second CLBO crystal 320. The dichroic mirror 322 highly reflects the third pulse laser beam LP3 (wavelength of 193.4 nm) output from the second CLBO crystal 320, and the third pulse laser beam LP3 is output from the wavelength conversion system 300 via the highly reflective mirror 326 and the beam splitter 328.

The pulse laser beam reflected by the beam splitter 328 enters the pulse energy monitor 330. The pulse energy monitor 330 measures pulse energy Es of the pulse laser beam reflected by the beam splitter 328. Information obtained by the pulse energy monitor 330 is transmitted to the solid-state laser system control unit 350.

The solid-state laser system control unit 350 calculates a difference ΔEs between pulse energy Es after wavelength conversion by the wavelength conversion system 300 and target pulse energy Est.

The solid-state laser system control unit 350 controls output of the first pulse excitation light source 132, the second pulse excitation light source 232, and the third pulse excitation light source 244 such that ΔEs is close to 0.

The solid-state laser system control unit 350 determines whether ΔEs is within an allowable range. When ΔEs is within the allowable range, the solid-state laser system control unit 350 stops output of an internal trigger signal Tr1 and notifies the laser control unit 18 of a solid-state laser system control OK signal.

Then, the laser control unit 18 generates an internal trigger signal Tr having a predetermined repetition frequency. As a result, the third pulse laser beam LP3 having the center wavelength of 193.4 nm output from the solid-state laser system 10 enters the excimer amplifier 14 via the first highly reflective mirror 11 and the second highly reflective mirror 12.

The excimer amplifier 14 forms inverted distribution by discharge synchronously with entering of the third pulse laser beam LP3 having the wavelength of 193.4 nm. The trigger corrector 404 adjusts timing of the switch 406 of the PPM 408 such that the third pulse laser beam LP3 is efficiently amplified by the excimer amplifier 14. Thus, the excimer amplifier 14 outputs an amplified pulse laser beam LP6.

The pulse laser beam LP6 amplified by the excimer amplifier 14 enters the monitor module 16. The beam splitter 600 causes part of the pulse laser beam LP6 to enter the pulse energy monitor 602, which measures pulse energy E of the pulse laser beam LP6.

The laser control unit 18 obtains information on the pulse energy E from the pulse energy monitor 602. The laser control unit 18 calculates a difference ΔE between the pulse energy E measured by the pulse energy monitor 602 and target pulse energy Et.

The laser control unit 18 controls charging voltage Vhv of the charger 402 via the amplifier control unit 400 such that ΔE is close to 0.

The laser control unit 18 determines whether ΔE is within an allowable range. When ΔE is within the allowable range, the laser control unit 18 stops output of an internal trigger signal Tr and notifies the exposure control unit 22 of a laser system OK signal (exposure OK signal). When receiving the laser system OK signal, the exposure control unit 22 transmits a light emission trigger signal Tr to the laser control unit 18.

As a result, the laser system 1 outputs a pulse laser beam within the allowable ranges of the target center wavelength λct and the target pulse energy Et. The pulse laser beam (excimer laser beam) output from the laser system 1 enters the exposure apparatus 20, which performs an exposure process.

When receiving data of a new target center wavelength λct from the exposure control unit 22, the laser control unit 18 transmits the data to the solid-state laser system control unit 350.

The solid-state laser system control unit 350 controls the first semiconductor laser system 110 and the second semiconductor laser system 210 such that the internal trigger generator 351 generates an internal trigger signal Tr1 and the new target center wavelength λct is reached even if the solid-state laser system control unit 350 does not receive a trigger signal Tr1 from the synchronization control unit 17.

1.3 Example of Processing of Laser Control Unit

Figure 2:
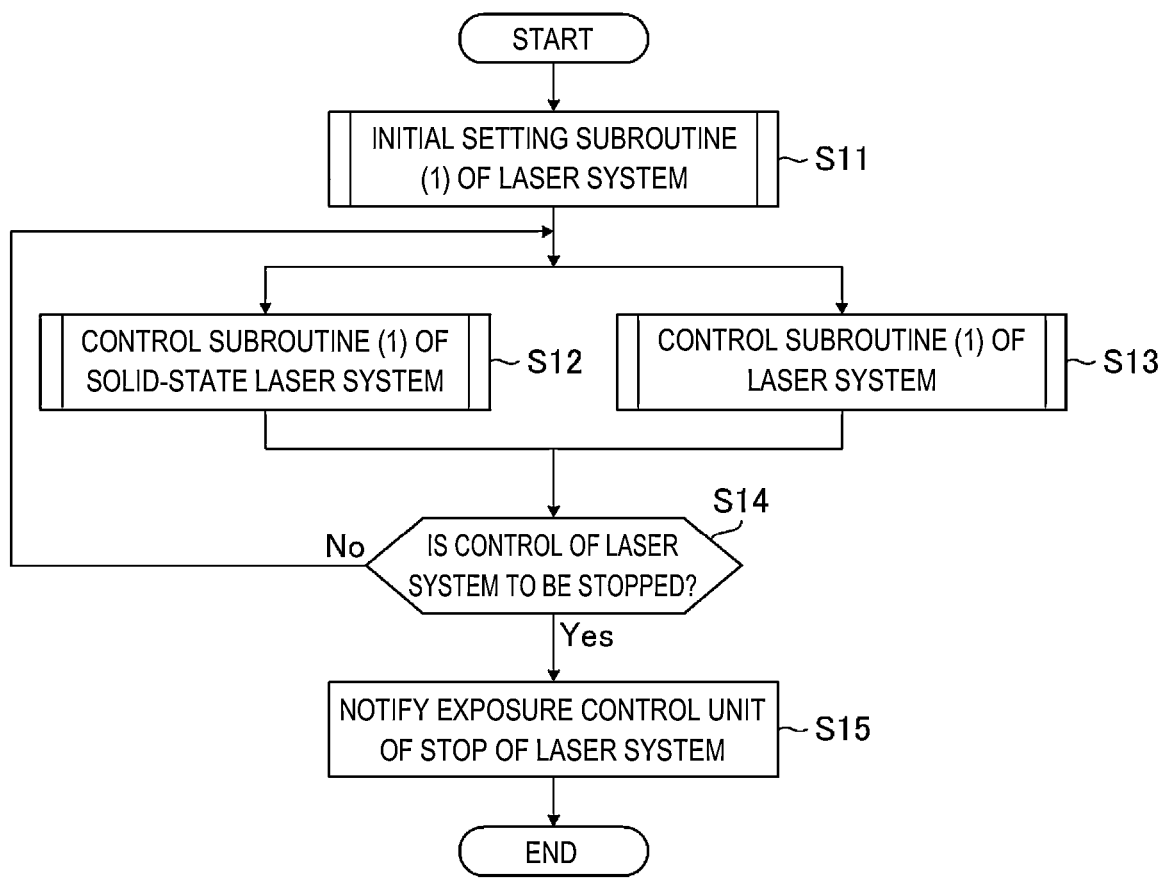
FIG. 2 is a flowchart of an example of processing of a laser control unit.

FIG. 2 is a flowchart of an example of processing of the laser control unit 18. The processing and the operation in the flowchart in FIG. 2 are realized by, for example, a processor that functions as the laser control unit 18 executing a program.

In step S11, the laser control unit 18 performs an initial setting subroutine (1) of the laser system 1. After step S11, the laser control unit 18 performs a control subroutine (1) of the solid-state laser system 10 (step S12) and a control subroutine (1) of the laser system 1 (step S13). The processes in steps S12 and S13 may be performed in parallel.

The control of the solid-state laser system 10 in step S12 is constantly performed. In particular, wavelength control of the first semiconductor laser system 110 and the second semiconductor laser system 210 is performed irrespective of whether or not the trigger signal Tr1 is input. The control of the laser system 1 in step S13 is mainly feedback control of pulse energy of an excimer laser beam amplified by the excimer amplifier 14.

In step S14, the laser control unit 18 determines whether or not to stop control of the laser system 1. When the determination result in step S14 is No, the laser control unit 18 returns to steps S12 and S13. When the determination result in step S14 is Yes, the laser control unit 18 goes to step S15.

In step S15, the laser control unit 18 notifies the exposure control unit 22 of stop of the laser system 1, and finishes the flowchart in FIG. 2.

Figure 3:
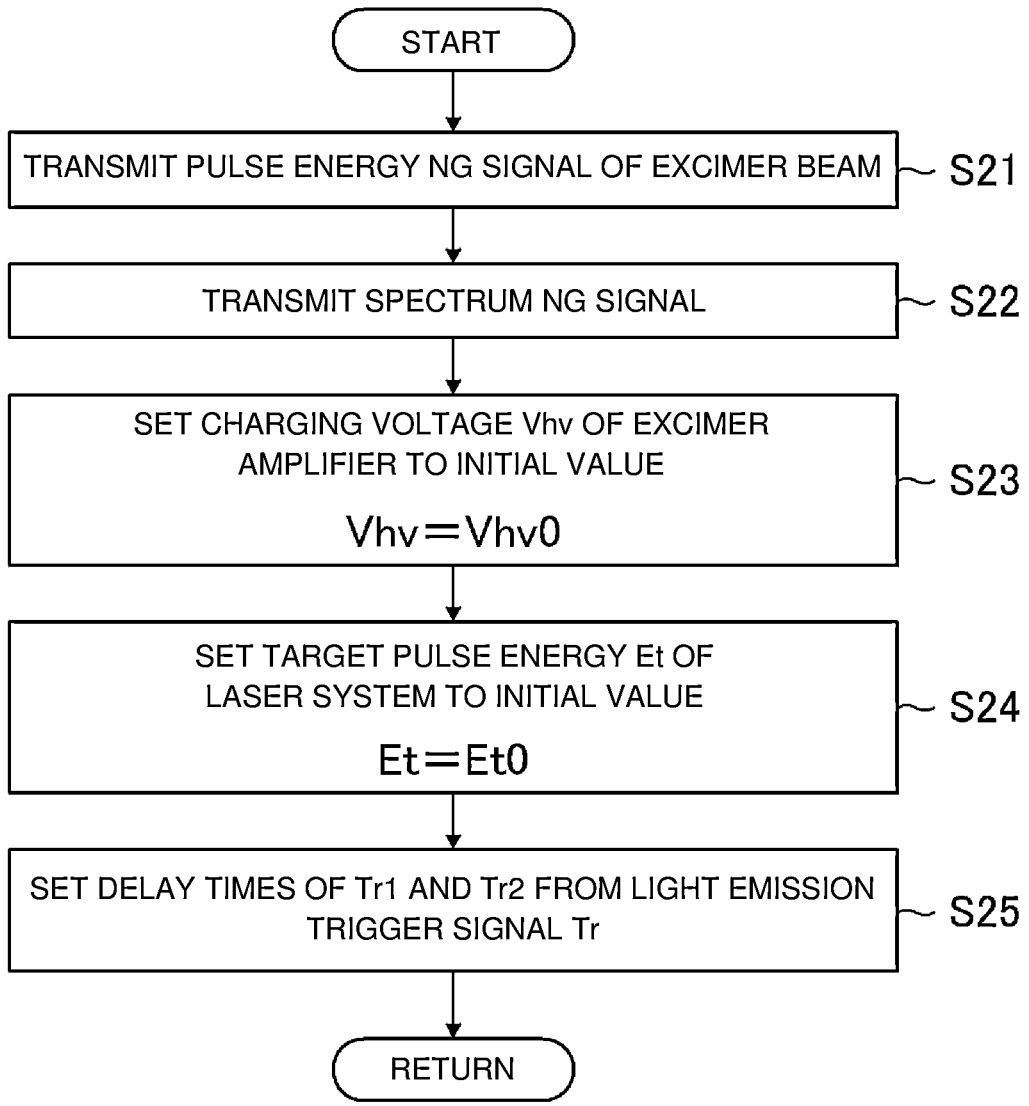
FIG. 3 is a flowchart of an example of an initial setting subroutine (1) of the laser system.

FIG. 3 is a flowchart of an example of the initial setting subroutine (1) of the laser system 1. The flowchart in FIG. 3 is applied to step S11 in FIG. 2.

In step S21 in FIG. 3, the laser control unit 18 transmits a pulse energy NG signal of an excimer beam to the exposure control unit 22. Pulse energy of the excimer beam is previously set to NG in initial setting, and in the process in step S21, the laser control unit 18 transmits the pulse energy NG signal to the exposure control unit 22 according to the initial setting.

In step S22, the laser control unit 18 transmits a spectrum NG signal to the exposure control unit 22. A center wavelength of the excimer beam is previously set to NG in initial setting, and in the process in step S22, the laser control unit 18 transmits the spectrum NG signal to the exposure control unit 22 according to the initial setting.

In step S23, the laser control unit 18 sets charging voltage Vhv of the excimer amplifier 14 to an initial value Vhv0.

In step S24, the laser control unit 18 sets target pulse energy Et of the laser system 1 to an initial value Et0. The laser control unit 18 sets a predetermined standard initial value Et0 before receiving data of the target pulse energy Et from the exposure apparatus 20.

In step S25, the laser control unit 18 sets delay times of the first trigger signal Tr1 and the second trigger signal Tr2 from the light emission trigger signal Tr. The laser control unit 18 sets the delay times such that discharge occurs at timing when the pulse laser beam output from the solid-state laser system 10 enters the excimer amplifier 14. The delay times may be fixed values. The laser control unit 18 transmits data of the delay times to the synchronization control unit 17.

Figure 4:
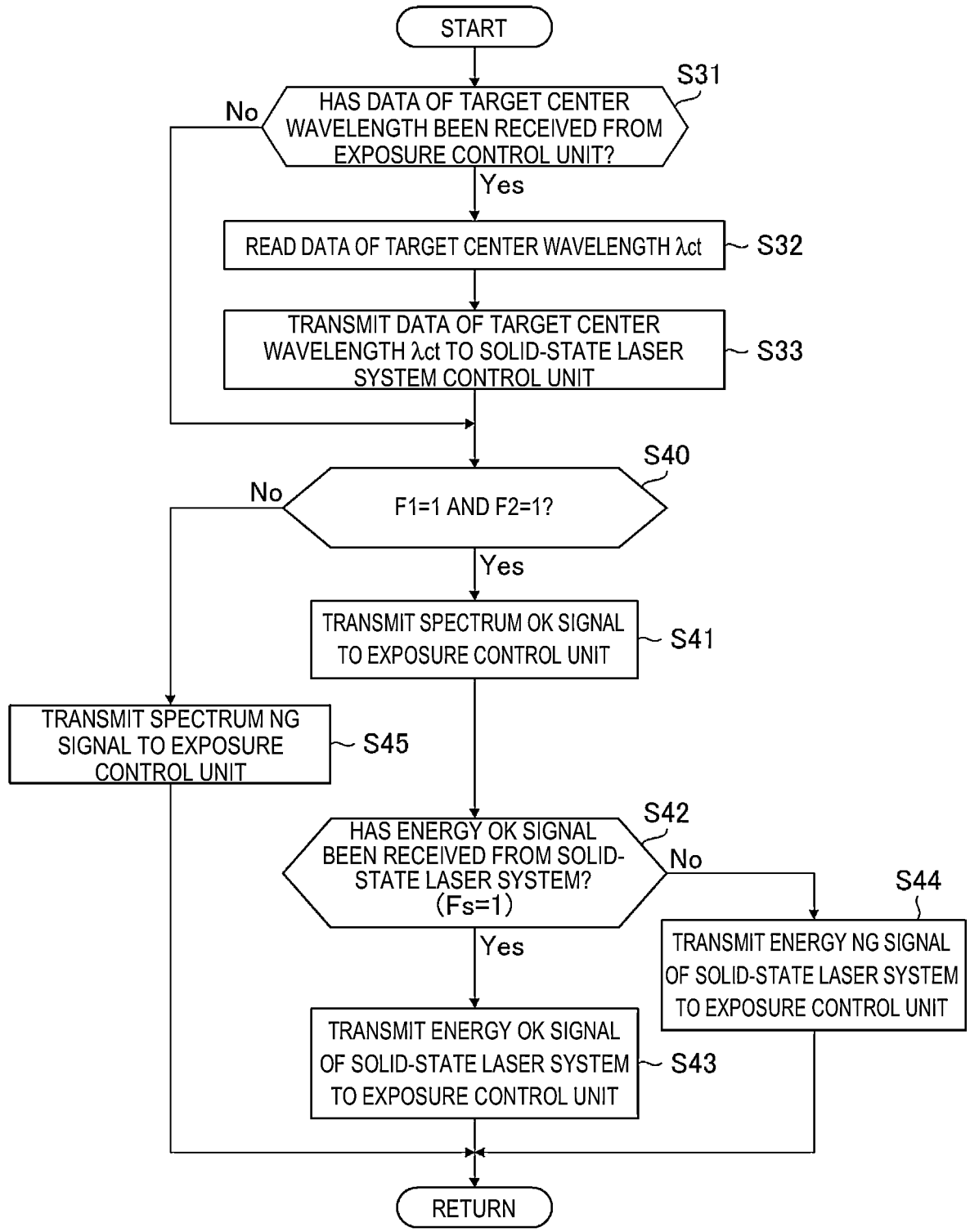
FIG. 4 is a flowchart of an example of a control subroutine (1) of a solid-state laser system.

FIG. 4 is a flowchart of an example of the control subroutine (1) of the solid-state laser system 10. The flowchart in FIG. 4 is applied to step S12 in FIG. 2.

In step S31 in FIG. 4, the laser control unit 18 determines whether or not data of a new target center wavelength has been received from the exposure control unit 22. When the determination result in step S31 is Yes, the laser control unit 18 goes to step S32.

In step S32, the laser control unit 18 reads the data of the target center wavelength λct. Then, in step S33, the laser control unit 18 transmits the data of the target center wavelength λct to the solid-state laser system control unit 350.

After step S33, the laser control unit 18 goes to step S40. When the determination result in step S31 is No, the laser control unit 18 skips steps S32 and S33 and goes to step S40.

In step S40, the laser control unit 18 checks values of a flag F1 and a flag F2, and determines whether or not the flag F1 being 1 and the flag F2 being 1 is satisfied. The flag F1 indicates whether the first semiconductor laser system 110 is in an OK state or an NG state. The flag F2 indicates whether the second semiconductor laser system 210 is in an OK state or an NG state. The value "1" of the flags indicates OK and the value "0" indicates NG. In other words, the laser control unit 18 determines whether or not both the first semiconductor laser system 110 and the second semiconductor laser system 210 are in the OK state.

When the determination result in step S40 is Yes, the laser control unit 18 goes to step S41. In step S41, the laser control unit 18 transmits a spectrum OK signal to the exposure control unit 22.

In step S42, the laser control unit 18 determines whether or not an energy OK signal has been received from the solid-state laser system 10. For example, the laser control unit 18 checks a value of a flag Fs, and determines whether or not the flag Fs is 1. The flag Fs indicates whether the pulse energy output from the solid-state laser system 10 is in an OK state or an NG state. The value "1" of the flag Fs indicates OK and the value "0" indicates NG. The laser control unit 18 determines whether or not the pulse energy from the solid-state laser system 10 is in the OK state in accordance with the value of the flag Fs. When the determination result in step S42 is Yes, the laser control unit 18 goes to step S43.

In step S43, the laser control unit 18 transmits an energy OK signal of the solid-state laser system 10 to the exposure control unit 22. When the determination result in step S42 is No, the laser control unit 18 goes to step S44.

In step S44, the laser control unit 18 transmits an energy NG signal of the solid-state laser system 10 to the exposure control unit 22.

When the determination result in step S40 is No, the laser control unit 18 goes to step S45 and transmits a spectrum NG signal to the exposure control unit 22.

After step S43, step S44, or step S45, the laser control unit 18 finishes the flowchart in FIG. 4 and returns to the flowchart in FIG. 2.

Figure 5:
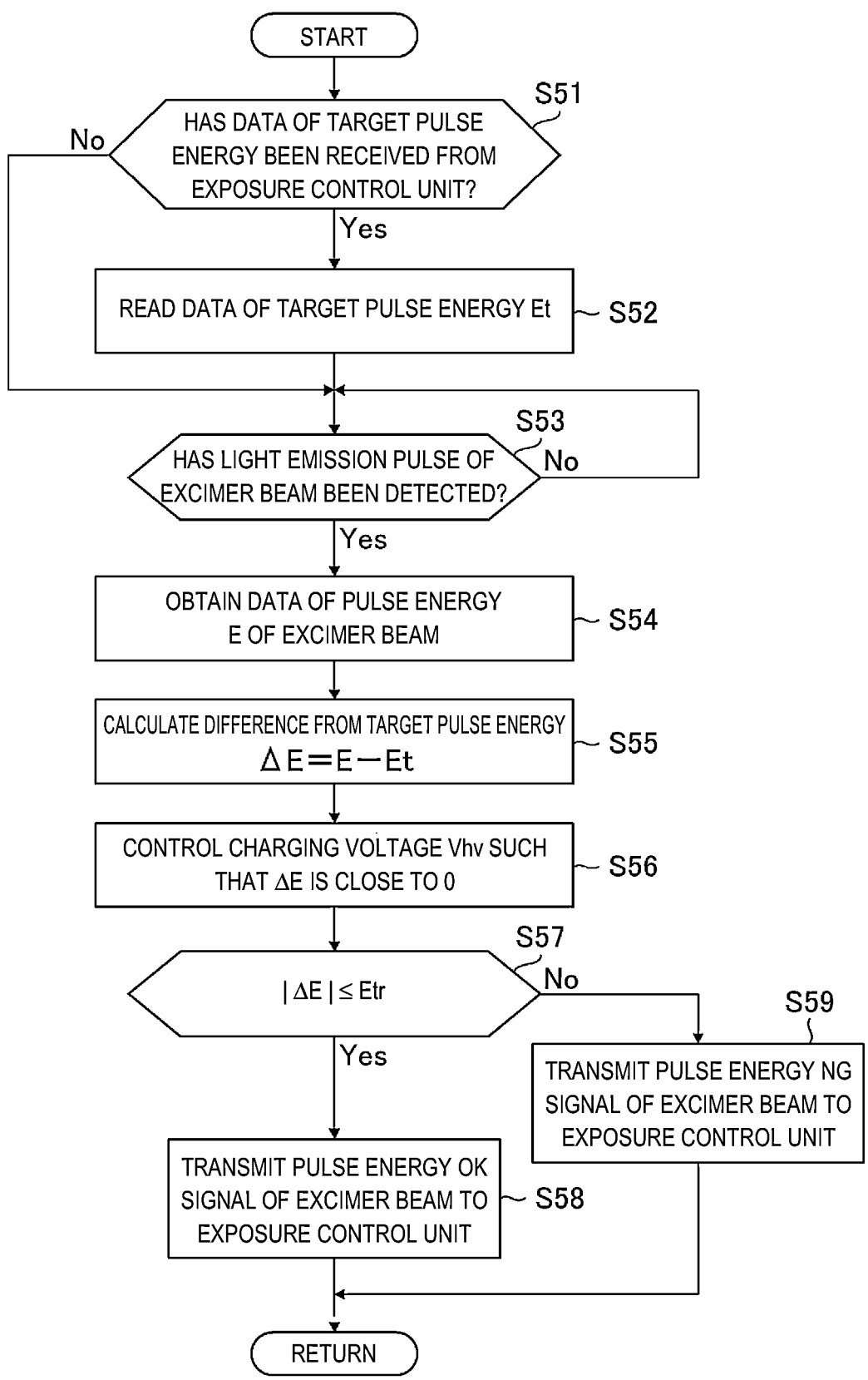
FIG. 5 is a flowchart of an example of a control subroutine (1) of the laser system.

FIG. 5 is a flowchart of an example of the control subroutine (1) of the laser system 1. The flowchart in FIG. 5 is applied to step S13 in FIG. 2.

In step S51 in FIG. 5, the laser control unit 18 determines whether or not data of new target pulse energy has been received from the exposure control unit 22. When the determination result in step S51 is Yes, the laser control unit 18 goes to step S52.

In step S52, the laser control unit 18 reads the data of the target pulse energy Et. After step S52, the laser control unit 18 goes to step S53. When the determination result in step S51 is No, the laser control unit 18 skips step S52 and goes to step S53.

In step S53, the laser control unit 18 determines whether or not a light emission pulse of an excimer beam has been detected. The laser control unit 18 determines whether or not pulse energy of the pulse laser beam (excimer beam) output to the exposure apparatus 20 has been detected in accordance with a signal obtained from the monitor module 16. When the determination result in step S53 is No, the laser control unit 18 repeats step S53. When the determination result in step S53 is Yes, the laser control unit 18 goes to step S54.

In step S54, the laser control unit 18 obtains data of the pulse energy E of the excimer beam detected by the monitor module 16.

In step S55, the laser control unit 18 calculates a difference $\Delta E$ between the pulse energy E and the target pulse energy Et.

In step S56, the laser control unit 18 controls the charging voltage Vhv of the excimer amplifier 14 such that $\Delta E$ is close to 0.

Then, in step S57, the laser control unit 18 determines whether or not an absolute value of $\Delta E$ is equal to or smaller than an allowable upper limit value Etr which indicates an allowable range. When the determination result in step S57 is Yes, the laser control unit 18 goes to step S58, and transmits a pulse energy OK signal of the excimer beam to the exposure control unit 22.

When the determination result in step S57 is No, the laser control unit 18 goes to step S59, and transmits a pulse energy NG signal of the excimer beam to the exposure control unit 22.

After step S58 or S59, the laser control unit 18 finishes the flowchart in FIG. 5 and returns to the flowchart in FIG. 2.

1.4 Example 1 of Processing of Solid-State Laser System Control Unit

Figure 6:
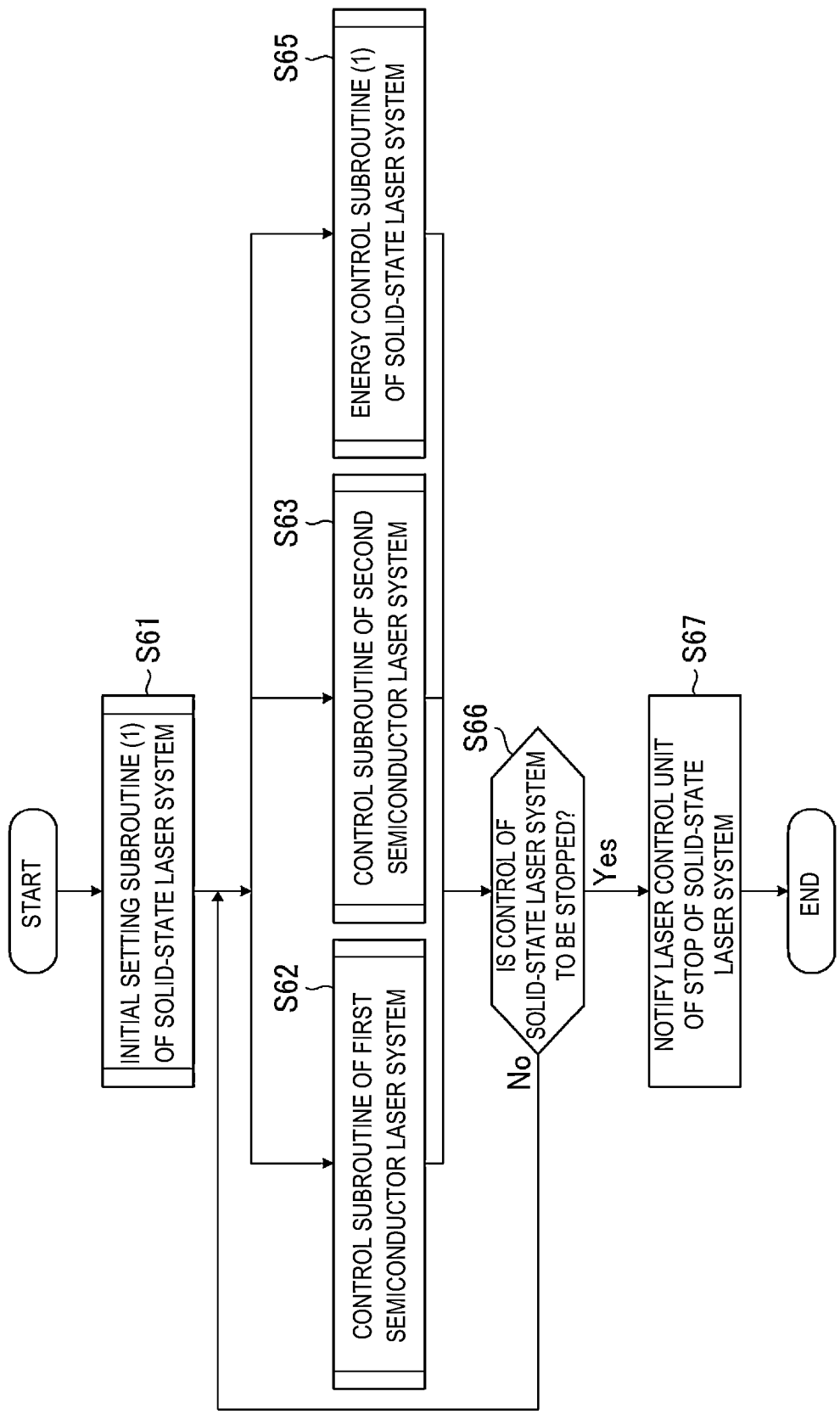
FIG. 6 is a flowchart of an example of processing of a solid-state laser system control unit.

FIG. 6 is a flowchart of an example of processing of the solid-state laser system control unit 350. The processing and the operation in the flowchart in FIG. 6 are realized by, for example, a processor that functions as the solid-state laser system control unit 350 executing a program.

In step S61, the solid-state laser system control unit 350 performs an initial setting subroutine (1) of the solid-state laser system 10.

After step S61, the solid-state laser system control unit 350 performs a control subroutine of the first semiconductor laser system 110 (step S62), a control subroutine of the second semiconductor laser system 210 (step S63), and an energy control subroutine (1) of the solid-state laser system 10 (step S65). The processes of the subroutines in steps S62, S63, and S65 may be performed in parallel.

In step S66, the solid-state laser system control unit 350 determines whether or not to stop control of the solid-state laser system 10.

When the determination result in step S66 is No, the solid-state laser system control unit 350 returns to steps S62, S63, and S65. When the determination result in step S66 is Yes, the solid-state laser system control unit 350 goes to step S67.

In step S67, the solid-state laser system control unit 350 notifies the laser control unit 18 of stop of the solid-state laser system 10, and finishes the flowchart in FIG. 6.

Figure 7:
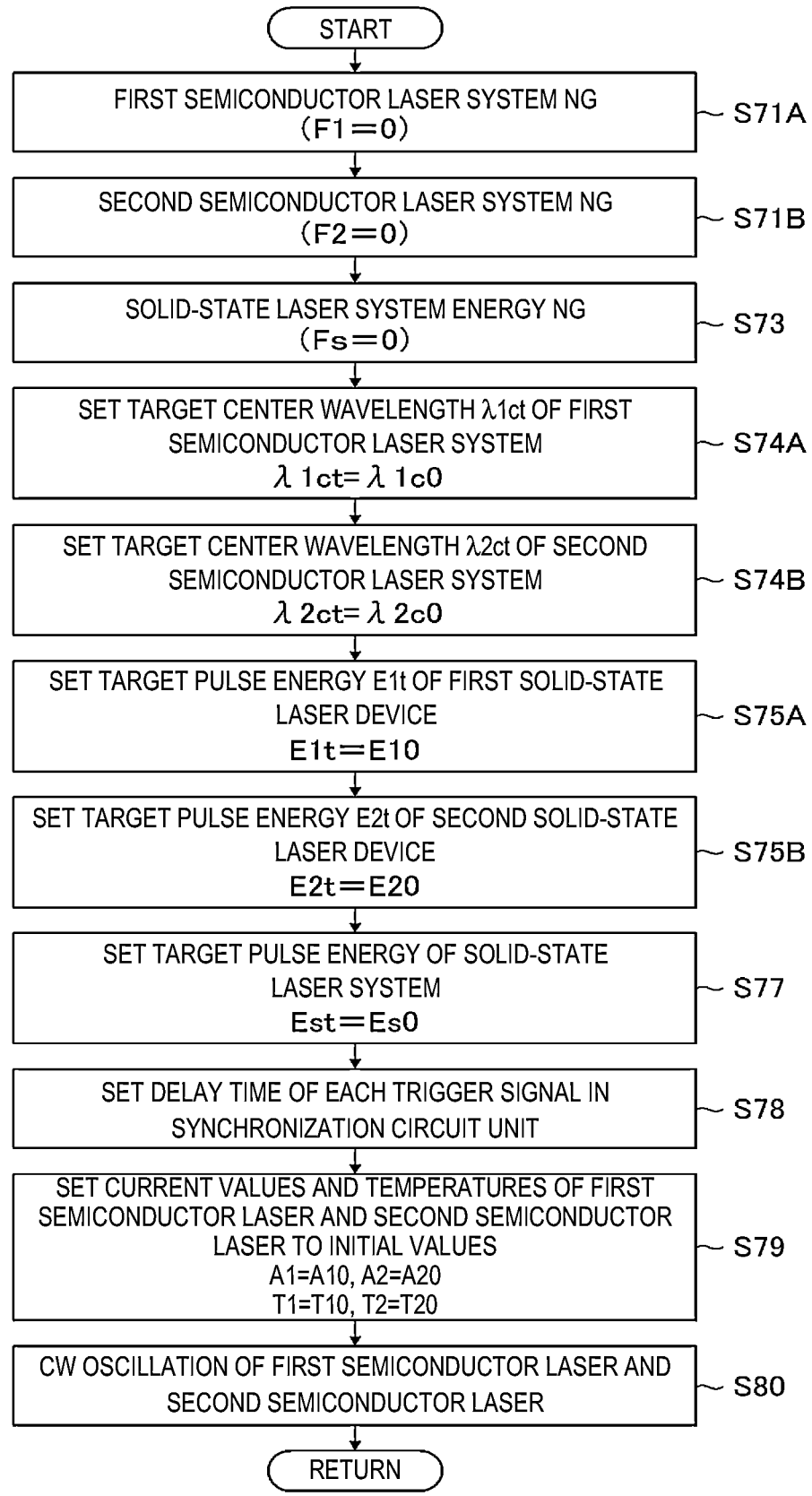
FIG. 7 is a flowchart of an example of an initial setting subroutine (1) of the solid-state laser system.

FIG. 7 is a flowchart of an example of the initial setting subroutine (1) of the solid-state laser system 10. The flowchart in FIG. 7 is applied to step S61 in FIG. 6.

In step S71A in FIG. 7, the solid-state laser system control unit 350 sets the state of the first semiconductor laser system 110 to NG. In other words, the solid-state laser system control unit 350 sets the value of the flag F1 to "0".

In step S71B, the solid-state laser system control unit 350 sets the state of the second semiconductor laser system 210 to NG. In other words, the solid-state laser system control unit 350 sets the value of the flag F2 to "0".

In step S73, the solid-state laser system control unit 350 sets the energy state of the solid-state laser system 10 to NG. In other words, the solid-state laser system control unit 350 sets the value of the flag Fs to "0".

In step S74A, the solid-state laser system control unit 350 sets a target center wavelength $\lambda 1ct$ of the first semiconductor laser system 110 to an initial value $\lambda 1c0$. The initial value $\lambda 1c0$ may be, for example, 1554 nm.

In step S74B, the solid-state laser system control unit 350 sets a target center wavelength $\lambda 2ct$ of the second semiconductor laser system 210 to an initial value $\lambda 2c0$. The initial value $\lambda 2c0$ may be, for example, 1030 nm.

In step S75A, the solid-state laser system control unit 350 sets target pulse energy E1t of the first solid-state laser device 100 to an initial value E10.

In step S75B, the solid-state laser system control unit 350 sets target pulse energy E2t of the second solid-state laser device 200 to an initial value E20. In steps S75A and S75B, initial setting of the target pulse energy of each of the first solid-state laser device 100 and the second solid-state laser device 200 is performed such that the laser beam wavelength-converted by the wavelength conversion system 300 has target pulse energy Es0 of initial setting.

In step S77, the solid-state laser system control unit 350 sets target pulse energy Est of the solid-state laser system 10 to an initial value Es0. The initial value Es0 is a predetermined fixed value at which amplified spontaneous emission (ASE) can be suppressed in the excimer amplifier 14.

In step S78, the solid-state laser system control unit 350 sets delay time of each trigger signal in the synchronization circuit unit 340. The delay time of the first trigger signal Tr1 is set in the synchronization circuit unit 340 as described below.

Pulse excitation timing of each of the first pulse excitation light source 132, the second pulse excitation light source 232, and the third pulse excitation light source 244 is set such that pulse seed light passing therethrough can be sufficiently amplified. Trigger timing of each of the first semiconductor optical amplifier 120 and the second semiconductor optical amplifier 220 is set such that the first pulse laser beam LP1 output from the first solid-state laser device 100 and the second pulse laser beam LP2 output from the second solid-state laser device 200 enter the first CLBO crystal 316 at the same timing.

In step S79, the solid-state laser system control unit 350 sets current values and temperatures of the first semiconductor laser 111 and the second semiconductor laser 211 to initial values. The current value and the temperature of the first semiconductor laser 111 at which an oscillation wavelength is close to $\lambda 1c0$ are initial values. Here, an initial value of a current value A1 of the first semiconductor laser 111 is A10, and an initial value of a temperature T1 is T10. The current value and the temperature of the second semiconductor laser 211 at which an oscillation wavelength is close to $\lambda 2c0$ are initial values. Here, an initial value of a current value A2 of the second semiconductor laser 211 is A20, and an initial value of a temperature T2 is T20.

In step S80, the solid-state laser system control unit 350 causes CW oscillation of the first semiconductor laser 111 and the second semiconductor laser 211 under the setting in step S79.

After step S80, the solid-state laser system control unit 350 finishes the flowchart in FIG. 7 and returns to the flowchart in FIG. 6.

Figure 8:
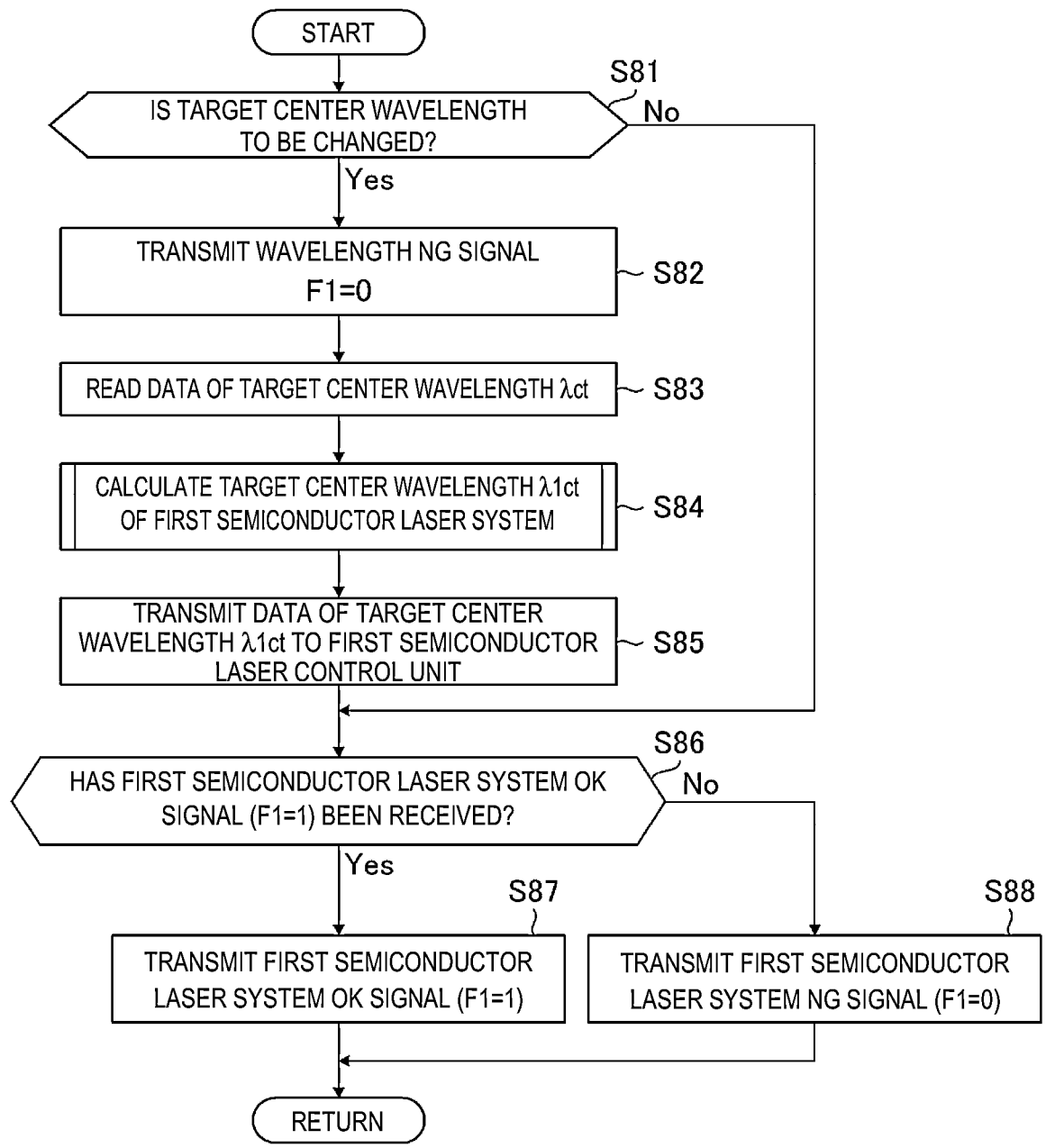
FIG. 8 is a flowchart of an example of a control subroutine of a first semiconductor laser system.

FIG. 8 is a flowchart of an example of the control subroutine of the first semiconductor laser system 110. The flowchart in FIG. 8 is applied to step S62 in FIG. 6.

In step S81 in FIG. 8, the solid-state laser system control unit 350 determines whether or not an instruction to change a target center wavelength has been received from the exposure control unit 22 via the laser control unit 18. When the determination result in step S81 is Yes, the solid-state laser system control unit 350 goes to step S82.

In step S82, the solid-state laser system control unit 350 transmits a wavelength NG signal to the laser control unit 18. When the target center wavelength is changed, a wavelength NG state (F1=0) is reached because the wavelength needs to be adjusted.

In step S83, the solid-state laser system control unit 350 reads data of a new target center wavelength $\lambda ct$.

In step S84, the solid-state laser system control unit 350 calculates a target center wavelength $\lambda 1ct$ of the first semiconductor laser system 110. The processing in step S84 will be described later with reference to FIG. 9. The solid-state laser system control unit 350 calculates the target center wavelength $\lambda 1ct$ according to a wavelength conversion formula described later.

In step S85 in FIG. 8, the solid-state laser system control unit 350 transmits data of the target center wavelength $\lambda 1ct$ to the first semiconductor laser control unit 114. After step S85, the solid-state laser system control unit 350 goes to step S86.

When the determination result in step S81 is No, that is, when the instruction to change the target center wavelength has not been received from the exposure control unit 22, the solid-state laser system control unit 350 skips steps S82 to S85 and goes to step S86.

In step S86, the solid-state laser system control unit 350 determines whether or not an OK signal of the first semiconductor laser system 110 has been received from the first semiconductor laser control unit 114. When the determination result in step S86 is Yes, the solid-state laser system control unit 350 goes to step S87.

In step S87, the solid-state laser system control unit 350 transmits the OK signal of the first semiconductor laser system 110 to the laser control unit 18. Specifically, the solid-state laser system control unit 350 transmits a flag signal of F1 being 1 to the laser control unit 18.

When the determination result in step S86 is No, that is, when the flag F1 is 0, the solid-state laser system control unit 350 goes to step S88.

In step S88, the solid-state laser system control unit 350 transmits an NG signal of the first semiconductor laser system 110 to the laser control unit 18. Specifically, the solid-state laser system control unit 350 transmits a flag signal of F1 being 0 to the laser control unit 18.

After step S87 or S88, the solid-state laser system control unit 350 finishes the flowchart in FIG. 8 and returns to the flowchart in FIG. 6.

Figure 9:
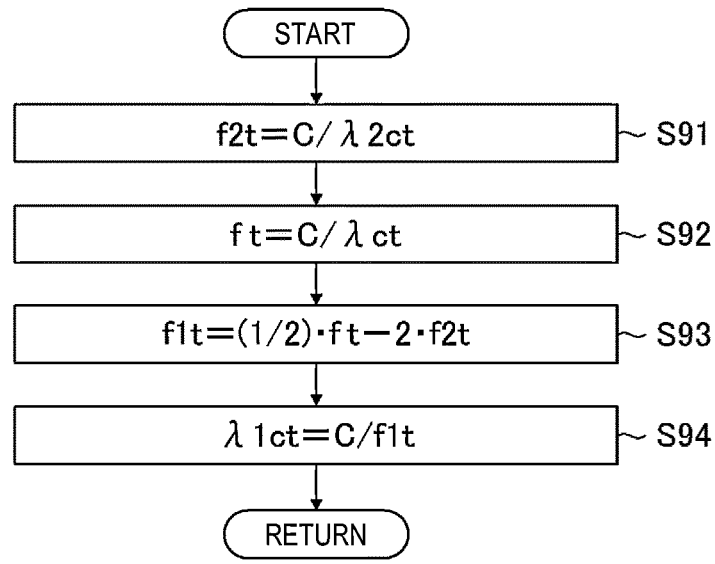
FIG. 9 is a flowchart of an example of a subroutine for calculating a target center wavelength $\lambda 1ct$ of the first semiconductor laser system.

FIG. 9 is a flowchart of an example of a subroutine for calculating the target center wavelength $\lambda 1ct$ of the first semiconductor laser system 110. The flowchart in FIG. 9 is applied to step S84 in FIG. 8.

In step S91 in FIG. 9, the solid-state laser system control unit 350 converts the target center wavelength $\lambda 2ct$ of the second semiconductor laser system 210 into a frequency f2t.

The conversion formula is expressed by $$f2t = C/\lambda 2ct$$

where C is light speed.

In step S92, the solid-state laser system control unit 350 converts the target center wavelength λct after wavelength conversion by the wavelength conversion system 300 into a frequency ft.

The conversion formula is expressed by $$ft = C/\lambda ct.$$

In step S93, the solid-state laser system control unit 350 calculates a target frequency f2t of the second semiconductor laser system 210 from Expression (1) of wavelength conversion mentioned below. The symbol "·" in the expression represents a multiplication operator.

$$f = 4 \cdot f2 + 2 \cdot f1 \qquad (1)$$

f: frequency of laser beam wavelength-converted by sum frequency wave
f1: frequency of laser beam of first solid-state laser device
f2: frequency of laser beam of second solid-state laser device before wavelength conversion into fourth harmonic light In the example in FIG. 1, the frequency f is the frequency of the laser beam having the wavelength of about 193.4 nm. The frequency f1 is the frequency of the laser beam having the wavelength of about 1554 nm. The frequency f2 is the frequency of the laser beam having the wavelength of about 1030 nm. Thus, Expression (1) is modified with f being ft, f1 being f1t, and f2 being f2t to obtain Expression (2) below that is a conversion formula applied to step S93.

$$f1t = (\tfrac{1}{2}) \cdot ft - 2 \cdot f2t \qquad (2)$$

In step S94, the solid-state laser system control unit 350 converts the target frequency f1t into the target center wavelength λ1ct. The conversion formula is expressed by $$\lambda 1ct = C/f1t.$$

The calculation is not limited to the procedure described in steps S91 to S94 in FIG. 9, but may be performed using table data or the like that provides similar conversion results.

After step S94, the solid-state laser system control unit 350 finishes the flowchart in FIG. 9 and returns to the flowchart in FIG. 8.

Figure 10:
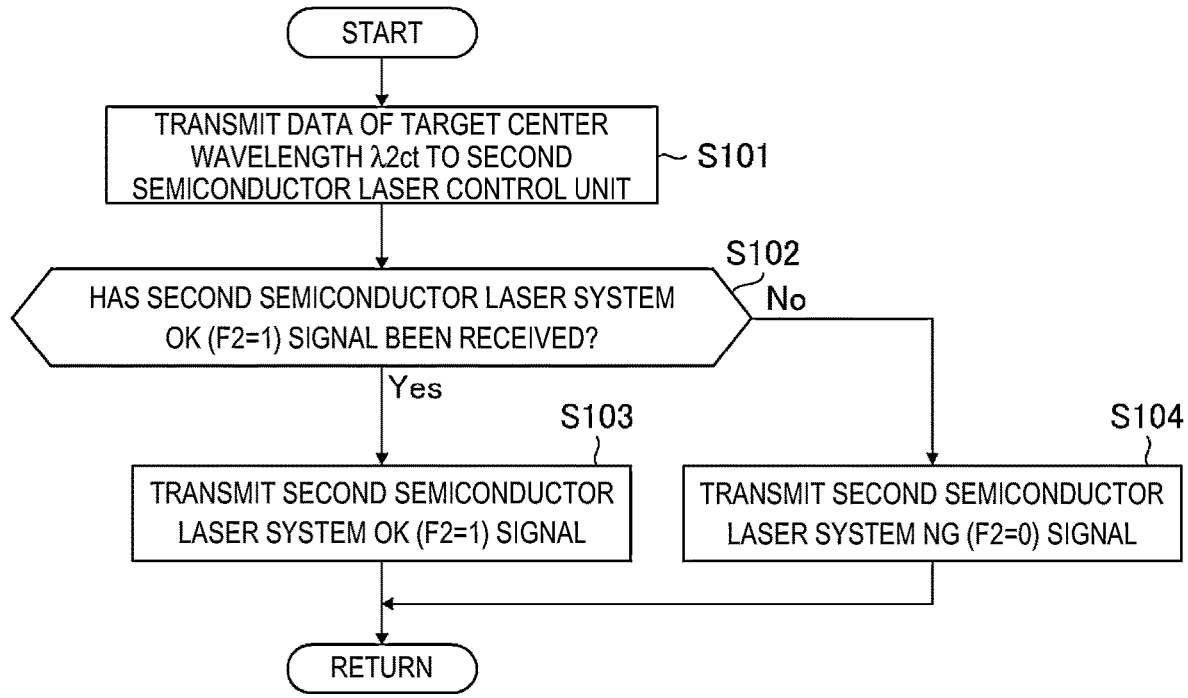
FIG. 10 is a flowchart of an example of a control subroutine of a second semiconductor laser system.

FIG. 10 is a flowchart of an example of the control subroutine of the second semiconductor laser system 210. The flowchart in FIG. 10 is applied to step S63 in FIG. 6.

In step S101 in FIG. 10, the solid-state laser system control unit 350 transmits data of the target center wavelength λ2ct to the second semiconductor laser control unit 214.

In step S102, the solid-state laser system control unit 350 determines whether or not an OK signal of the second semiconductor laser system 210 has been received from the second semiconductor laser control unit 214. When the determination result in step S102 is Yes, that is, when the flag F2 is 1, the solid-state laser system control unit 350 goes to step S103.

In step S103, the solid-state laser system control unit 350 transmits the OK signal of the second semiconductor laser system 210 to the laser control unit 18. Specifically, the solid-state laser system control unit 350 transmits a flag signal of F2 being 1 to the laser control unit 18.

When the determination result in step S102 is No, that is, when the flag F2 is 0, the solid-state laser system control unit 350 goes to step S104.

In step S104, the solid-state laser system control unit 350 transmits an NG signal of the second semiconductor laser system 210 to the laser control unit 18. Specifically, the solid-state laser system control unit 350 transmits a flag signal of F2 being 0 to the laser control unit 18.

After step S103 or S104, the solid-state laser system control unit 350 finishes the flowchart in FIG. 10 and returns to the flowchart in FIG. 6.

Figure 11:
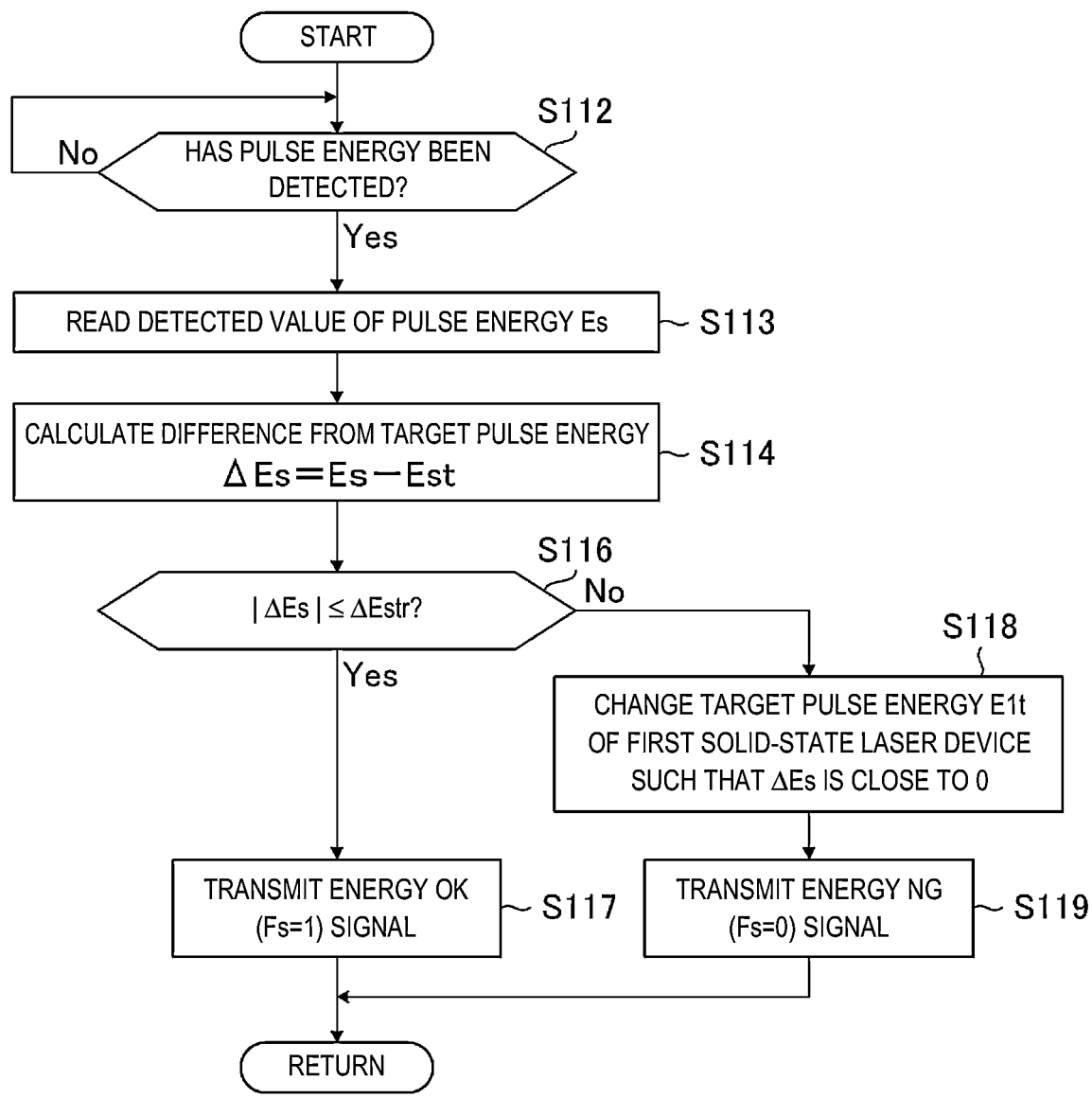
FIG. 11 is a flowchart of an example of an energy control subroutine (1) of the solid-state laser system.

FIG. 11 is a flowchart of an example of the energy control subroutine (1) of the solid-state laser system 10. The flowchart in FIG. 11 is applied to step S65 in FIG. 6.

In step S112 in FIG. 11, the solid-state laser system control unit 350 determines whether or not the pulse energy monitor 330 has detected pulse energy of the pulse laser beam. The solid-state laser system control unit 350 makes a determination in accordance with a signal obtained from the pulse energy monitor 330.

When the determination result in step S112 is No, the solid-state laser system control unit 350 repeats the process in step S112. When the determination result in step S112 is Yes, the solid-state laser system control unit 350 goes to step S113.

In step S113, the solid-state laser system control unit 350 reads a value of the pulse energy Es detected by the pulse energy monitor 330.

In step S114, the solid-state laser system control unit 350 calculates a difference ΔEs between the pulse energy Es and the target pulse energy Est.

Then, in step S116, the solid-state laser system control unit 350 determines whether or not an absolute value of ΔEs is equal to or smaller than an allowable upper limit value ΔEstr which indicates an allowable range. When the determination result in step S116 is Yes, the solid-state laser system control unit 350 goes to step S117.

In step S117, the solid-state laser system control unit 350 transmits, to the laser control unit 18, a pulse energy OK signal of the solid-state laser system 10, that is, a flag signal of Fs being 1.

When the determination result in step S116 is No, the solid-state laser system control unit 350 goes to step S118.

In step S118, the solid-state laser system control unit 350 changes the target pulse energy E1t of the first solid-state laser device 100 such that the difference ΔEs between the pulse energy Es and the target pulse energy Est is close to 0, and transmits data of the changed target pulse energy E1t to the first energy control unit 168.

Then, in step S119, the solid-state laser system control unit 350 transmits, to the laser control unit 18, a pulse energy NG signal of the solid-state laser system 10, that is, a flag signal of Fs being 0.

After step S117 or S119, the solid-state laser system control unit 350 finishes the flowchart in FIG. 11 and returns to the flowchart in FIG. 6.

In the example in FIG. 11, the solid-state laser system control unit 350 changes only the target pulse energy E1t of the first solid-state laser device 100 such that the difference ΔEs between the pulse energy Es and the target pulse energy is close to 0, but not limited to this example. For example, the solid-state laser system control unit 350 may change only the target pulse energy E2t of the second solid-state laser device 200, or may change both E1t and E2t.

1.5 Example of Semiconductor Laser System 1.5.1 Configuration

Figure 12:
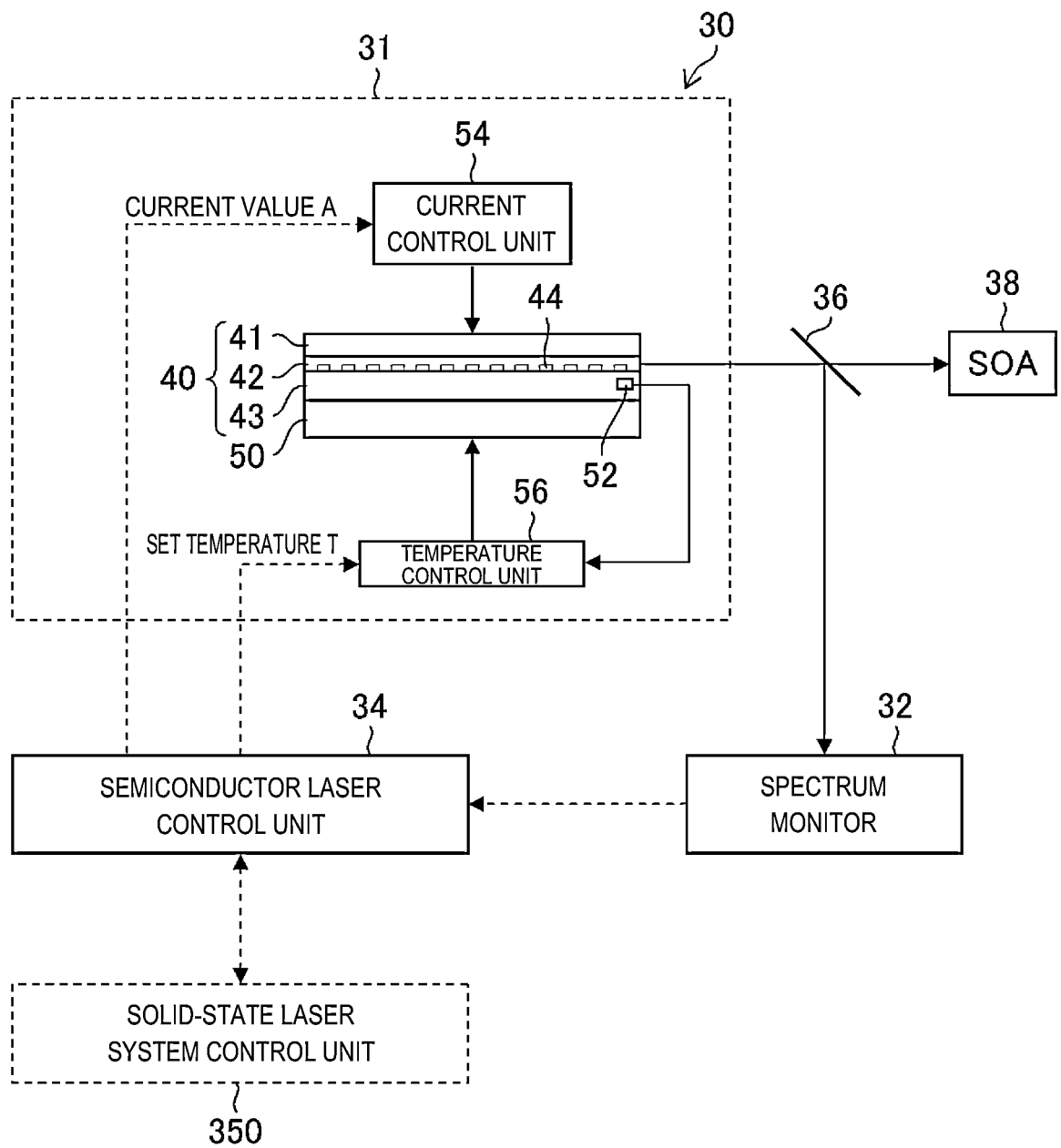
FIG. 12 schematically shows an exemplary configuration of a semiconductor laser system.

FIG. 12 schematically shows an exemplary configuration of the semiconductor laser system 30. The semiconductor laser system 30 in FIG. 12 can be applied to the first semiconductor laser system 110 and the second semiconductor laser system 210 in FIG. 1.

The semiconductor laser system 30 includes a single longitudinal mode DFB laser 31, a spectrum monitor 32, a semiconductor laser control unit 34, a beam splitter 36, and a semiconductor optical amplifier 38. The DFB laser 31 includes a semiconductor element 40, a Peltier element 50, a temperature sensor 52, a current control unit 54, and a temperature control unit 56. The semiconductor element 40 includes a first cladding layer 41, an active layer 42, a second cladding layer 43, and a grating 44 at a boundary between the active layer 42 and the second cladding layer 43.

1.5.2 Operation

An oscillation wavelength of the DFB laser 31 can be changed by changing a current value A and/or a set temperature T of the semiconductor element 40. The current value A may be, for example, a direct current (DC) value. The current value A is changed to change the oscillation wavelength within a narrow range at high speed. The set temperature T is changed to significantly change the oscillation wavelength.

Figure 13:
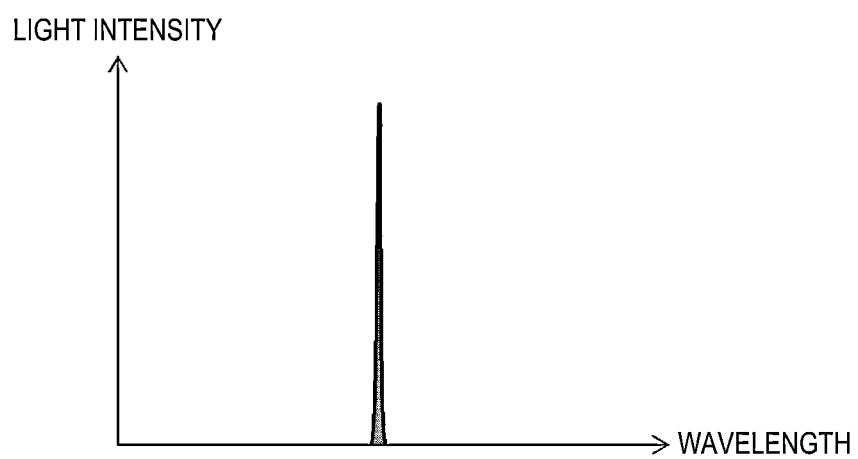
FIG. 13 shows an example of a spectral waveform of a laser beam output from a distributed feedback semiconductor laser.

FIG. 13 shows an example of a spectral waveform of a laser beam output from the DFB laser 31. As shown in FIG. 13, the laser beam output from the DFB laser 31 has a single-line spectral shape with a narrow spectral line width due to single longitudinal mode oscillation.

1.6 Example of Processing of First Semiconductor Laser Control Unit

Figure 14:
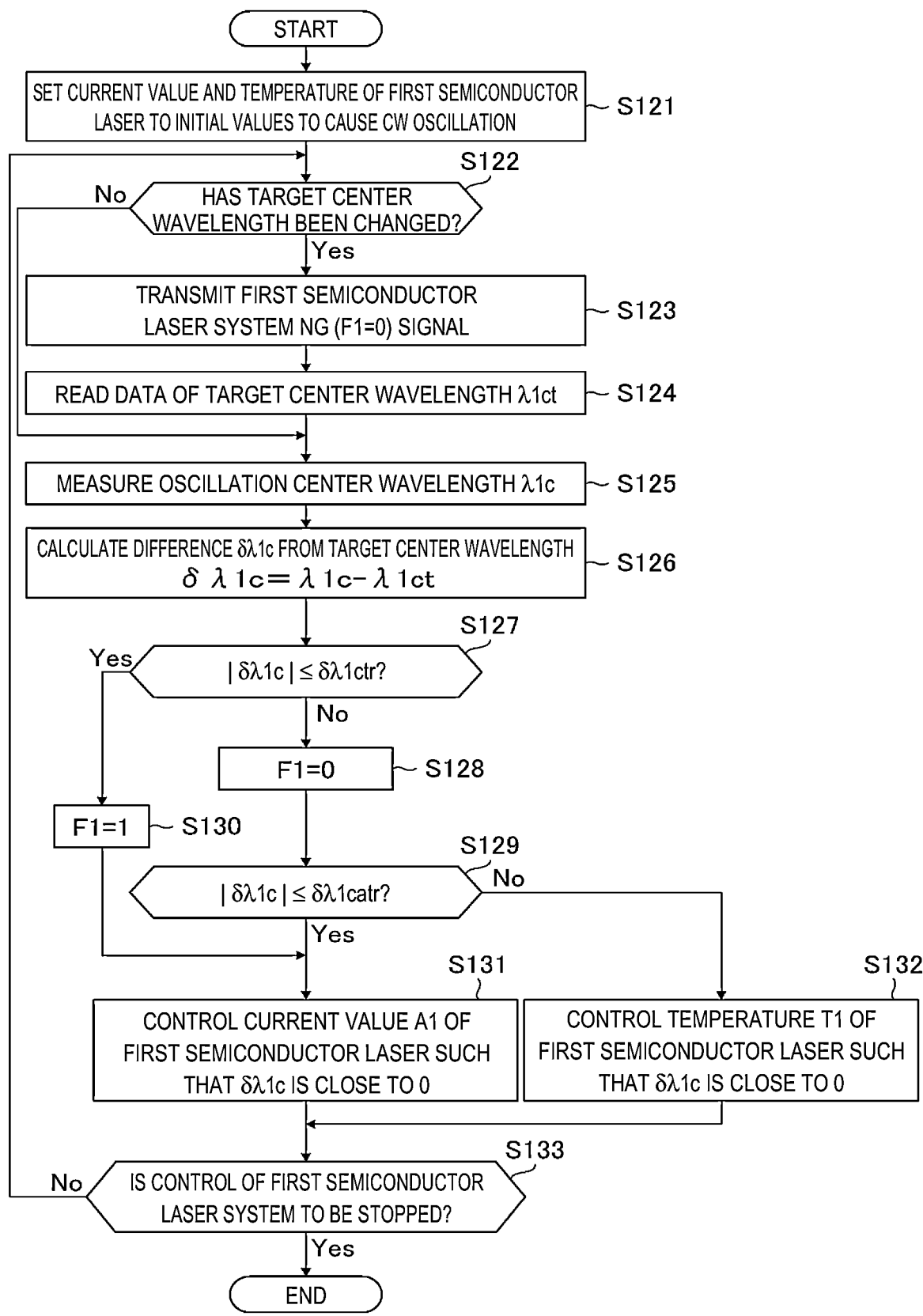
FIG. 14 is a flowchart of an example of processing of a first semiconductor laser control unit.

FIG. 14 is a flowchart of an example of processing of the first semiconductor laser control unit 114. The processing and the operation in the flowchart in FIG. 14 are realized by, for example, a processor that functions as the first semiconductor laser control unit 114 executing a program.

In step S121, the first semiconductor laser control unit 114 sets a current value and a temperature of the first semiconductor laser 111 to initial values to cause CW oscillation. For example, the first semiconductor laser control unit 114 reads the current value and the temperature of the first semiconductor laser 111 set to the initial values in step S79 in FIG. 7 to cause CW oscillation of the first semiconductor laser 111.

In step S122, the first semiconductor laser control unit 114 determines whether or not the target center wavelength of the first semiconductor laser system 110 has been changed by the solid-state laser system control unit 350. When the determination result in step S122 is Yes, the first semiconductor laser control unit 114 goes to step S123, and transmits, to the solid-state laser system control unit 350, an NG signal indicating that the first semiconductor laser system 110 is in an NG state. Specifically, the first semiconductor laser control unit 114 transmits a flag signal of F1 being 0 to the solid-state laser system control unit 350.

In step S124, the first semiconductor laser control unit 114 reads data of the target center wavelength $\lambda 1ct$. After step S124, the first semiconductor laser control unit 114 goes to step S125.

When the determination result in step S122 is No, the first semiconductor laser control unit 114 skips steps S123 and S124 and goes to step S125.

In step S125, the first semiconductor laser control unit 114 uses the first spectrum monitor 112 to measure an oscillation center wavelength $\lambda 1c$.

In step S126, the first semiconductor laser control unit 114 calculates a difference $\delta\lambda 1c$ between the oscillation center wavelength $\lambda 1c$ and the target center wavelength $\lambda 1ct$.

In step S127, the first semiconductor laser control unit 114 determines whether or not an absolute value of $\delta\lambda 1c$ is equal to or smaller than an allowable upper limit value $\delta\lambda 1ctr$ which indicates an allowable range. When the determination result in step S127 is No, the first semiconductor laser control unit 114 goes to step S128, and transmits a flag signal of F1 being 0 to the solid-state laser system control unit 350.

In step S129, the first semiconductor laser control unit 114 determines whether or not an absolute value of $\delta\lambda 1c$ is equal to or smaller than an allowable upper limit value $\delta 1ctr$, which is a range in which a wavelength can be controlled by current control. When the determination result in step S129 is Yes, the first semiconductor laser control unit 114 goes to step S131, and controls the current value A1 of the first semiconductor laser 111 such that $\delta\lambda 1c$ is close to 0.

When the determination result in step S129 is No, the first semiconductor laser control unit 114 goes to step S132, and controls the temperature T1 of the first semiconductor laser 111 such that $\delta\lambda 1c$ is close to 0.

When the determination result in step S127 is Yes, the first semiconductor laser control unit 114 goes to step S130, and transmits a flag signal of F1 being 1 to the solid-state laser system control unit 350. After step S130, the first semiconductor laser control unit 114 goes to step S131.

After step S131 or S132, the first semiconductor laser control unit 114 goes to step S133. In step S133, the first semiconductor laser control unit 114 determines whether or not to stop control of the first semiconductor laser system 110. When the determination result in step S133 is No, the first semiconductor laser control unit 114 returns to step S122, and repeats the processes in steps S122 to S133.

When the determination result in step S133 is Yes, the first semiconductor laser control unit 114 finishes the flowchart in FIG. 13.

1.7 Example of Processing of Second Semiconductor Laser Control Unit

Figure 15:
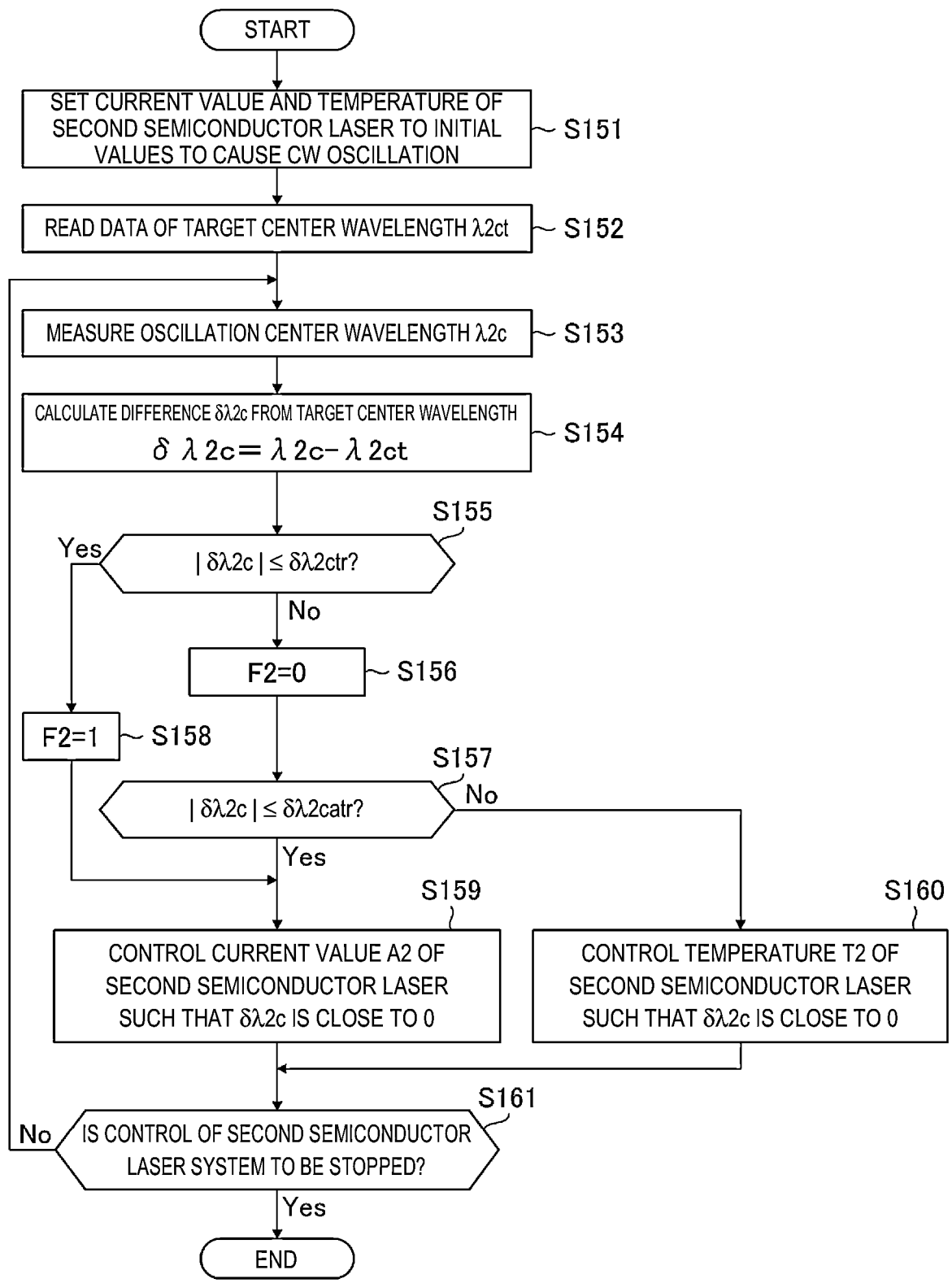
FIG. 15 is a flowchart of an example of processing of a second semiconductor laser control unit.

FIG. 15 is a flowchart of an example of processing of the second semiconductor laser control unit 214. The processing and the operation in the flowchart in FIG. 15 are realized by, for example, a processor that functions as the second semiconductor laser control unit 214 executing a program.

In step S151, the second semiconductor laser control unit 214 sets a current value and a temperature of the second semiconductor laser 211 to initial values to cause CW oscillation. For example, the second semiconductor laser control unit 214 reads the current value and the temperature of the second semiconductor laser 211 set to the initial values in step S79 in FIG. 7 to cause CW oscillation of the second semiconductor laser 211.

In step S152, the second semiconductor laser control unit 214 reads data of the target center wavelength $\lambda 2ct$.

In step S153, the second semiconductor laser control unit 214 uses the second spectrum monitor 212 to measure an oscillation center wavelength $\lambda 2c$.

In step S154, the second semiconductor laser control unit 214 calculates a difference $\delta\lambda 2c$ between the oscillation center wavelength $\lambda 2c$ and the target center wavelength $\lambda 2ct$.

In step S155, the second semiconductor laser control unit 214 determines whether or not an absolute value of $\delta\lambda 2c$ is equal to or smaller than an allowable upper limit value $\delta\lambda 2ctr$ which indicates an allowable range. When the determination result in step S155 is No, the second semiconductor laser control unit 214 goes to step S156, and transmits a flag signal of F2 being 0 to the solid-state laser system control unit 350.

Then, in step S157, the second semiconductor laser control unit 214 determines whether or not the absolute value of $\delta\lambda2c$ is equal to or smaller than an allowable upper limit value $\delta2catr$, which is a range in which a wavelength can be controlled by current control. When the determination result in step S157 is Yes, the second semiconductor laser control unit 214 goes to step S159, and controls the current value A2 of the second semiconductor laser 211 such that $\delta\lambda2c$ is close to 0.

When the determination result in step S157 is No, the second semiconductor laser control unit 214 goes to step S160, and controls the temperature T2 of the second semiconductor laser 211 such that $\delta\lambda2c$ is close to 0.

When the determination result in step S155 is Yes, the second semiconductor laser control unit 214 goes to step S158, and transmits a flag signal of F2 being 1 to the solid-state laser system control unit 350. After step S158, the second semiconductor laser control unit 214 goes to step S159.

After step S159 or S160, the second semiconductor laser control unit 214 goes to step S161. In step S161, the second semiconductor laser control unit 214 determines whether or not to stop control of the second semiconductor laser system 210. When the determination result in step S161 is No, the second semiconductor laser control unit 214 returns to step S153, and repeats the processes in steps S153 to S161.

When the determination result in step S161 is Yes, the second semiconductor laser control unit 214 finishes the flowchart in FIG. 15.

1.8 Example of Processing of First Energy Control Unit

Figure 16:
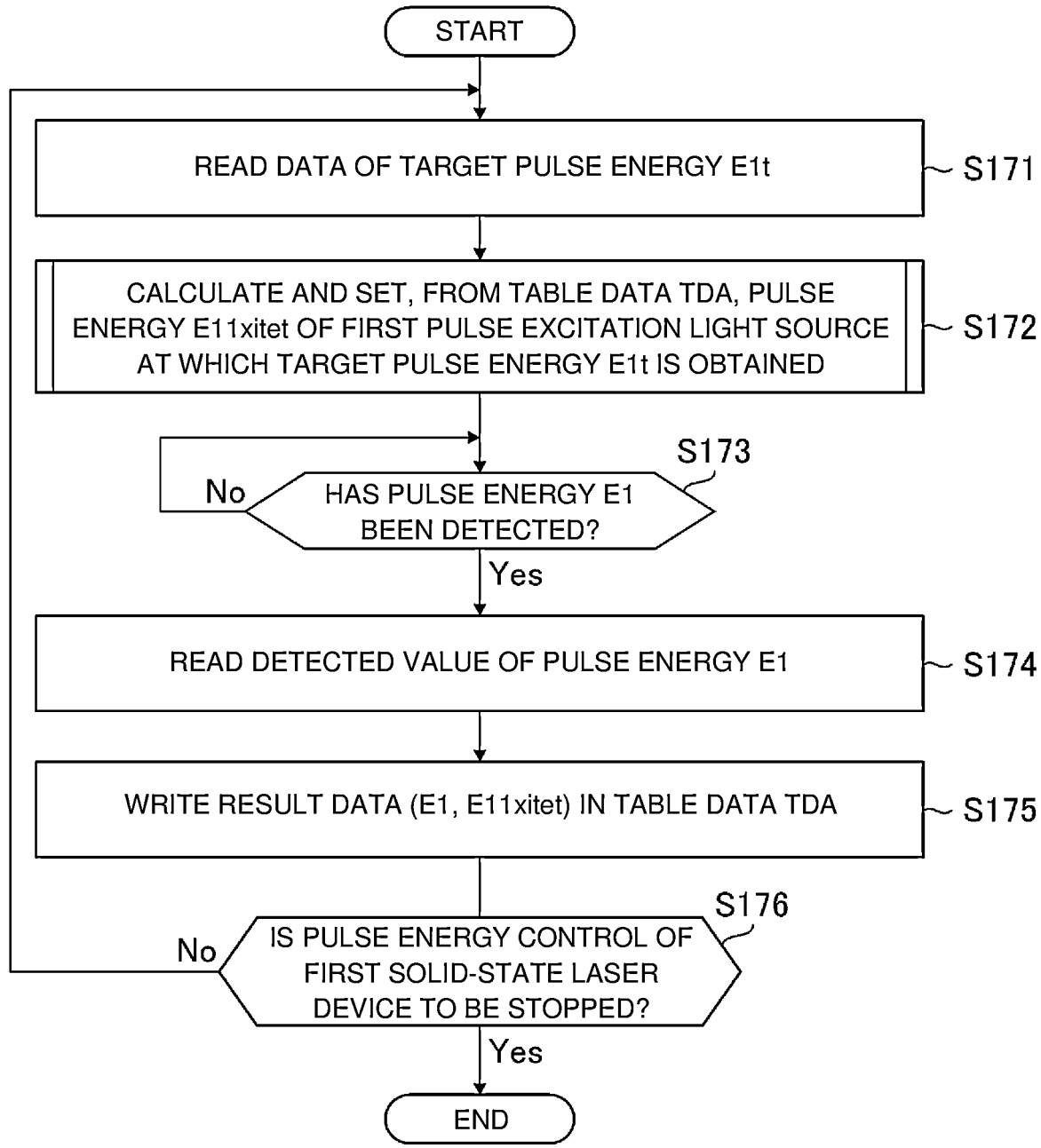
FIG. 16 is a flowchart of an example of processing of a first energy control unit.

FIG. 16 is a flowchart of an example of processing of the first energy control unit 168. The processing and the operation in the flowchart in FIG. 16 are realized by, for example, a processor that functions as the first energy control unit 168 executing a program.

In step S171, the first energy control unit 168 reads data of the target pulse energy E1t of the first solid-state laser device 100 transmitted from the solid-state laser system control unit 350.

In step S172, the first energy control unit 168 calculates and sets, from table data TDA, pulse energy E11xitet of the first pulse excitation light source 132 at which the target pulse energy E1t is obtained. Here, an example is shown in which pulse energy E1 of the first pulse laser beam LP1 output from the first solid-state laser device 100 is controlled in accordance with the pulse energy E11xite of the first pulse excitation light source 132. The table data TDA is herein a relationship table showing a correspondence between the pulse energy E11xite of the first pulse excitation light source 132 and the pulse energy E1 of the first pulse laser beam.

Figures 17, 18:
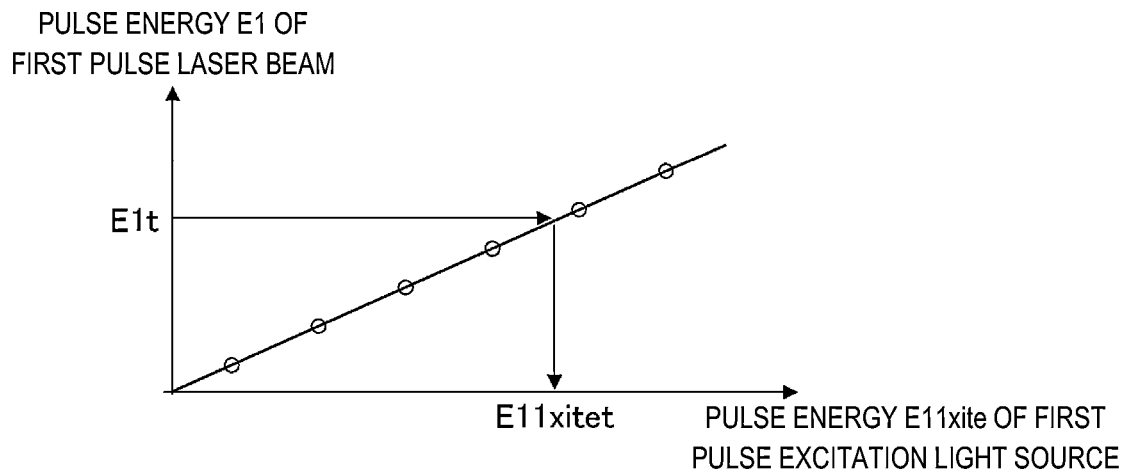
FIG. 17 is a table showing an example of table data TDA.
FIG. 18 is a graph showing an example of a relationship between pulse energy E11xite of a first pulse excitation light source and pulse energy E1 of a first pulse laser beam in the table data TDA.

FIG. 17 is a table showing an example of the table data TDA. FIG. 18 is a graph showing an example of a relationship between the pulse energy E11xite of the first pulse excitation light source 132 and the pulse energy E1 of the first pulse laser beam in the table data TDA. The table data TDA can be used to calculate the pulse energy E11xitet of the first pulse excitation light source 132 at which the target pulse energy E1t is obtained.

Figure 19:
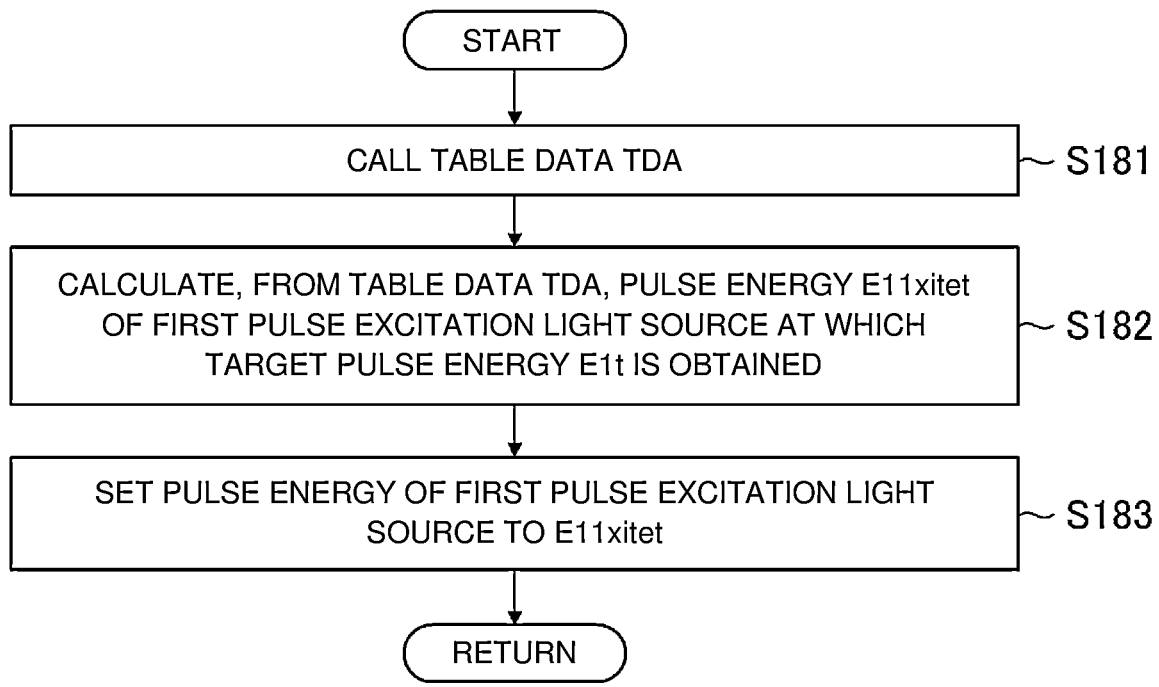
FIG. 19 is a flowchart of an example of a subroutine applied to step S172 in FIG. 16.

FIG. 19 is a flowchart of an example of a subroutine applied to step S172 in FIG. 16. In step S181 in FIG. 19, the first energy control unit 168 calls the table data TDA stored in a memory or the like. The table data TDA may include, for example, data of a measurement result obtained by measuring the pulse energy E1 of the first pulse laser beam while changing the value of the pulse energy E11xite of the first pulse excitation light source 132 during adjustment oscillation of the solid-state laser system 10.

Then, in step S182, the first energy control unit 168 calculates, from the table data TDA, the pulse energy E11xitet of the first pulse excitation light source 132 at which the target pulse energy E1t is obtained (see FIG. 18).

In step S183, the first energy control unit 168 sets, to E11xitet, the pulse energy of the first pulse excitation light source 132 obtained by the calculation in step S182. After step S183, the first energy control unit 168 finishes the flowchart in FIG. 19 and returns to the flowchart in FIG. 16.

In step S173 in FIG. 16, the first energy control unit 168 determines whether or not the pulse energy monitor 166 has detected the pulse energy E1. When the determination result in step S173 is No, the first energy control unit 168 repeats the process in step S173.

When the pulse energy monitor 166 has detected the pulse energy E1 and the determination result in step S173 is Yes, the first energy control unit 168 goes to step S174, and reads a detected value of the pulse energy E1 detected by the pulse energy monitor 166.

In step S175, the first energy control unit 168 writes, in the table data TDA, result data (E1, E11xitet) including the value of the pulse energy E1 obtained in step S174 and the value of the pulse energy E11xitet of the first pulse excitation light source 132 at which the detected value is obtained. The processing in step S175 updates the table data TDA, and increases calculation accuracy of the pulse energy E11xitet of the first pulse excitation light source 132 corresponding to the target pulse energy E1t.

After step S175, in step S176, the first energy control unit 168 determines whether or not to stop pulse energy control of the first solid-state laser device 100. When the determination result in step S176 is No, the first energy control unit 168 returns to step S171 and repeats the processes in steps S171 to step S176.

When the determination result in step S176 is Yes, the first energy control unit 168 finishes the flowchart in FIG. 16.

1.9 Example of Processing of Second Energy Control Unit

Figure 20:
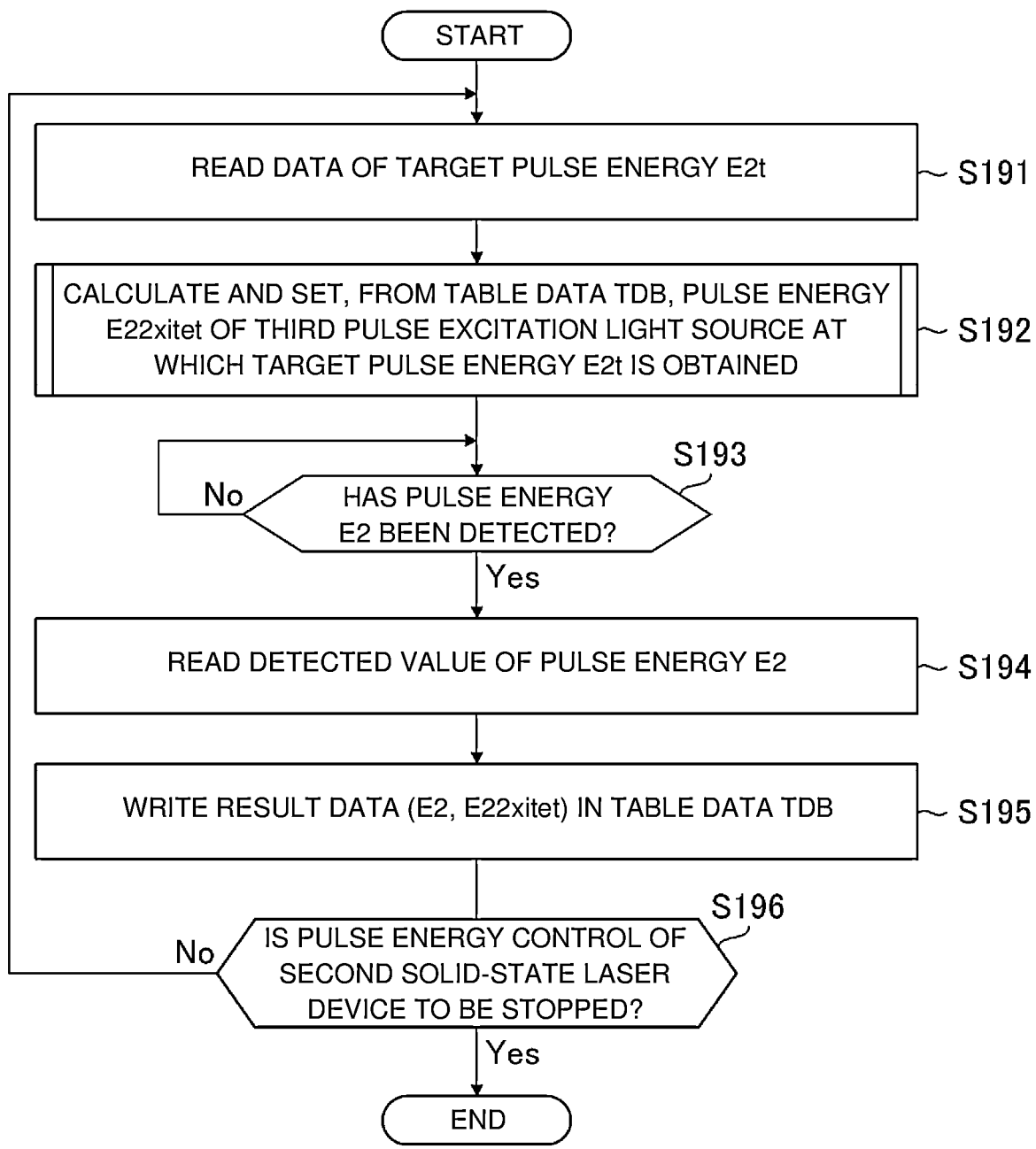
FIG. 20 is a flowchart of an example of processing of a second energy control unit.

FIG. 20 is a flowchart of an example of processing of the second energy control unit 268. The processing and the operation in the flowchart in FIG. 20 are realized by, for example, a processor that functions as the second energy control unit 268 executing a program.

In step S191, the second energy control unit 268 reads data of the target pulse energy E2t of the second solid-state laser device 200 transmitted from the solid-state laser system control unit 350.

In step S192, the second energy control unit 268 calculates and sets, from table data TDB, pulse energy E22xitet of the third pulse excitation light source 244 at which the target pulse energy E2t is obtained. Here, an example is shown in which pulse energy E21xite of the second pulse excitation light source 232 is a fixed value E21xite0, and pulse energy E2 of the second pulse laser beam LP2 output from the second solid-state laser device 200 is controlled in accordance with the pulse energy E22xite of the third pulse excitation light source 244. The table data TDB is herein a relationship table showing a correspondence between the pulse energy E22xite of the third pulse excitation light source 244 and the pulse energy E2 of the second pulse laser beam.

Figures 21, 22:
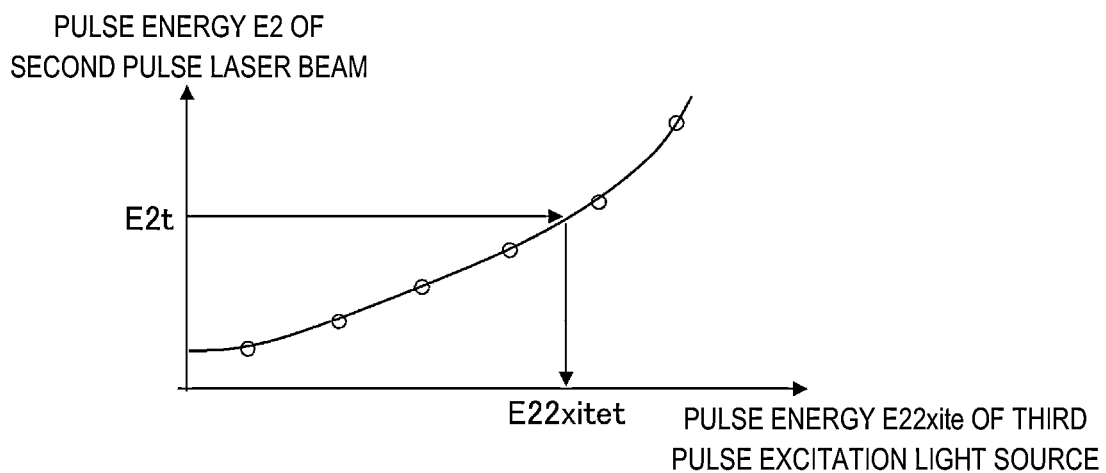
FIG. 21 is a table showing an example of table data TDB.
FIG. 22 is a graph showing an example of a relationship between pulse energy E22xite of a third pulse excitation light source and pulse energy E2 of a second pulse laser beam in the table data TDB.

FIG. 21 is a table showing an example of the table data TDB. FIG. 22 is a graph showing an example of a relationship between the pulse energy E22xite of the third pulse excitation light source 244 and the pulse energy E2 of the second pulse laser beam in the table data TDB. The table data TDB can be used to calculate the pulse energy E22xitet of the third pulse excitation light source 244 at which the target pulse energy E2t is obtained.

Figure 23:
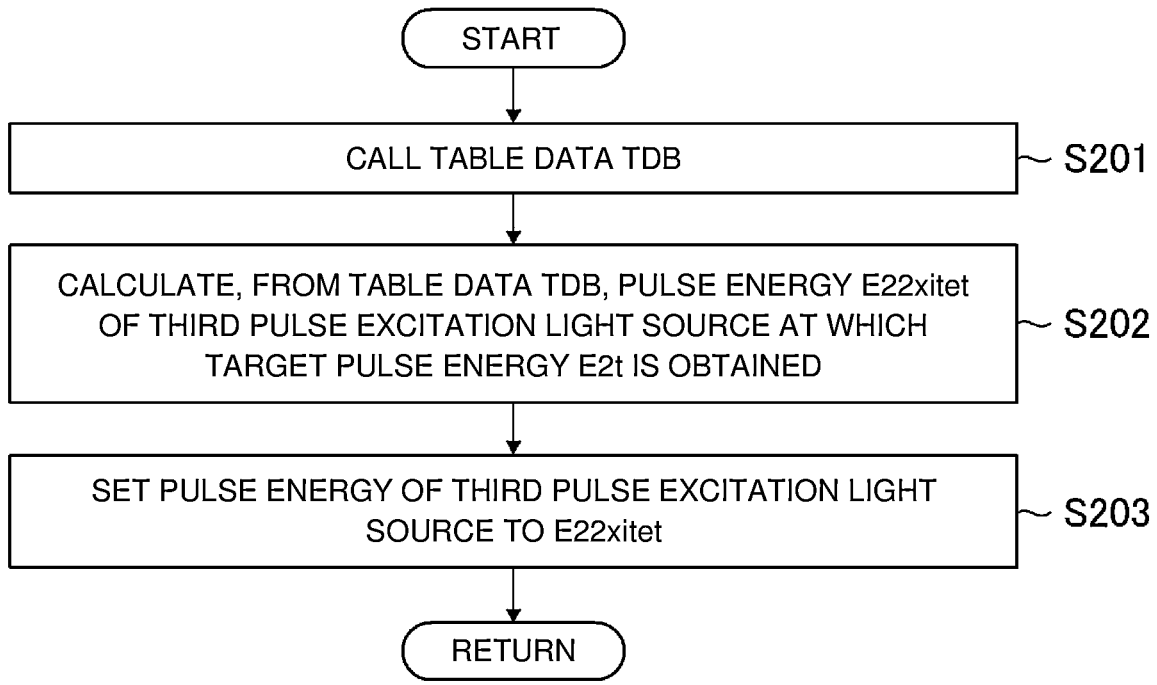
FIG. 23 is a flowchart of an example of a subroutine applied to step S192 in FIG. 20.

FIG. 23 is a flowchart of an example of a subroutine applied to step S192 in FIG. 20. In step S201 in FIG. 23, the second energy control unit 268 calls the table data TDB stored in the memory or the like. The table data TDB may include, for example, data of a measurement result obtained by measuring the pulse energy E2 of the second pulse laser beam while changing the value of the pulse energy E22xite of the third pulse excitation light source 244 during adjustment oscillation of the solid-state laser system 10.

Then, in step S202, the second energy control unit 268 calculates, from the table data TDB, the pulse energy E22xitet of the third pulse excitation light source 244 at which the target pulse energy E2t is obtained (see FIG. 22).

In step S203, the second energy control unit 268 sets, to E22xitet, the pulse energy of the third pulse excitation light source 244 obtained by the calculation in step S282. After step S203, the second energy control unit 268 finishes the flowchart in FIG. 23 and returns to the flowchart in FIG. 20.

In step S193 in FIG. 20, the second energy control unit 268 determines whether or not the pulse energy monitor 266 has detected the pulse energy E2. When the determination result in step S193 is No, the second energy control unit 268 repeats the process in step S193.

When the pulse energy monitor 266 has detected the pulse energy E2 and the determination result in step S193 is Yes, the second energy control unit 268 goes to step S194, and reads a detected value of the pulse energy E2 detected by the pulse energy monitor 266.

In step S195, the second energy control unit 268 writes, in the table data TDB, result data (E2, E22xitet) including the value of the pulse energy E2 obtained in step S194 and the value of the pulse energy E22xite of the third pulse excitation light source 244 at which the detected value is obtained. The processing in step S195 updates the table data TDB, and increases calculation accuracy of the pulse energy E22xitet of the third pulse excitation light source 244 corresponding to the target pulse energy E2t.

After step S195, in step S196, the second energy control unit 268 determines whether or not to stop pulse energy control of the second solid-state laser device 200. When the determination result in step S196 is No, the second energy control unit 268 returns to step S191 and repeats the processes in steps S191 to step S196.

When the determination result in step S196 is Yes, the second energy control unit 268 finishes the flowchart in FIG. 20.

2. Problem

Using, as a light source of the exposure apparatus 20, the laser system 1 including a combination of a master oscillator (MO) of the solid-state laser system 10 and the excimer amplifier 14 in FIG. 1 has the following problems.

[Problem 1]
To change an image forming position according to a level of a wafer in the exposure apparatus 20, control is needed to finely change the wavelength of the pulse laser beam output from the laser system 1.

[Problem 2]
To correct a wavelength change due to a change in air pressure in an exposure environment, control is needed to significantly change the wavelength of the pulse laser beam output from the laser system 1.

[Problem 3]
However, in the solid-state laser system 10, changing the oscillation wavelength of the first solid-state laser device 100 causes phase mismatch of the nonlinear crystals (first CLBO crystal 316 and second CLBO crystal 320) in the wavelength conversion system 300, reducing wavelength conversion efficiency of the wavelength conversion system 300. This reduces pulse energy of the pulse laser beam output from the solid-state laser system 10.

[Problem 4]
The reduction in the pulse energy of the pulse laser beam output from the laser system 1 due to the reduction in the wavelength conversion efficiency may reduce the pulse energy of the pulse laser beam (excimer laser beam) amplified by the excimer amplifier 14.

[Problem 5]
In particular, when wavelength control to change the wavelength of the excimer laser beam at high speed is performed to change an image forming position according to a level of a wafer, it is difficult to change an incident angle on a nonlinear crystal at high speed by a rotation stage (not shown) or the like for phase matching to maintain high wavelength conversion efficiency. For example, if an instruction for drive control of the rotation stage to change the incident angle on the nonlinear crystal is faster than a fast instruction from the exposure apparatus to request a wavelength change of the excimer laser beam, driving of the rotation stage cannot follow the instruction and the control diverges. This may reduce pulse energy stability of the pulse laser beam output from the wavelength conversion system 300.

3. Embodiment 1

3.1 Configuration

Figure 24:
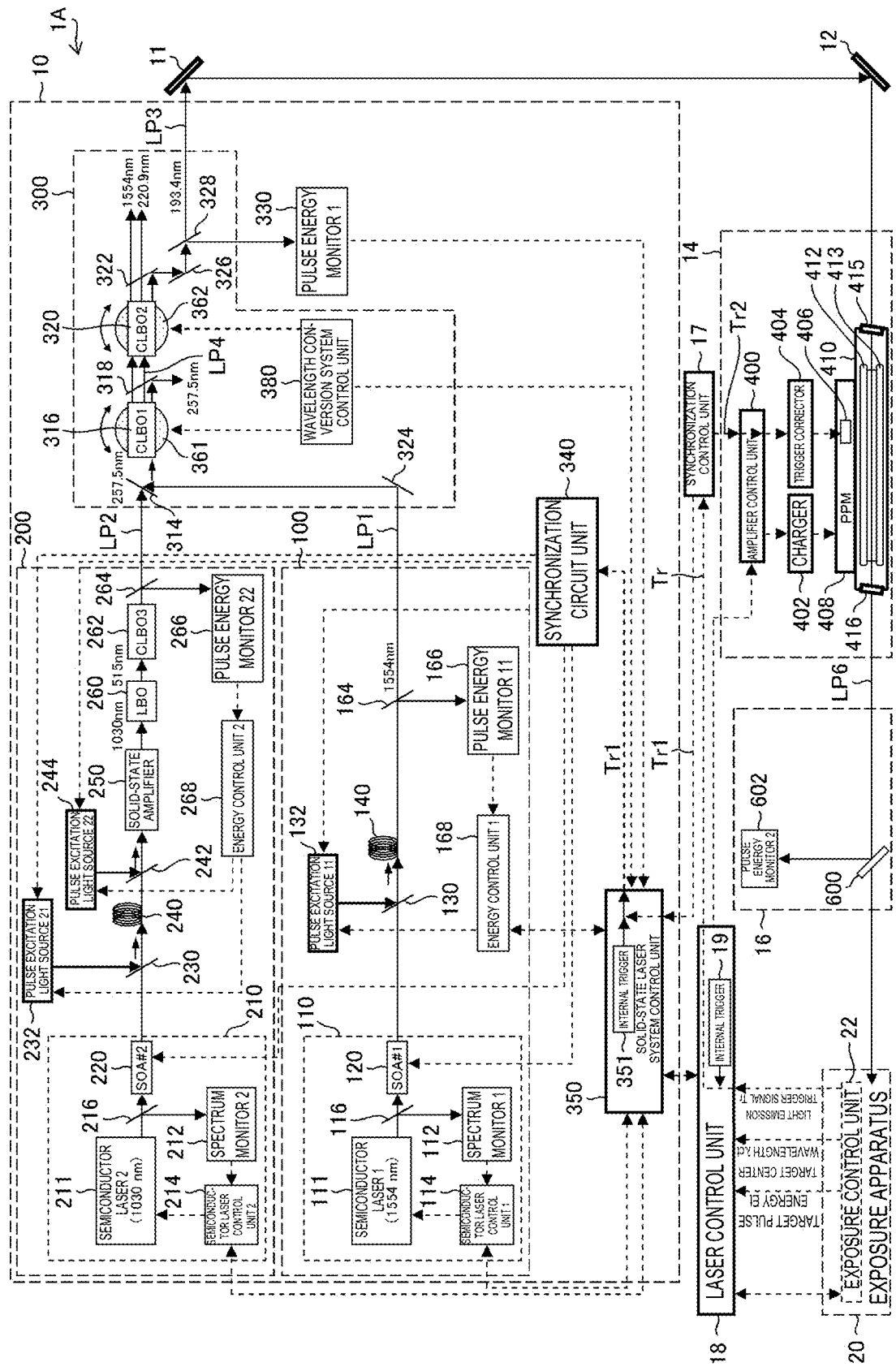
FIG. 24 schematically shows a configuration of a laser system according to Embodiment 1.

FIG. 24 schematically shows a configuration of a laser system 1A according to Embodiment 1. Differences from FIG. 1 will be described. The laser system 1A according to Embodiment 1 in FIG. 24 further includes a first rotation stage 361, a second rotation stage 362, and a wavelength conversion system control unit 380 to control incident angles θ1 and θ2 on a first CLBO crystal 316 and a second CLBO crystal 320 in a wavelength conversion system 300.

The first CLBO crystal 316 is arranged on the first rotation stage 361. The second CLBO crystal 320 is arranged on the second rotation stage 362. The first rotation stage 361 and the second rotation stage 362 are electric stages and driven according to control signals from the wavelength conversion system control unit 380. The first rotation stage 361 and the second rotation stage 362 each include, for example, a power source such as a stepping motor or a piezoelectric actuator. The wavelength conversion system control unit 380 is connected to a solid-state laser system control unit 350.

Figure 25:
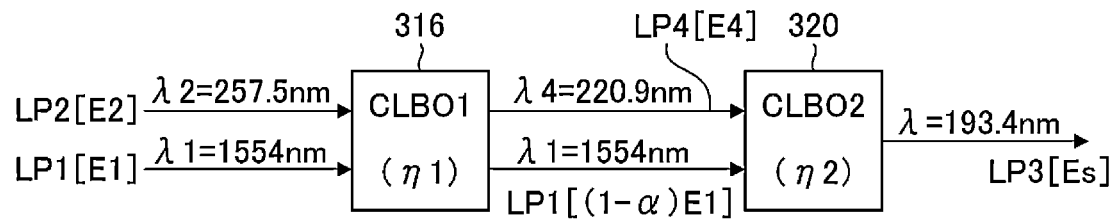
FIG. 25 illustrates wavelength conversion efficiency of a wavelength conversion system.

3.2 Description of Wavelength Conversion Efficiency of Wavelength Conversion System FIG. 25 illustrates wavelength conversion efficiency of the wavelength conversion system 300. Here, pulse energy of a first pulse laser beam LP1 (wavelength λ1 of 1554 nm) entering the first CLBO crystal 316 is E1, and pulse energy of a second pulse laser beam LP2 (wavelength λ2 of 257.5 nm) is E2.

Wavelength conversion efficiency of the first CLBO crystal 316 is η1, and wavelength conversion efficiency of the second CLBO crystal 320 is η2.

Pulse energy of a fourth pulse laser beam LP4 having a wavelength λ4 of 220.9 nm output from the first CLBO crystal 316 is E4. The pulse energy E4 is expressed by Expression (3) below.

$$E4 = E1 \cdot E2 \cdot \eta 1 \quad (3)$$

Pulse energy of the first pulse laser beam LP1 of the wavelength λ1 having passed through the first CLBO crystal 316 is (1−α)E1. The letter a represents a value larger than 0 and smaller than 1. The letter a indicates a rate of the first pulse laser beam LP1 used for wavelength conversion by the first CLBO crystal 316. Specifically, the pulse energy of the first pulse laser beam LP1 that has not been wavelength-converted by the first CLBO crystal 316 is expressed by (1−α)E1.

The first pulse laser beam LP1 of the wavelength λ1 having passed through the first CLBO crystal 316 and the fourth pulse laser beam LP4 of the wavelength λ4 enter the second CLBO crystal 320, and a third pulse laser beam LP3 having a wavelength λ of 193.4 nm is output from the second CLBO crystal 320. Pulse energy of the third pulse laser beam LP3 output from the second CLBO crystal 320 is Es. The pulse energy Es is expressed by Expression (4) below.

$$Es = (1-\alpha) E1 \cdot E4 \cdot \eta 2 \quad (4)$$

From Expressions (3) and (4), Expression (5) below is obtained.

$$Es = E2 \cdot E1^2 \cdot (1-\alpha) \eta 1 \cdot \eta 2 \quad (5)$$

When wavelength conversion efficiency of the wavelength conversion system 300 is η, η is expressed by Expression (6) below.

$$\eta (1-\alpha) \eta 1 \cdot \eta 2 \quad (6)$$

Thus, from Expressions (5) and (6), Es is expressed by Expression (7) below.

$$Es = E2 \cdot E1^2 \cdot \eta \quad (7)$$

From Expression (7), the pulse energy Es of the third pulse laser beam LP3 is proportional to the pulse energy E2 of the second pulse laser beam LP2 and proportional to the square of the pulse energy E1 of the first pulse laser beam LP1.

3.3 Wavelength Dependence of Wavelength Conversion Efficiency

Figure 26:
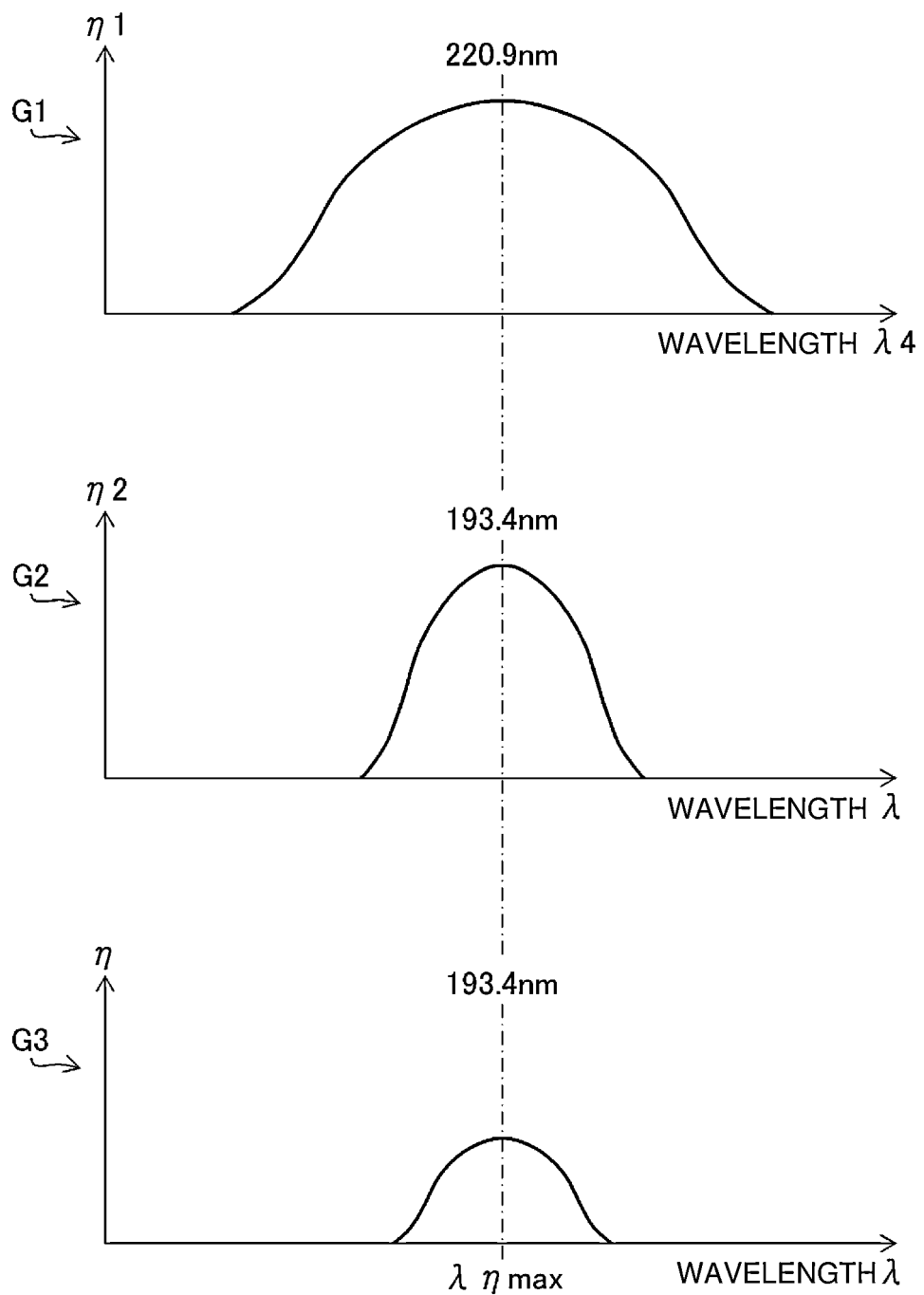
FIG. 26 is a graph showing wavelength dependence of the wavelength conversion efficiency.

FIG. 26 is a graph showing wavelength dependence of the wavelength conversion efficiency. The top graph G1 in FIG. 26 shows wavelength dependence of the wavelength conversion efficiency η1 of the first CLBO crystal 316 that is the first nonlinear crystal in the wavelength conversion system 300.

The middle graph G2 in FIG. 26 shows wavelength dependence of the wavelength conversion efficiency η2 of the second CLBO crystal 320 that is the second nonlinear crystal in the wavelength conversion system 300.

The bottom graph G3 in FIG. 26 shows wavelength dependence of the wavelength conversion efficiency η of the wavelength conversion system 300 including a combination of the first CLBO crystal 316 and the second CLBO crystal 320.

FIG. 26 shows an example in which the first CLBO crystal 316 and the second CLBO crystal 320 achieve phase matching and have maximum wavelength conversion efficiency when the wavelength of the third pulse laser beam LP3 is 193.4 nm.

The wavelength dependence of the wavelength conversion efficiency η of the wavelength conversion system 300 is a function of a difference between a maximum wavelength ληmax of wavelength conversion efficiency and the wavelength λ after wavelength conversion.

Thus, the wavelength dependence of the wavelength conversion efficiency η is expressed by a function h below when Δλ is λ−ληmax.

$$\eta = h(\Delta \lambda) \quad (8)$$

The function h may be obtained by adjustment oscillation of the laser system 1A to measure data as described below. Specifically, in the first step, the incident angles θ1 and θ2 on the first CLBO crystal 316 and the second CLBO crystal 320 are adjusted such that the pulse energy Es of the third pulse laser beam LP3 has a maximum value, with the wavelength λ1 of the first pulse laser beam LP1 being 1554 nm and the wavelength λ2 of the second pulse laser beam LP2 being 257.5 nm.

Then, in the second step, the wavelength λ1 of the first pulse laser beam LP1 is changed to change the wavelength λ of the third pulse laser beam LP3, and the pulse energy Es is measured.

Then, the relationship between the wavelength λ and the wavelength conversion efficiency η may be approximated by an approximate expression or stored as table data TD4 described later.

3.4 Operation

3.4.1 Example 2 of Processing of Solid-State Laser System Control Unit

Figure 27:
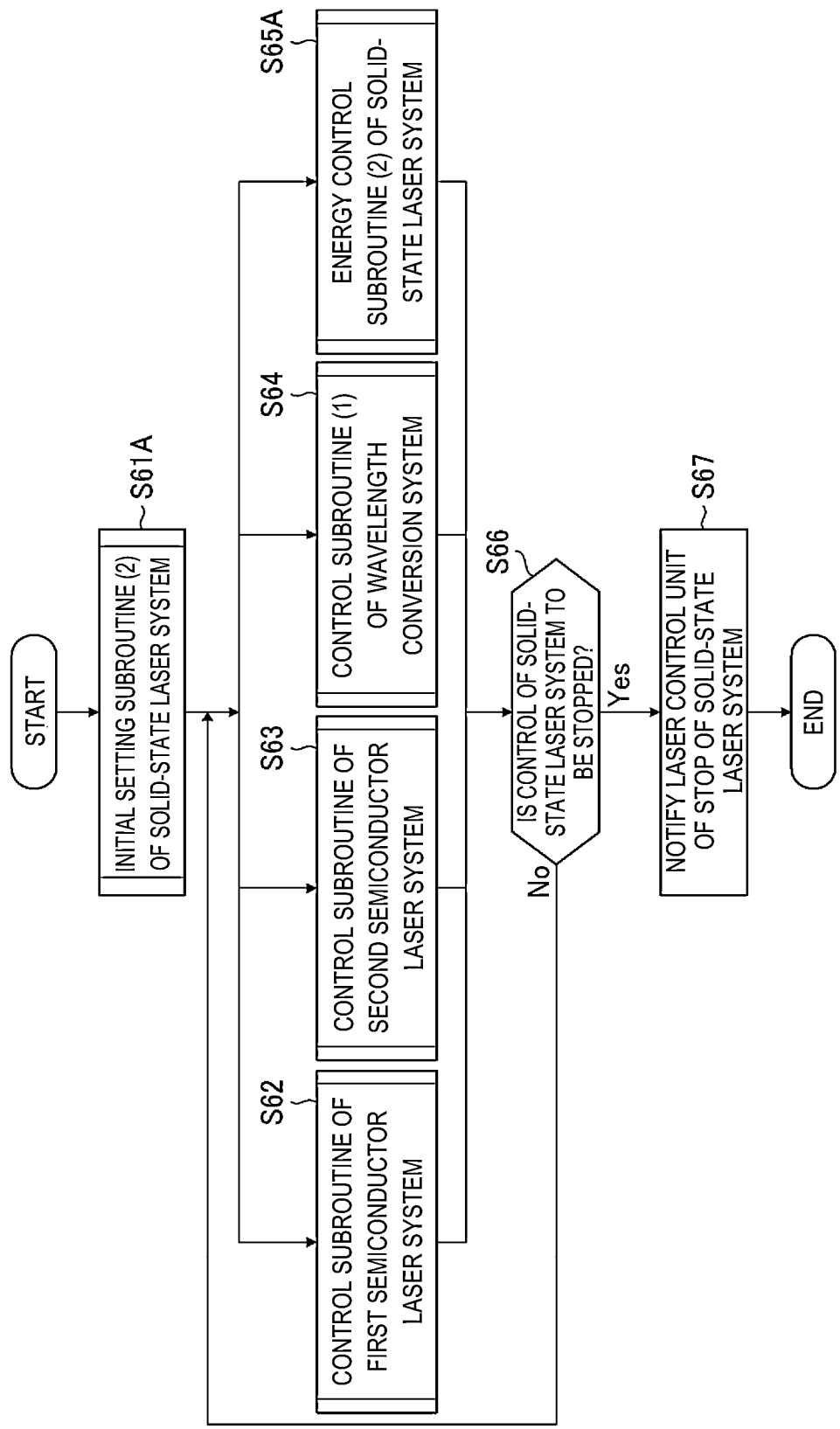
FIG. 27 is a flowchart of an example of processing of a solid-state laser system control unit.

FIG. 27 is a flowchart of an example of processing of the solid-state laser system control unit 350 in Embodiment 1. The flowchart in FIG. 27 can be applied in place of the flowchart in FIG. 6. Differences from FIG. 6 will be described.

The flowchart in FIG. 27 includes steps S61A and S65A in place of steps S61 and S65 in FIG. 6. The flowchart in FIG. 27 also includes step S64 between steps S61A and S66. Specifically, the flowchart of the solid-state laser system control unit 350 in FIG. 27 includes a control subroutine of a first semiconductor laser system 110 (step S62), a control subroutine of a second semiconductor laser system 210 (step S63), a control subroutine (1) of the wavelength conversion system 300 (step S64), and an energy control subroutine (2) of a solid-state laser system 10 (step S65A).

In step S61A, the solid-state laser system control unit 350 performs an initial setting subroutine (2) of the solid-state laser system.

In step S64, the solid-state laser system control unit 350 performs the control subroutine (1) of the wavelength conversion system 300.

In step S65A, the solid-state laser system control unit 350 performs the energy control subroutine (2) of the solid-state laser system 10.

Figure 28:
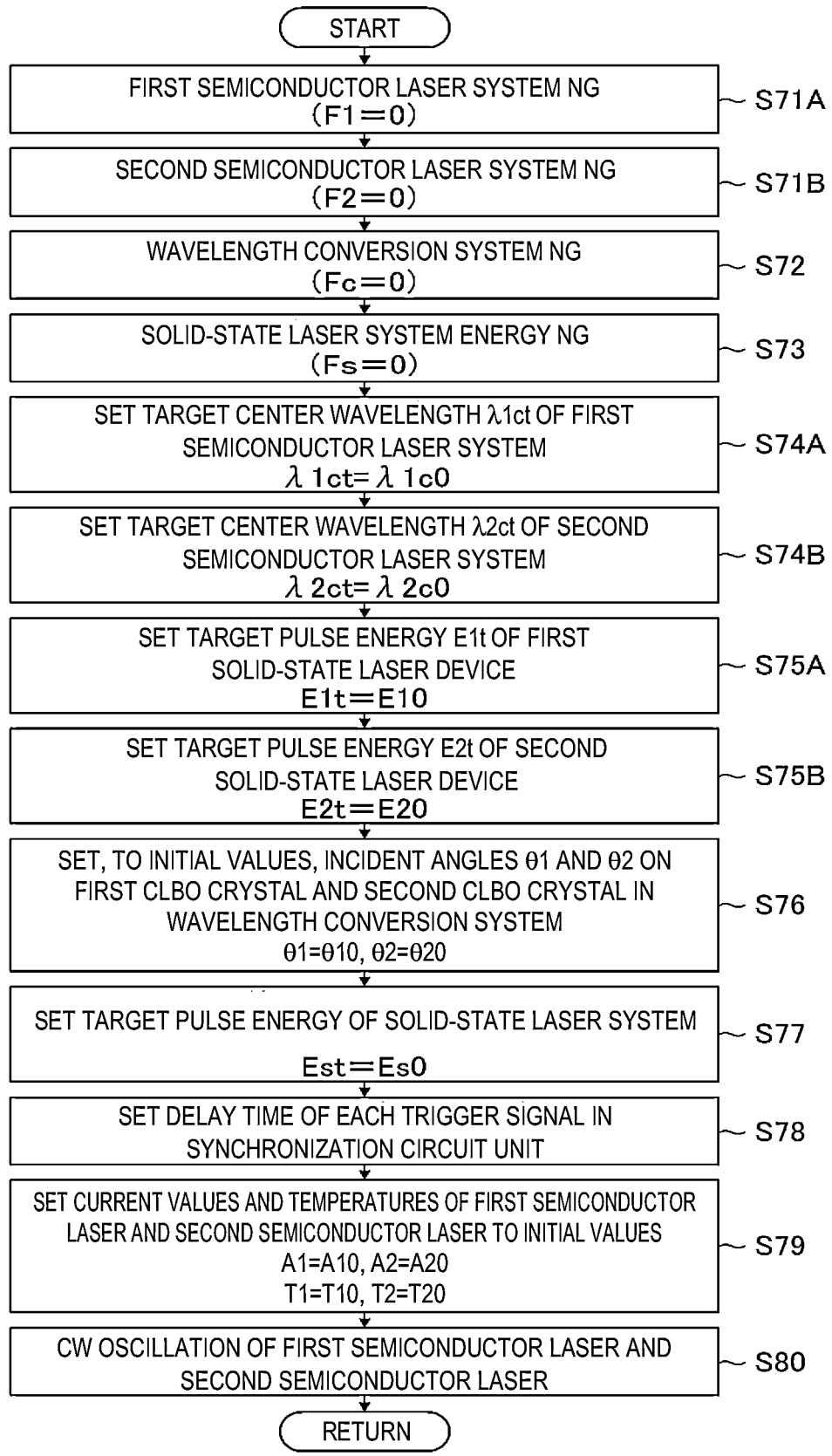
FIG. 28 is a flowchart of an example of an initial setting subroutine (2) of a solid-state laser system.

FIG. 28 is a flowchart of an example of an initial setting subroutine (2) of the solid-state laser system 10. The flowchart in FIG. 28 is applied to step S61A in FIG. 27. The flowchart in FIG. 28 is applied in place of the flowchart in FIG. 7. Differences from FIG. 7 will be described.

The flowchart in FIG. 28 includes step S72 between steps S71B and S73, and further includes step S76 between steps S75B and S77.

In step S72, the solid-state laser system control unit 350 sets the wavelength conversion system 300 to an NG state. In other words, the solid-state laser system control unit 350 sets, to "0", a value of a flag Fc indicating the state of the wavelength conversion system 300.

Steps S73 to S75B are the same as in FIG. 7.

In step S76, the solid-state laser system control unit 350 sets, to initial values, the incident angles θ1 and θ2 on the first CLBO crystal 316 and the second CLBO crystal 320 in the wavelength conversion system 300. In other words, the incident angle θ1 on the first CLBO crystal 316 is set to an initial value θ10, and the incident angle θ2 on the second CLBO crystal 320 is set to an initial value θ20. Here, the incident angles θ10 and θ20 on the first CLBO crystal 316 and the second CLBO crystal 320 are set such that the pulse laser beams having the wavelength of 1554 nm and the wavelength of 257.5 nm are wavelength-converted to obtain maximum wavelength conversion efficiency at the wavelength λc of 193.4 nm.

Steps S77 to S80 are the same as in FIG. 7. After step S80 in FIG. 28, the solid-state laser system control unit 350 finishes the flowchart in FIG. 28 and returns to the flowchart in FIG. 27.

Figure 29:
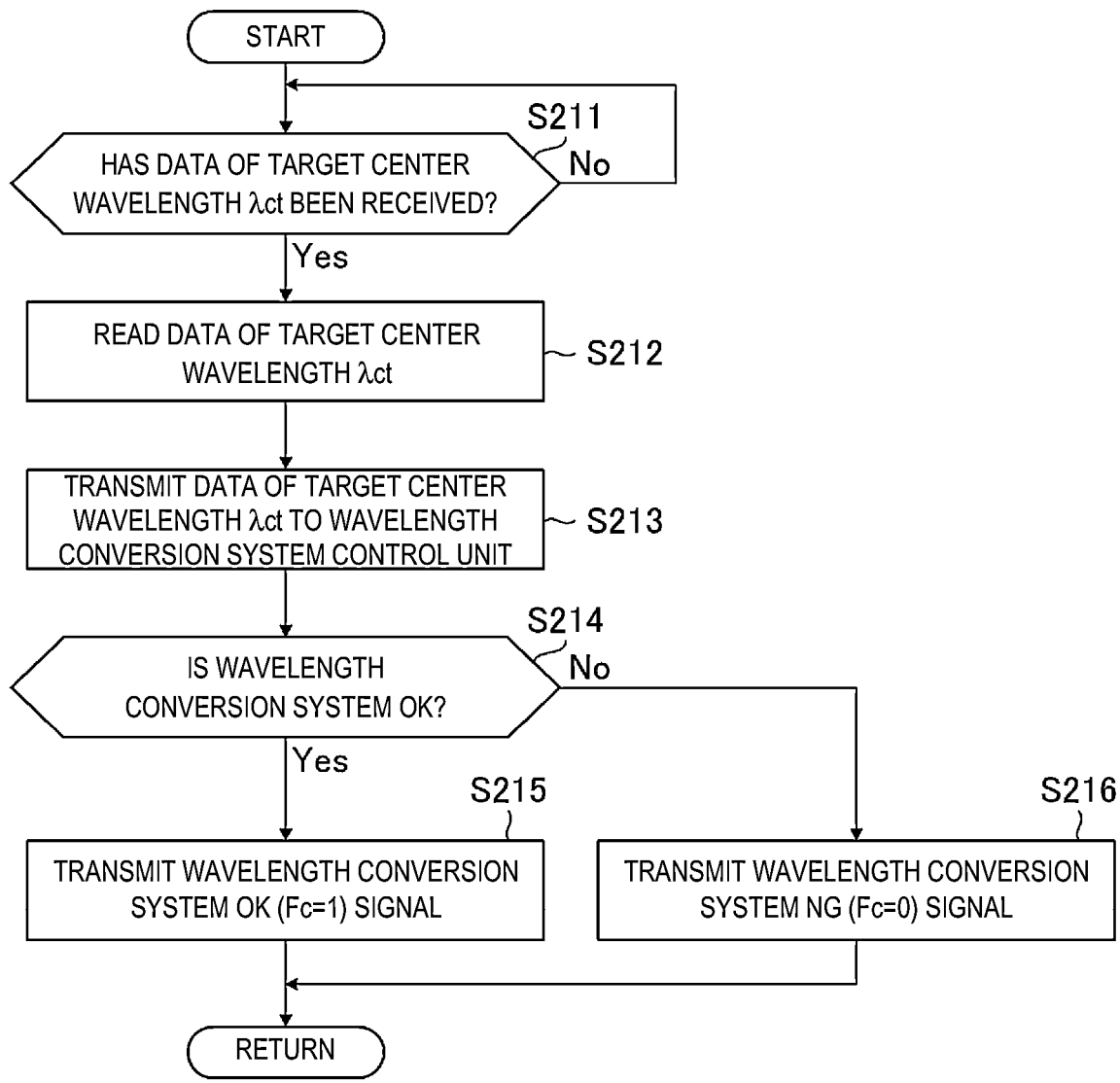
FIG. 29 is a flowchart of an example of a control subroutine (1) of the wavelength conversion system.

FIG. 29 is a flowchart of an example of the control subroutine (1) of the wavelength conversion system 300. The flowchart in FIG. 29 is applied to step S64 in FIG. 27.

In step S211 in FIG. 29, the solid-state laser system control unit 350 determines whether or not data of a target center wavelength λct has been received via the laser control unit 18. When the determination result in step S211 is No, the solid-state laser system control unit 350 repeats the process in step S211. When the determination result in step S211 is Yes, the solid-state laser system control unit 350 goes to step S212, and reads data of the target center wavelength λct.

Then, in step S213, the solid-state laser system control unit 350 transmits the data of the target center wavelength λct to the wavelength conversion system control unit 380.

Then, in step S214, the solid-state laser system control unit 350 determines whether or not an OK signal of the wavelength conversion system 300 has been received from the wavelength conversion system control unit 380.

When the determination result in step S214 is Yes, the solid-state laser system control unit 350 goes to step S215, and transmits, to the laser control unit 18, a flag signal of Fc being 1 indicating that the wavelength conversion system 300 is in an OK state.

When the determination result in step S214 is No, the solid-state laser system control unit 350 goes to step S216, and transmits, to the laser control unit 18, a flag signal of Fc being 0 indicating that the wavelength conversion system 300 is in an NG state.

After step S215 or S216, the solid-state laser system control unit 350 finishes the flowchart in FIG. 29 and returns to the flowchart in FIG. 27.

Figure 30:
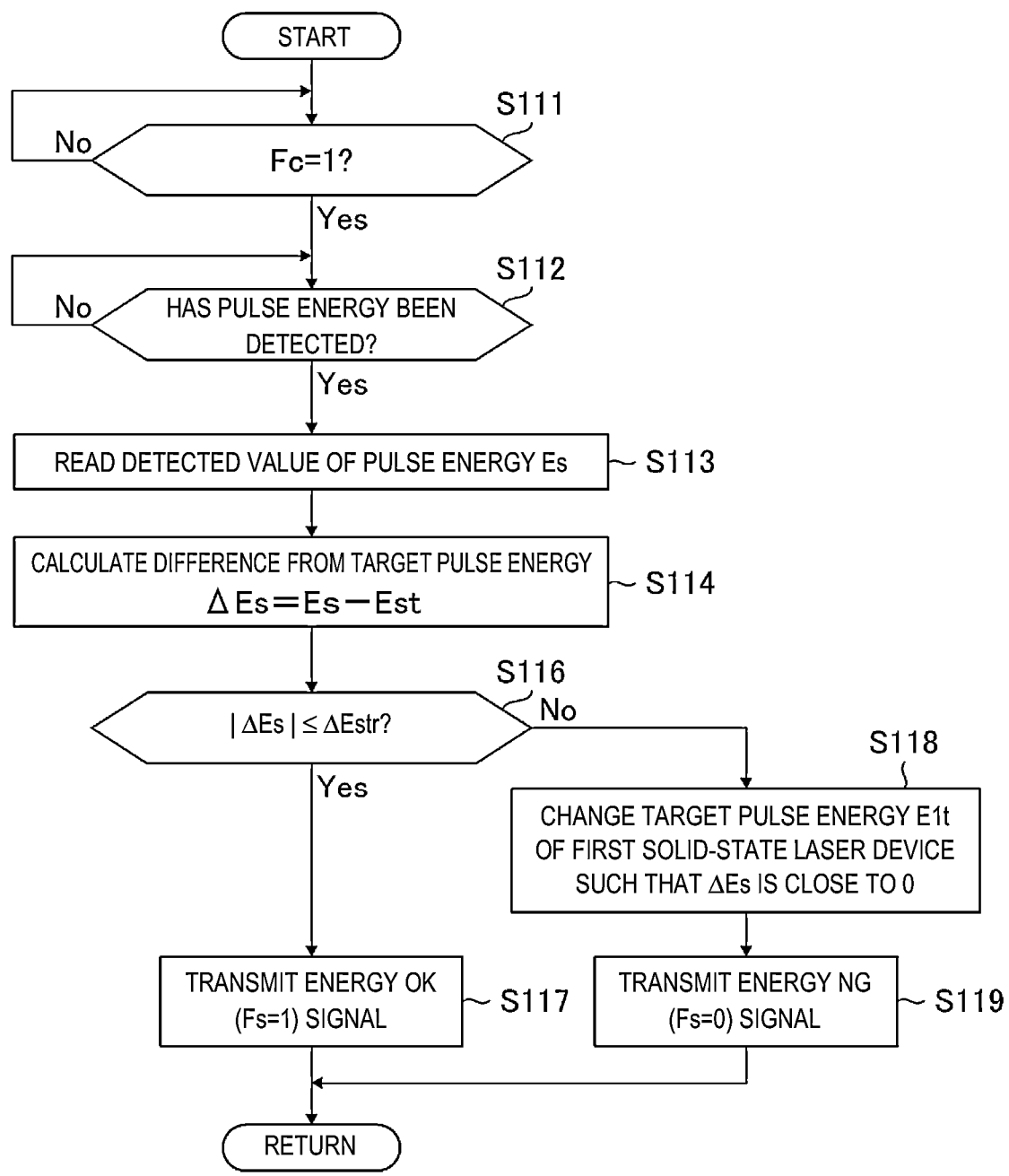
FIG. 30 is a flowchart of an example of an energy control subroutine (2) of the solid-state laser system.

FIG. 30 is a flowchart of an example of the energy control subroutine (2) of the solid-state laser system 10. The flowchart in FIG. 30 is applied to step S65A in FIG. 27. The flowchart in FIG. 30 is applied in place of the flowchart in FIG. 11. Differences from FIG. 11 will be described.

The flowchart in FIG. 30 includes step S111 before step S112.

In step S111, the solid-state laser system control unit 350 determines whether or not the OK signal of the wavelength conversion system 300, that is, the flag signal of Fc being 1 has been received from the wavelength conversion system control unit 380. When the determination result in step S111 is No, the solid-state laser system control unit 350 repeats step S111.

When the determination result in step S111 is Yes, the solid-state laser system control unit 350 goes to step S112. The processes in step S112 and thereafter are the same as in the flowchart in FIG. 11. In other words, the processes of energy control in step S112 and thereafter are performed after the wavelength conversion system 300 reaches the OK state.

After step S117 or S119, the solid-state laser system control unit 350 finishes the flowchart in FIG. 30 and returns to the flowchart in FIG. 27.

In the example in FIG. 30, the solid-state laser system control unit 350 changes only target pulse energy E1t of the first solid-state laser device 100 such that a difference ΔEs between pulse energy Es and target pulse energy is close to 0, but not limited to this example. For example, the solid-state laser system control unit 350 may change only target pulse energy E2t of the second solid-state laser device 200, or may change both E1t and E2t.

3.4.2 Example 1 of Processing of Wavelength Conversion System Control Unit

Figure 31:
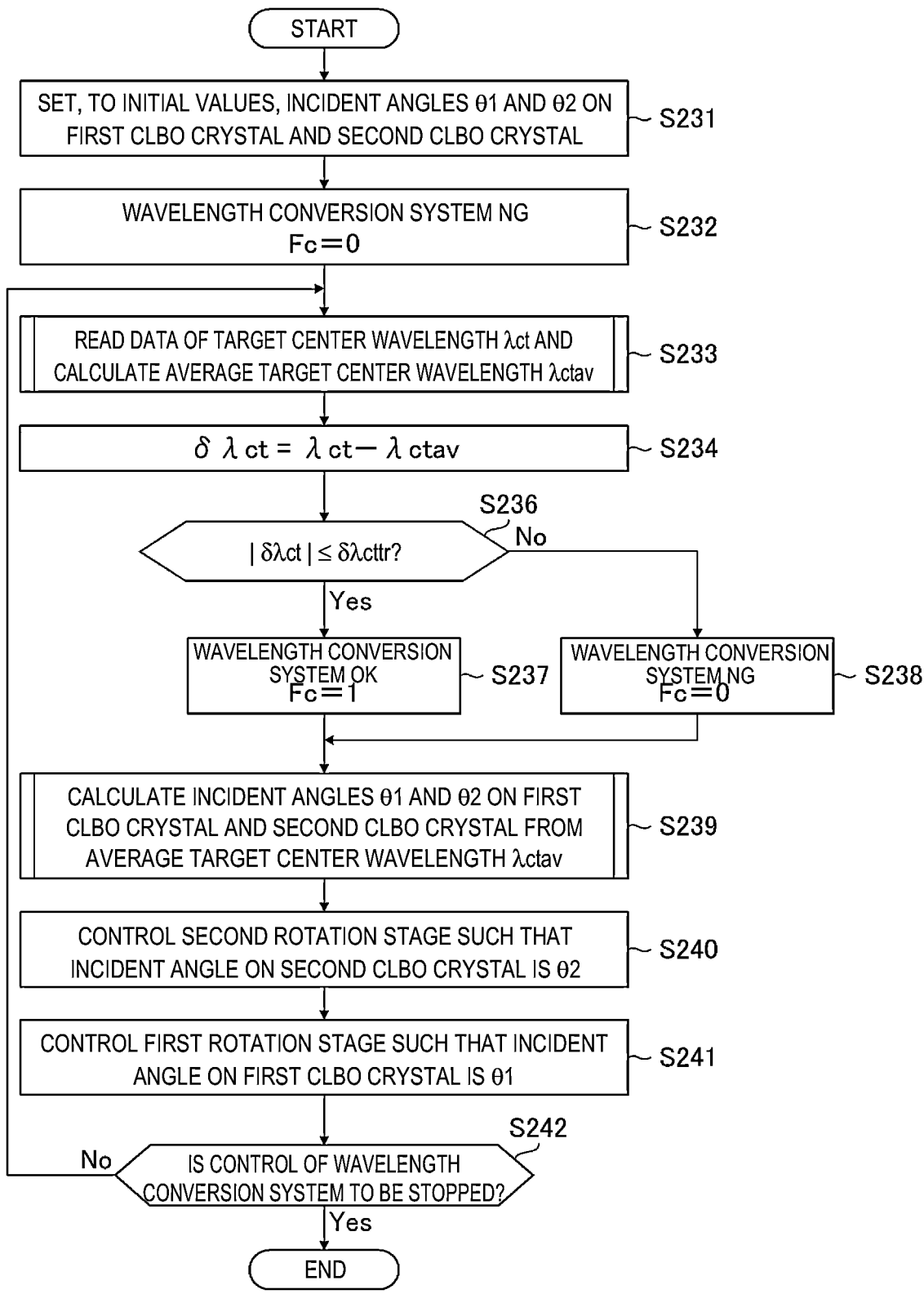
FIG. 31 is a flowchart of an example of processing of a wavelength conversion system control unit.

FIG. 31 is a flowchart of an example of processing of the wavelength conversion system control unit 380. The processing and the operation in the flowchart in FIG. 31 are realized by, for example, a processor that functions as the wavelength conversion system control unit 380 executing a program.

In step S231, the wavelength conversion system control unit 380 sets, to initial values, the incident angles θ1 and θ2 on the first CLBO crystal 316 and the second CLBO crystal 320. Specifically, the wavelength conversion system control unit 380 controls the first rotation stage 361 such that the incident angle θ1 on the first CLBO crystal 316 is the initial value θ10, and controls the second rotation stage 362 such that the incident angle θ2 of the second CLBO crystal 320 is the initial value θ20.

In step S232, the wavelength conversion system control unit 380 transmits, to the solid-state laser system control unit 350, a flag signal of Fc being 0 indicating that the wavelength conversion system 300 is in an NG state.

Then, in step S233, the wavelength conversion system control unit 380 reads data of a target center wavelength λct and calculates an average target center wavelength λctav.

Figure 32:
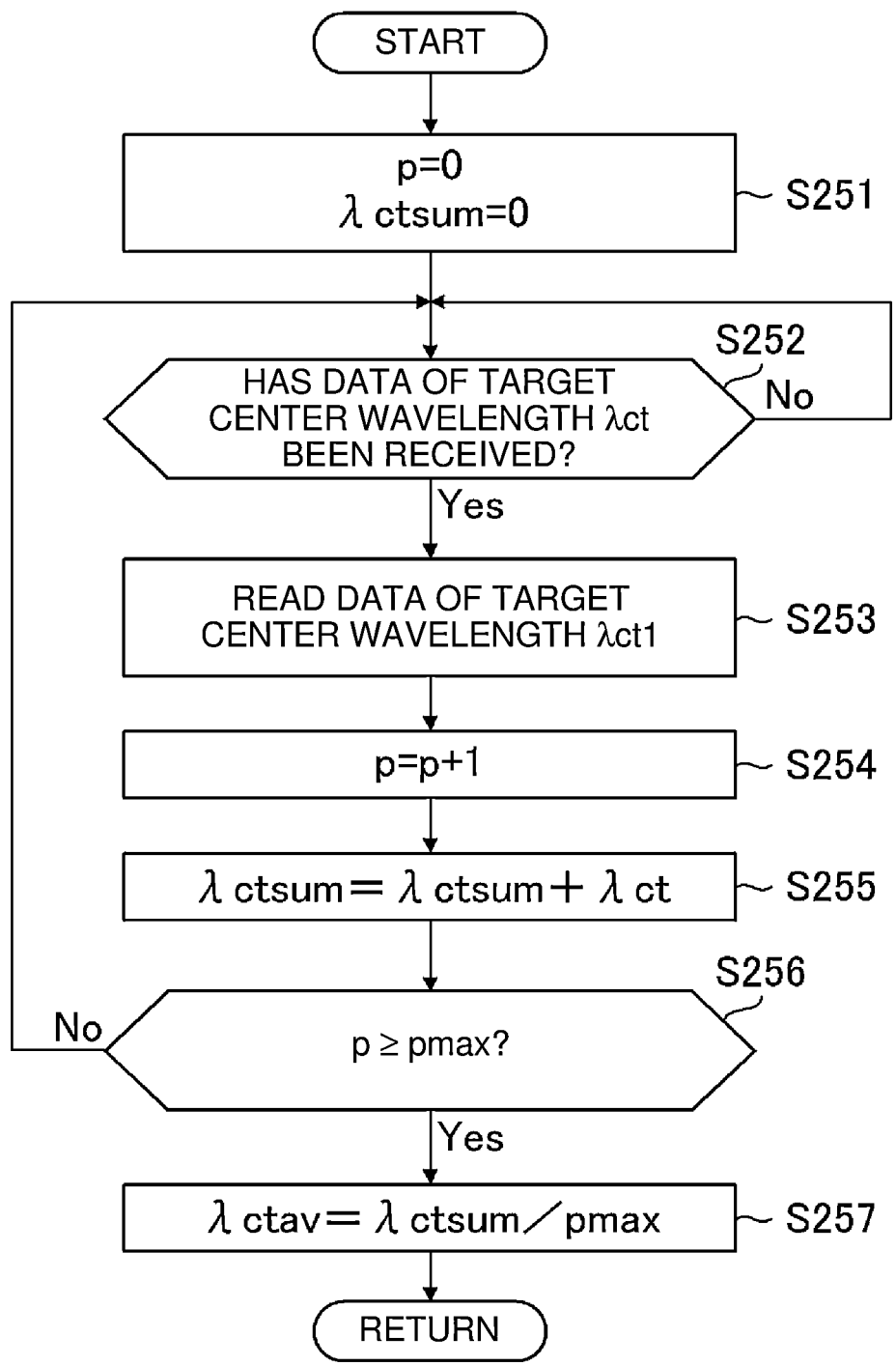
FIG. 32 is a flowchart of Example 1 of a subroutine applied to step S233 in FIG. 31.

FIG. 32 is a flowchart of Example 1 of a subroutine applied to step S233 in FIG. 31. The flowchart in FIG. 32 shows an example of calculating a section average value of the target center wavelength λct as an average target center wavelength λctav.

Figure 33:
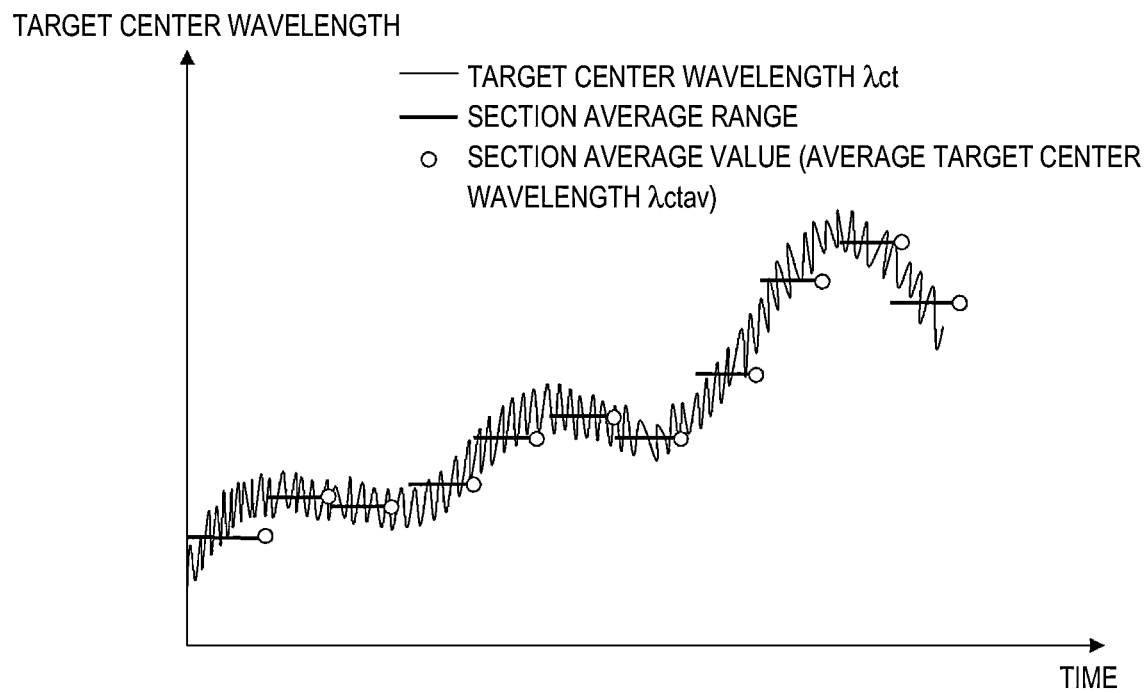
FIG. 33 is a graph showing an example of a change over time in data of a target center wavelength $\lambda ct$ instructed by an exposure control unit, with a section average value of the target center wavelength $\lambda ct$ being an average target center wavelength $\lambda ctav$.

FIG. 33 is a graph showing an example of a change over time in data of the target center wavelength λct chronologically instructed by an exposure control unit 22, with the section average value of the target center wavelength λct being the average target center wavelength λctav. FIG. 33 shows each range of calculation of a section average (section average range) and a section average value calculated from each range. Data of the target center wavelength λct instructed by the exposure control unit 22 may be received at a cycle faster than a speed of response of the first rotation stage 361 and the second rotation stage 362 to drive control signals.

In step S251 in FIG. 32, the wavelength conversion system control unit 380 resets, to "0", a sample count value p indicating the number of samples, and resets, to "0", a target center wavelength integrated value λctsum indicating an integrated value of instruction values of the target center wavelength λct.

Then, in step S252, the wavelength conversion system control unit 380 determines whether or not data of the target center wavelength λct has been received. When the determination result in step S252 is No, the wavelength conversion system control unit 380 repeats step S252. When the determination result in step S252 is Yes, the wavelength conversion system control unit 380 goes to step S253, and reads the data of the target center wavelength λct.

Then, in step S254, the wavelength conversion system control unit 380 increments the sample count value p.

Then, in step S255, the wavelength conversion system control unit 380 updates the target center wavelength integrated value λctsum such that a value of a newest target center wavelength λct added to the target center wavelength integrated value λctsum is a new target center wavelength integrated value λctsum.

In step S256, the wavelength conversion system control unit 380 determines whether or not the sample count value p is equal to or larger than a predetermined sample number pmax. The predetermined sample number pmax is the number of samples within a range used for calculating the average value.

When the determination result in step S256 is No, the wavelength conversion system control unit 380 returns to step S252, and repeats the processes in steps S252 to S256. When the determination result in step S256 is Yes, the wavelength conversion system control unit 380 goes to step S257.

In step S257, the wavelength conversion system control unit 380 calculates an average target center wavelength λctav by dividing the target center wavelength integrated value λctsum by pmax.

$$\lambda ctav = \lambda ctsum/pmax \qquad (9)$$

In other words, the average target center wavelength λctav is an average value of target center wavelengths λct of the predetermined sample number pmax.

After step S257, the wavelength conversion system control unit 380 finishes the flowchart in FIG. 32 and returns to the flowchart in FIG. 31.

Figure 34:
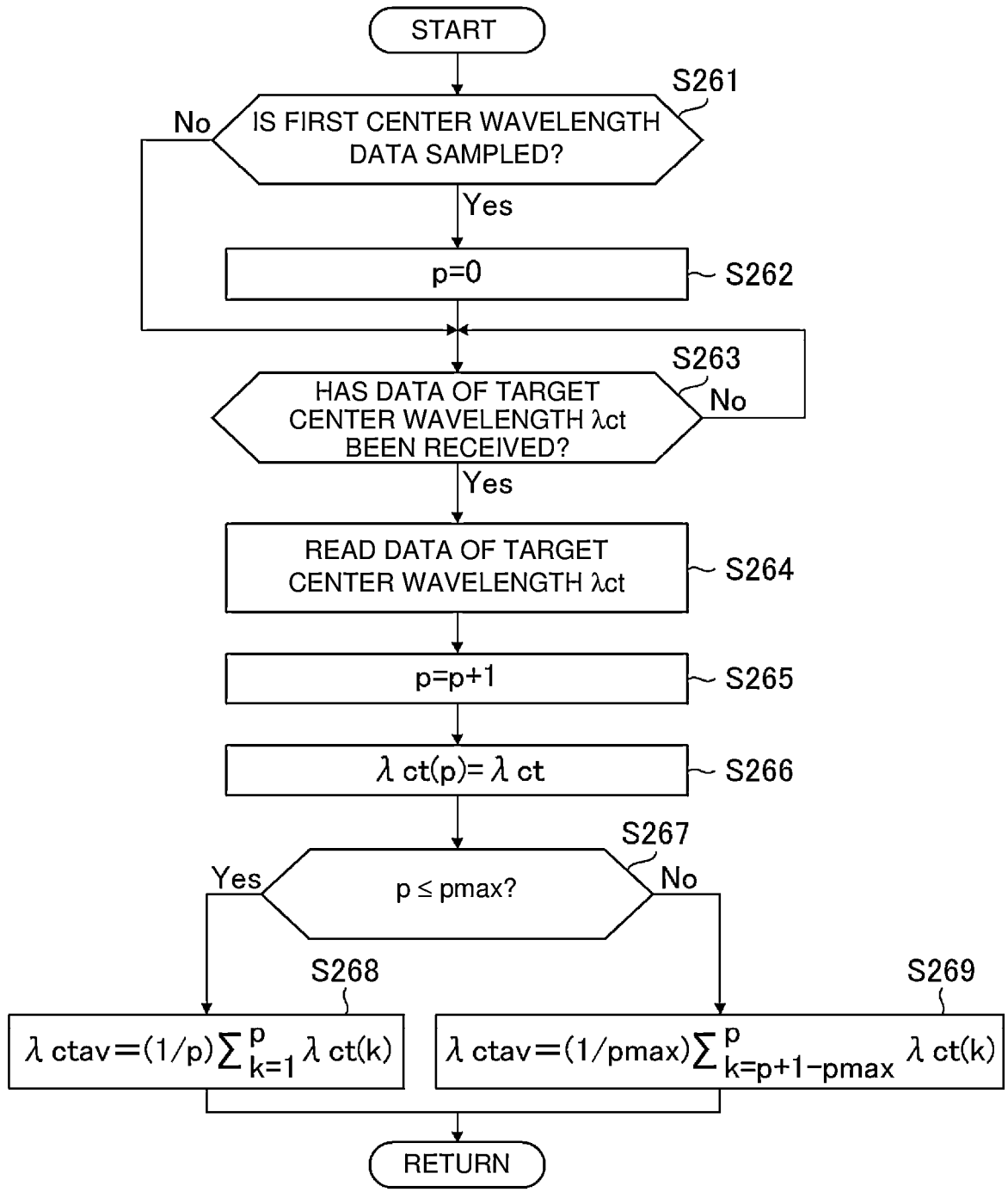
FIG. 34 is a flowchart of Example 2 of a subroutine applied to step S233 in FIG. 31.

FIG. 34 is a flowchart of Example 2 of a subroutine applied to step S233 in FIG. 31. The flowchart in FIG. 34 shows an example of calculating a moving average value of the target center wavelength λct as an average target center wavelength λctav.

Figure 35:
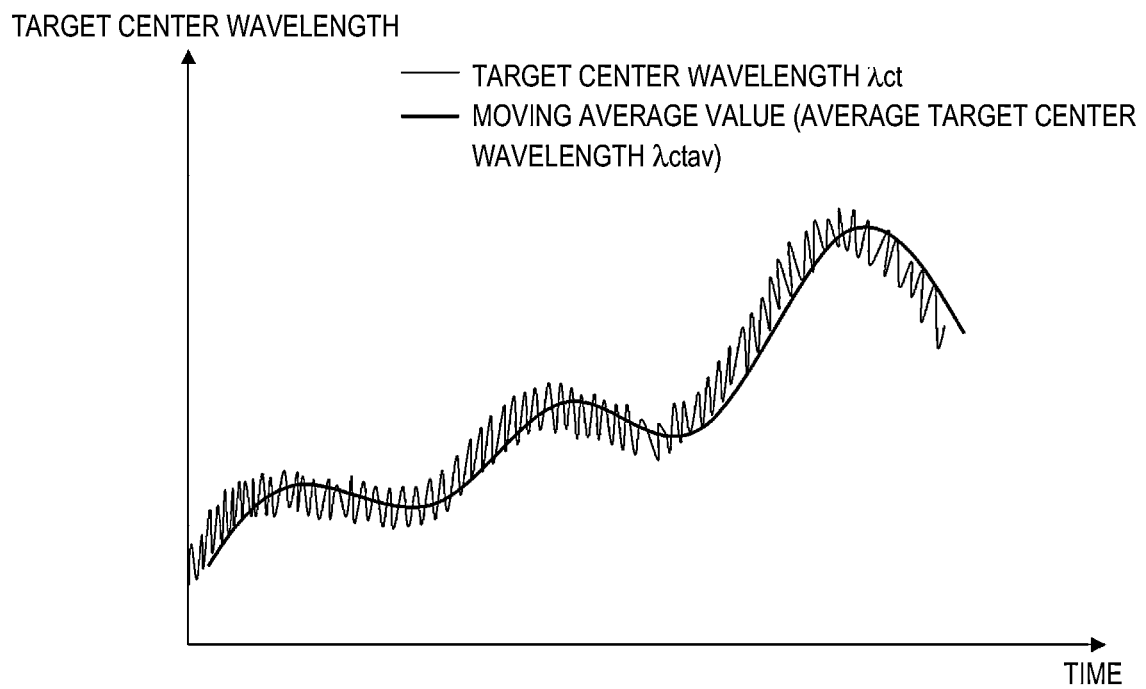
FIG. 35 is a graph showing an example of a change over time in data of a target center wavelength $\lambda ct$ instructed by the exposure control unit, with a moving average value of the target center wavelength $\lambda ct$ being an average target center wavelength $\lambda ctav$.

FIG. 35 is a graph showing an example of a change over time in data of the target center wavelength λct chronologically instructed by the exposure control unit 22, with the moving average value of the target center wavelength λct being the average target center wavelength λctav.

In step S261 in FIG. 34, the wavelength conversion system control unit 380 determines whether or not the first center wavelength data is sampled. When the determination result in step S261 is Yes, the wavelength conversion system control unit 380 goes to step S262, and sets an initial value of the sample count value p to "0". After step S262, the wavelength conversion system control unit 380 goes to step S263. When the determination result in step S261 is No, the wavelength conversion system control unit 380 skips step S262 and goes to step S263.

In step S263, the wavelength conversion system control unit 380 determines whether or not data of the target center wavelength λct has been received. When the determination result in step S263 is No, the wavelength conversion system control unit 380 repeats step S263. When the determination result in step S263 is Yes, the wavelength conversion system control unit 380 goes to step S264, and reads the data of the target center wavelength λct.

Then, in step S265, the wavelength conversion system control unit 380 increments the sample count value p. Then, in step S266, the wavelength conversion system control unit 380 stores the value of the target center wavelength λct in association with the sample count value p.

$$\lambda ct(p) = \lambda ct$$

In step S267, the wavelength conversion system control unit 380 determines whether or not the sample count value p is equal to or smaller than the predetermined sample number pmax. The predetermined sample number pmax is the number of samples used for calculating the moving average value.

When the determination result in step S267 is Yes, the wavelength conversion system control unit 380 goes to step S268, and calculates an average target center wavelength λctav according to the following expression.

[Expression 10]

$$\lambda ctav = (1/p) \sum\nolimits_{k=1}^{p} \lambda ct(k) \qquad (10)$$

Expression (10) is a calculation expression applied when p is equal to or smaller than the predetermined sample number pmax.

When the determination result in step S267 is No, the wavelength conversion system control unit 380 goes to step S269, and calculates an average target center wavelength λctav according to the following expression.

[Expression 11]

$$\lambda ctav = (1/pmax) \sum\nolimits_{k=p+1-pmax}^{p} \lambda ct(k) \qquad (11)$$

Expression (11) is a formula for calculating a moving average value applied when p is larger than the predetermined sample number pmax.

After step S268 or S269, the wavelength conversion system control unit 380 finishes the flowchart in FIG. 34 and returns to the flowchart in FIG. 31.

Then, in step S234 in FIG. 31, the wavelength conversion system control unit 380 calculates a difference δλct between the target center wavelength λct and the average target center wavelength λctav.

In step S236, the wavelength conversion system control unit 380 determines whether or not an absolute value of δλct is equal to or smaller than an allowable upper limit value δλcttr which indicates an allowable range. When the determination result in step S236 is Yes, the wavelength conversion system control unit 380 goes to step S237, and transmits, to the solid-state laser system control unit 350, a flag signal of Fc being 1 indicating that the wavelength conversion system 300 is in an OK state.

When the determination result in step S236 is No, the wavelength conversion system control unit 380 goes to step S238, and transmits, to the solid-state laser system control unit 350, a flag signal of Fc being 0 indicating that the wavelength conversion system 300 is in an NG state.

After step S237 or S238, the wavelength conversion system control unit 380 goes to step S239.

In step S239, the wavelength conversion system control unit 380 calculates the incident angles θ1 and θ2 on the first CLBO crystal 316 and the second CLBO crystal 320 from the average target center wavelength λctav.

Then, in step S240, the wavelength conversion system control unit 380 controls the second rotation stage 362 such that the incident angle on the second CLBO crystal 320 is θ2 in accordance with the calculation result in step S239.

Then, in step S241, the wavelength conversion system control unit 380 controls the first rotation stage 361 such that the incident angle on the first CLBO crystal 316 is θ1 in accordance with the calculation result in step S239.

Then, in step S242, the wavelength conversion system control unit 380 determines whether or not to stop control of the wavelength conversion system 300. When the determination result in step S242 is No, the wavelength conversion system control unit 380 returns to step S233, and repeats the processes in steps S233 to S242.

When the determination result in step S242 is Yes, the wavelength conversion system control unit 380 finishes the flowchart in FIG. 31.

Figure 36:
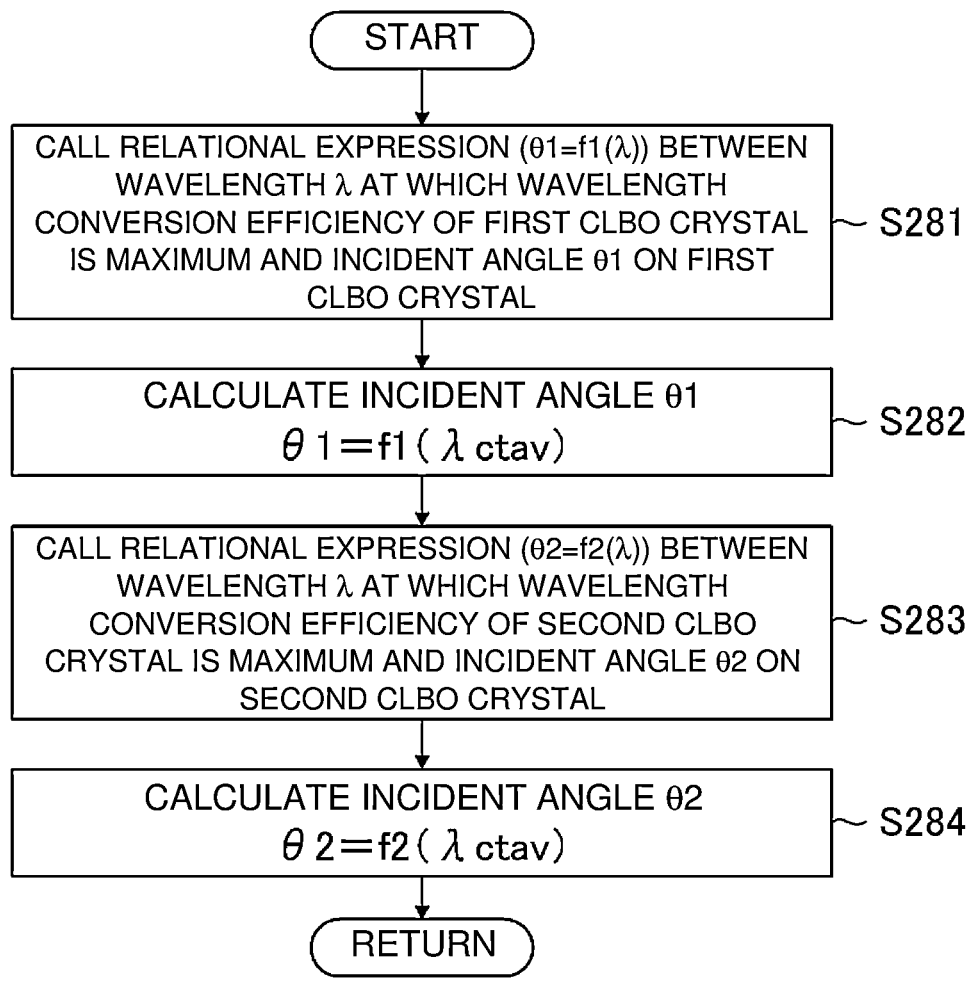
FIG. 36 is a flowchart of an example of a subroutine applied to step S239 in FIG. 31.

FIG. 36 is a flowchart of an example of a subroutine applied to step S239 in FIG. 31.

In step S281 in FIG. 36, the wavelength conversion system control unit 380 calls, from a memory or the like, a relational expression (θ1=f1(λ)) between the wavelength λ at which the wavelength conversion efficiency of the first CLBO crystal 316 is maximum and the incident angle θ1 on the first CLBO crystal 316. The incident angle at which the wavelength conversion efficiency is maximum (maximal value) is sometimes referred to as "optimum incident angle". The wavelength λ in this case is the wavelength of the third pulse laser beam LP3 wavelength-converted by the wavelength conversion system 300.

Figure 37:
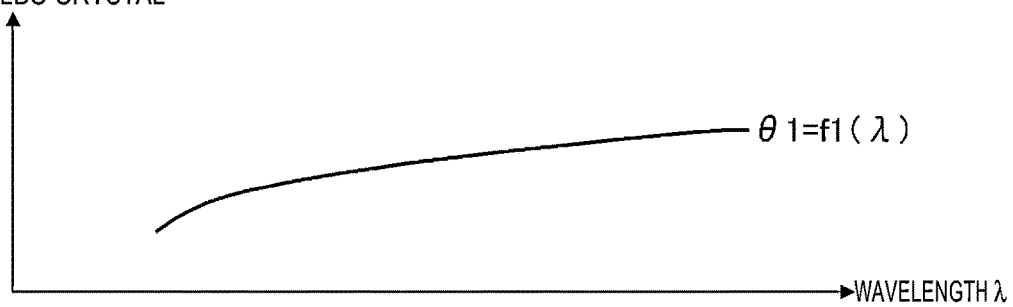
FIG. 37 is a graph showing an example of a relationship between an optimum incident angle on a first CLBO crystal and a wavelength.

FIG. 37 is a graph showing an example of a relationship between an optimum incident angle on the first CLBO crystal 316 and a wavelength. The wavelength conversion system control unit 380 calls the relational expression (θ1=f1(λ)) as shown in FIG. 37. Then, in step S282 in FIG. 36, the wavelength conversion system control unit 380 uses the relational expression (θ1=f1(λ)) to calculate the incident angle θ1 with respect to the average target center wavelength λctav.

Also for the second CLBO crystal 320, in step S283, the wavelength conversion system control unit 380 calls, from the memory or the like, a relational expression (θ2=f2(λ)) between the wavelength λ at which the wavelength conversion efficiency of the second CLBO crystal 320 is maximum and the incident angle θ2 on the second CLBO crystal 320.

Figure 38:
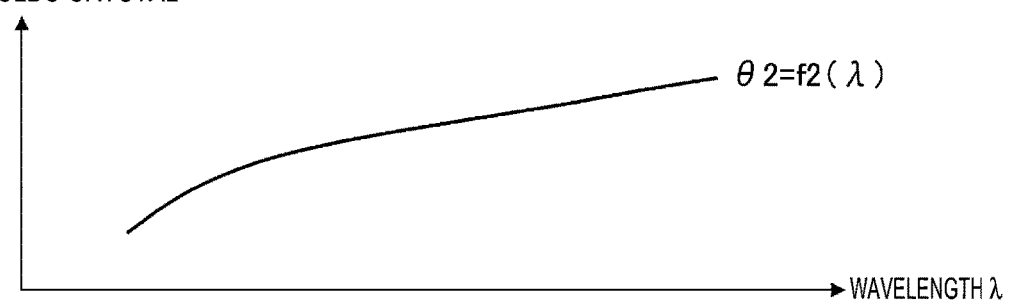
FIG. 38 is a graph showing an example of a relationship between an optimum incident angle on a second CLBO crystal and a wavelength.

FIG. 38 is a graph showing an example of a relationship between an optimum incident angle on the second CLBO crystal 320 and a wavelength. The wavelength conversion system control unit 380 calls the relational expression (θ2=f2(λ)) as shown in FIG. 38.

Then, in step S284 in FIG. 36, the wavelength conversion system control unit 380 uses the relational expression (θ2=f2(λ)) to calculate the incident angle θ2 with respect to the average target center wavelength λctav.

After step S284, the wavelength conversion system control unit 380 finishes the flowchart in FIG. 36 and returns to the flowchart in FIG. 31.

3.5 Effect

According to Embodiment 1, the average target center wavelength λctav is calculated from the target center wavelength λct instructed by the exposure control unit 22, and the incident angle on the nonlinear crystal in the wavelength conversion system 300 is controlled in accordance with the average target center wavelength λctav. This allows stable drive control of the first rotation stage 361 and the second rotation stage 362. This can achieve wavelength control corresponding to the target center wavelength λct instructed by the exposure apparatus 20, and also achieve stability of pulse energy.

The first CLBO crystal 316 in Embodiment 1 is an example of "first nonlinear crystal" in the present disclosure. The fourth pulse laser beam LP4 generated by the first CLBO crystal 316 is an example of "first sum frequency light" in the present disclosure. The incident angle θ1 on the first CLBO crystal 316 is an example of "first incident angle" in the present disclosure. The second CLBO crystal 320 is an example of "second nonlinear crystal" in the present disclosure. The incident angle θ2 on the second CLBO crystal 320 is an example of "second incident angle" in the present disclosure. The combination of the laser control unit 18, the solid-state laser system control unit 350, and the wavelength conversion system control unit 380 is an example of "control unit" in the present disclosure. The exposure apparatus 20 including the exposure control unit 22 is an example of "external device" in the present disclosure.

4. Embodiment 2

4.1 Configuration

The laser system 1A according to Embodiment 2 may have the same configuration as in FIG. 24.

Figure 39:
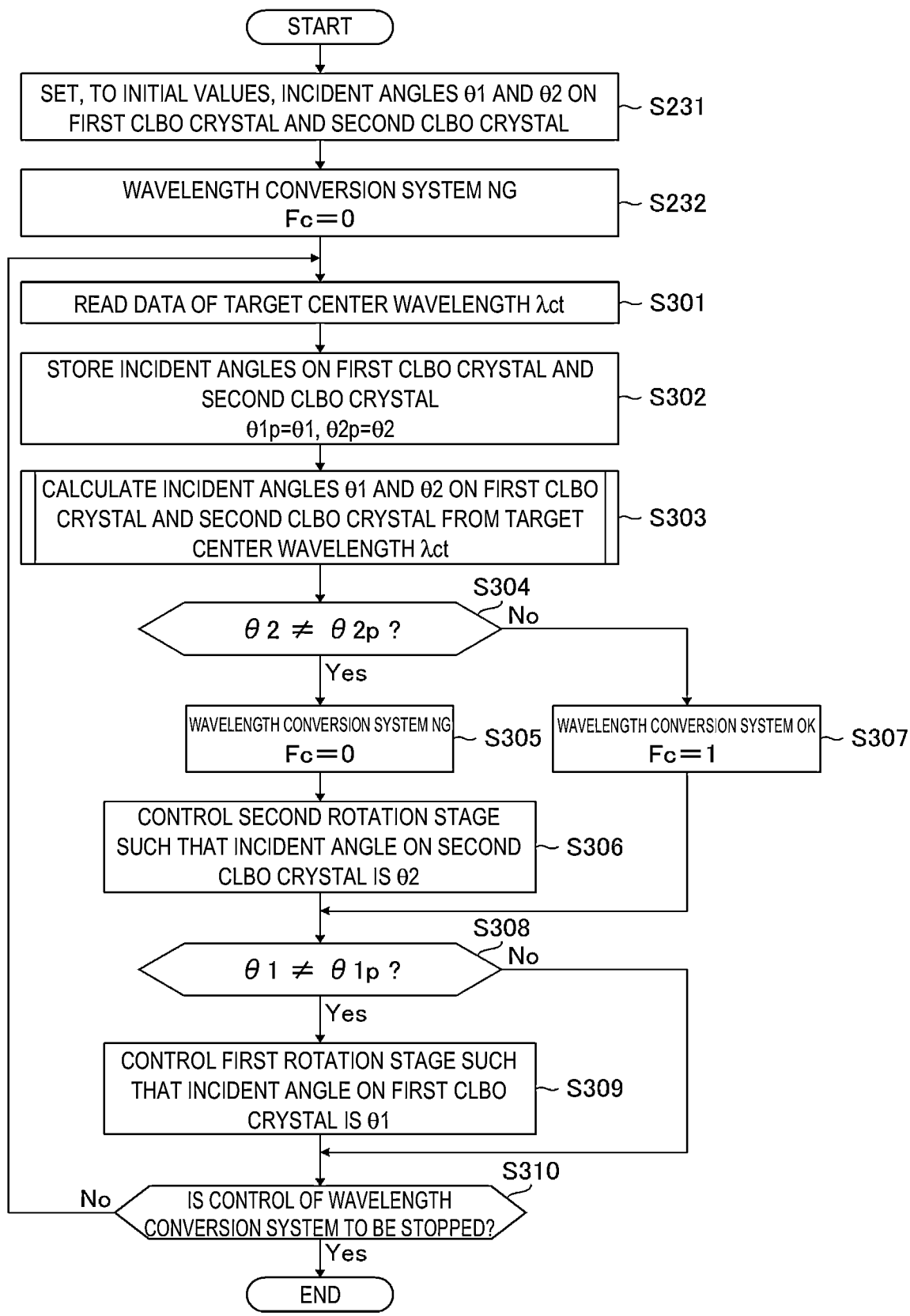
FIG. 39 is a flowchart of an example of processing of a wavelength conversion system control unit applied to Embodiment 2.

4.2 Operation 4.2.1 Example 2 of Processing of Wavelength Conversion System Control Unit FIG. 39 is a flowchart of an example of processing of the wavelength conversion system control unit 380 in Embodiment 2. In Embodiment 2, the flowchart in FIG. 39 is applied in place of the flowchart in FIG. 31. Steps S231 and S232 in FIG. 39 are the same as steps S231 and S232 in FIG. 31.

In FIG. 39, after step S232, the wavelength conversion system control unit 380 goes to step S301, and reads data of a target center wavelength λct. Then, in step S302, the wavelength conversion system control unit 380 stores current incident angles θ1p and θ2p on the first CLBO crystal 316 and the second CLBO crystal 320.

At the time of step S302, the incident angles on the first CLBO crystal 316 and the second CLBO crystal 320 are θ1 and θ2, and thus the wavelength conversion system control unit 380 stores θ1p being equal to θ1 and θ2p being equal to θ2.

Then, in step S303, the wavelength conversion system control unit 380 calculates, from the target center wavelength λct, optimum incident angles θ1 and θ2 on the first CLBO crystal 316 and second CLBO crystal 320 corresponding to the target center wavelength λct. A specific calculation method used in step S303 will be described later in detail.

In step S304, the wavelength conversion system control unit 380 determines whether or not the incident angle θ2 calculated in step S303 is different from the current incident angle θ2p.

When the determination result in step S304 is Yes, that is, when θ2 is not equal to θ2p, the wavelength conversion system control unit 380 goes to step S305, and transmits, to the solid-state laser system control unit 350, a flag signal of Fc being 0 indicating that the wavelength conversion system 300 is in an NG state. Then, in step S306, the wavelength conversion system control unit 380 controls the second rotation stage 362 such that the incident angle on the second CLBO crystal 320 is θ2 calculated in step S303. After step S306, the wavelength conversion system control unit 380 goes to step S308.

When the determination result in step S304 is No, that is, when θ2 is equal to θ2p, the wavelength conversion system control unit 380 goes to step S307, and transmits, to the solid-state laser system control unit 350, a flag signal of Fc being 1 indicating that the wavelength conversion system 300 is in an OK state. After step S307, the wavelength conversion system control unit 380 goes to step S308.

In step S308, the wavelength conversion system control unit 380 determines whether or not the incident angle θ1 calculated in step S303 is different from the current incident angle θ1p. When the determination result in step S308 is Yes, that is, when θ1 is not equal to θ1p, the wavelength conversion system control unit 380 goes to step S309.

In step S309, the wavelength conversion system control unit 380 controls the first rotation stage 361 such that the incident angle on the first CLBO crystal 316 is θ1 calculated in step S303. After step S309 or when the determination result in step S308 is No, the wavelength conversion system control unit 380 goes to step S310.

In step S310, the wavelength conversion system control unit 380 determines whether or not to stop control of the wavelength conversion system 300. When the determination result in step S310 is No, the wavelength conversion system control unit 380 returns to step S301 and repeats the processes in steps S301 to S310. When the determination result in step S310 is Yes, the wavelength conversion system control unit 380 finishes the flowchart in FIG. 39.

Figure 40:
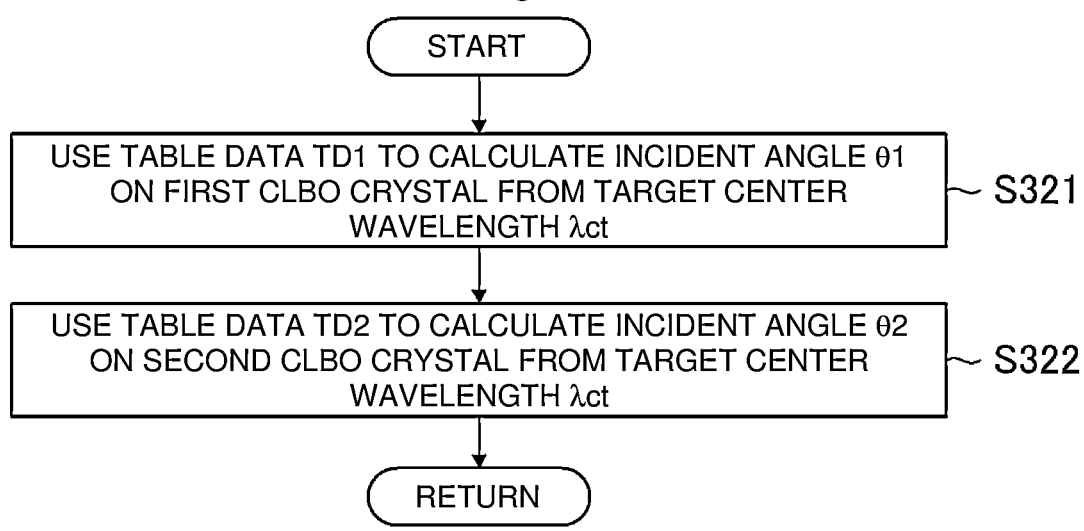
FIG. 40 is a flowchart of an example of processing for calculating, from the target center wavelength $\lambda ct$, incident angles $\theta 1$ and $\theta 2$ on the first CLBO crystal and the second CLBO crystal.

4.2.2 Example of Processing for Calculating, from Target Center Wavelength λCt, Incident Angle θ1 on First CLBO Crystal and Incident Angle θ2 on Second CLBO Crystal FIG. 40 is a flowchart of an example of processing for calculating, from the target center wavelength λct, the incident angles θ1 and θ2 on the first CLBO crystal 316 and the second CLBO crystal 320. The flowchart in FIG. 40 is applied to step S303 in FIG. 39.

In step S321 in FIG. 40, the wavelength conversion system control unit 380 uses table data TD1 to calculate, from the target center wavelength λct, the incident angle θ1 on the first CLBO crystal 316. In step S322, the wavelength conversion system control unit 380 uses table data TD2 to calculate, from the target center wavelength λct, the incident angle θ2 on the second CLBO crystal 320. The order of steps S321 and S322 is interchangeable.

The table data TD1 defines a proper incident angle θ1 on the first CLBO crystal 316 for each wavelength range of the target center wavelength λct. The table data TD2 defines a proper incident angle θ2 on the second CLBO crystal 320 for each wavelength range of the target center wavelength λct.

After steps S321 and S322, the wavelength conversion system control unit 380 finishes the flowchart in FIG. 40 and returns to the flowchart in FIG. 39.

Now, specific examples of the table data TD1 and the table data TD2 will be described.

Figure 41:
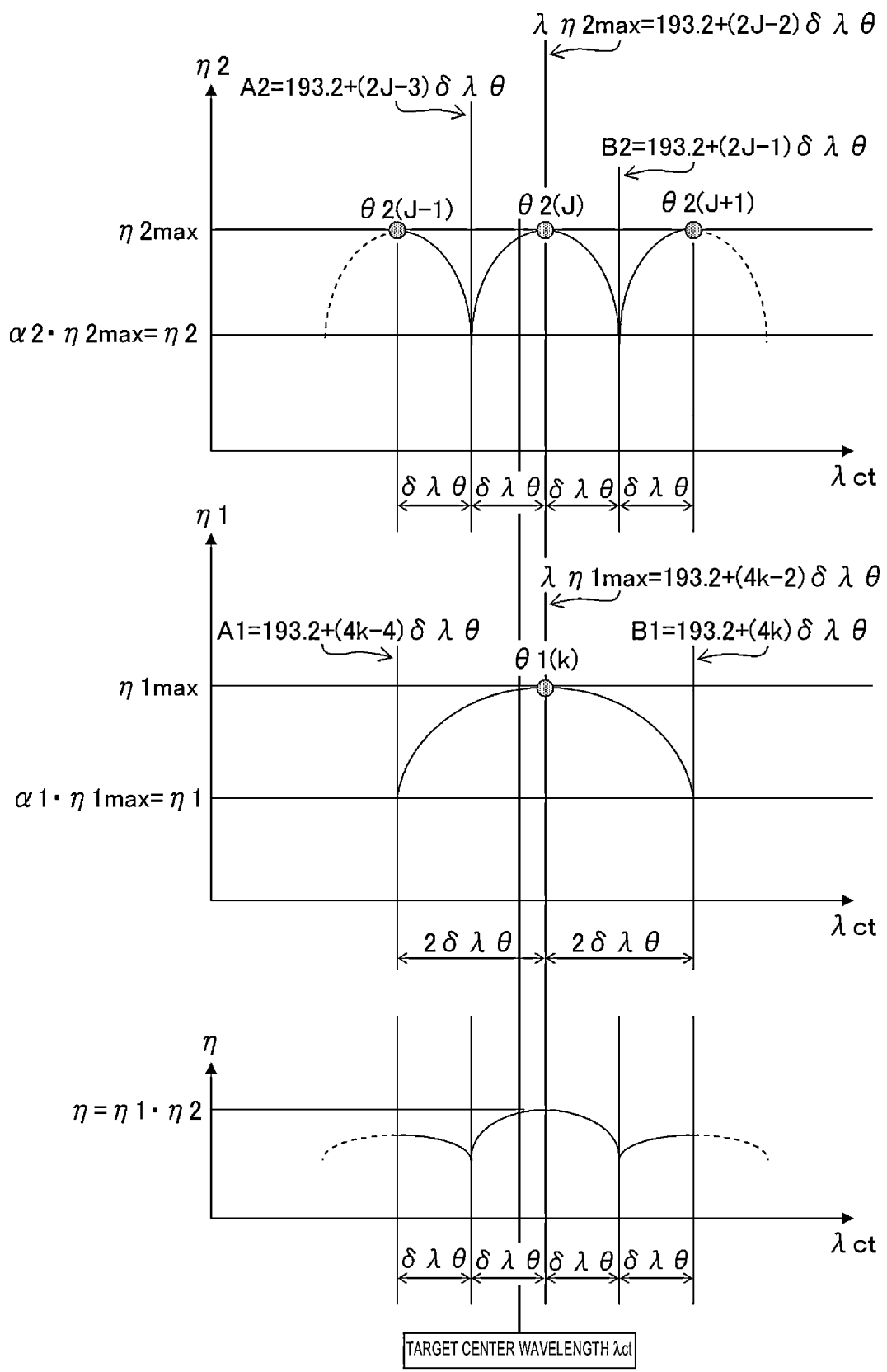
FIG. 41 shows graphs showing dependence of wavelength conversion efficiency $\eta$ of the wavelength conversion system, wavelength conversion efficiency $\eta 1$ of the first CLBO crystal, and wavelength conversion efficiency $\eta 2$ of the second CLBO crystal on the target center wavelength $\lambda ct$.

FIG. 41 shows graphs showing dependence of wavelength conversion efficiency η of the wavelength conversion system 300, wavelength conversion efficiency η1 of the first CLBO crystal 316, and wavelength conversion efficiency η2 of the second CLBO crystal 320 on the target center wavelength λct. The bottom graph in FIG. 41 shows the wavelength dependence of the wavelength conversion efficiency η of the wavelength conversion system 300, the middle graph in FIG. 41 shows the wavelength dependence of the wavelength conversion efficiency η1 of the first CLBO crystal 316, and the top graph in FIG. 41 shows the wavelength dependence of the wavelength conversion efficiency η2 of the second CLBO crystal 320.

FIG. 41 shows the graphs of a case where the incident angle on the first CLBO crystal 316 is fixed at θ1(k) and the incident angle on the second CLBO crystal 320 is fixed at θ2(J) such that the wavelength conversion efficiency η of the wavelength conversion system 300 has a maximal value. Here, an example will be described in which the maximal value is equal to a maximum value.

In the top graph in FIG. 41, when a minimum wavelength and a maximum wavelength in a wavelength range defined by a value of α2·η2max that is the product of coefficient α2 and a maximum value η2max of the wavelength conversion efficiency η2 of the second CLBO crystal 320 are A2 and B2, respectively, and a wavelength for maximum efficiency of the second CLBO crystal 320 at the incident angle θ2(J) is λη2max, the following expressions are obtained.

$$A2 = 193.2 + (2J-3)\delta\lambda\theta \tag{12}$$

$$\lambda\eta2max = 193.2 + (2J-2)\delta\lambda\theta \tag{13}$$

$$B2 = 193.2 + (2J-1)\delta\lambda\theta \tag{14}$$

where α2 is preferably equal to or larger than 0.8, and for example, α2 may be a fixed value such as 0.8 or 0.9. The coefficient α2 defines a lower limit value of wavelength conversion efficiency allowed for the maximum value η2max of the wavelength conversion efficiency η2. The value α2·η2max expressed by the product of the coefficient α2 and the maximum value η2max is an example of "second allowable efficiency minimum value" in the present disclosure. The maximum value η2max of the wavelength conversion efficiency η2 is an example of "maximum conversion efficiency of second nonlinear crystal" in the present disclosure.

When the incident angle θ2 is fixed at θ2(J) and the wavelength after wavelength conversion is A2 or B2, the wavelength conversion efficiency η2 is α2·η2max. The wavelengths A2 and B2 are boundary wavelengths in a wavelength range at which the wavelength conversion efficiency η2 is equal to or higher than α2·η2max at the incident angle of θ2(J). A middle wavelength in the wavelength range with A2 and B2 being opposite boundaries is a wavelength λη2max at which the maximum wavelength conversion efficiency η2max is obtained. The value Re is a half of a width (B2−A2) of the wavelength range at which the wavelength conversion efficiency η2 is equal to or higher than α2·η2max.

Next, the middle graph in FIG. 41 will be described. A wavelength λ4 of a fourth pulse laser beam LP4 output from the first CLBO crystal 316 is expressed by Expression (15) below of a sum frequency wave in the first CLBO crystal 316.

$$1/\lambda ct = 1/\lambda 1 + 1/\lambda 4 \quad (15)$$

Expression (15) is modified with λ1 being λ1ct and λ4 being λ4ct to obtain Expression (16) below.

$$\lambda ct = \{1/\lambda 1ct + 1/\lambda 4ct\}^{-1} \quad (16)$$

The horizontal axis of the middle graph in FIG. 41 represents λct calculated by Expression (16).

Here, when a minimum wavelength and a maximum wavelength in a wavelength range defined by a value of α1·η1max that is the product of coefficient α1 and a maximum value η1max of the wavelength conversion efficiency η1 of the first CLBO crystal 316 are A1 and B1, respectively, and a wavelength for maximum efficiency of the first CLBO crystal 316 at the incident angle θ1(k) is λη1max, the following expressions are obtained.

$$A1 = 193.2 + (4k-4)\delta\lambda\theta \quad (17)$$

$$\lambda\eta 1 max = 193.2 + (4k-2)\delta\lambda\theta \quad (18)$$

$$B1 = 193.2 + (4k)\delta\lambda\theta \quad (19)$$

where α1 is preferably equal to or larger than 0.8, and for example, α1 may be a fixed value such as 0.8 or 0.9. The following description will be made with α1 being equal to α2.

Also, in this example, λη2max is equal to λη1max, and J is equal to 2 k. The coefficient α1 defines a lower limit value of wavelength conversion efficiency allowed for the maximum value η1max of the wavelength conversion efficiency η1. The value α1·η1max expressed by the product of the coefficient α1 and the maximum value η1max is an example of "first allowable efficiency minimum value" in the present disclosure. The maximum value η1max of the wavelength conversion efficiency η is an example of "maximum conversion efficiency of first nonlinear crystal" in the present disclosure.

When the incident angle θ1 is fixed at θ1(k) and the wavelength after wavelength conversion is A1 or B1, the wavelength conversion efficiency η1 is al. η1max. The wavelengths A1 and B1 are boundary wavelengths in a wavelength range at which the wavelength conversion efficiency η1 is equal to or higher than al. η1max at the incident angle of θ1(k). A middle wavelength in the wavelength range with A1 and B1 being opposite boundaries is a wavelength λη1max at which the maximum wavelength conversion efficiency η1max is obtained. The value 2·δλθ is a half of a width (B1−A1) of the wavelength range at which the wavelength conversion efficiency η1 is equal to or higher than al. η1max.

Since the wavelength conversion efficiency η of the entire wavelength conversion system 300 is the product of η1 and η2, the wavelength dependence in the bottom graph in FIG. 41 is obtained. Data (data indicating a relationship between the target center wavelength λct and the wavelength conversion efficiency η) in the bottom graph in FIG. 41 may be stored as table data TDZ (not shown) or stored as an approximate expression.

For example, when the target center wavelength λct shown by a thick solid line in FIG. 41 is instructed, the incident angles are controlled to θ1(k) and θ2(J) at which the wavelength conversion efficiencies η1 and η2 are maximal values in the wavelength range to which the target center wavelength λct belongs. In the table data TD1, data of the incident angle θ1 at which the wavelength conversion efficiency η1 has a maximal value is written for each wavelength range of the target center wavelength λct. In the table data TD2, data of the incident angle θ2 at which the wavelength conversion efficiency η2 has a maximal value is written for each wavelength range of the target center wavelength λct.

Figure 42:
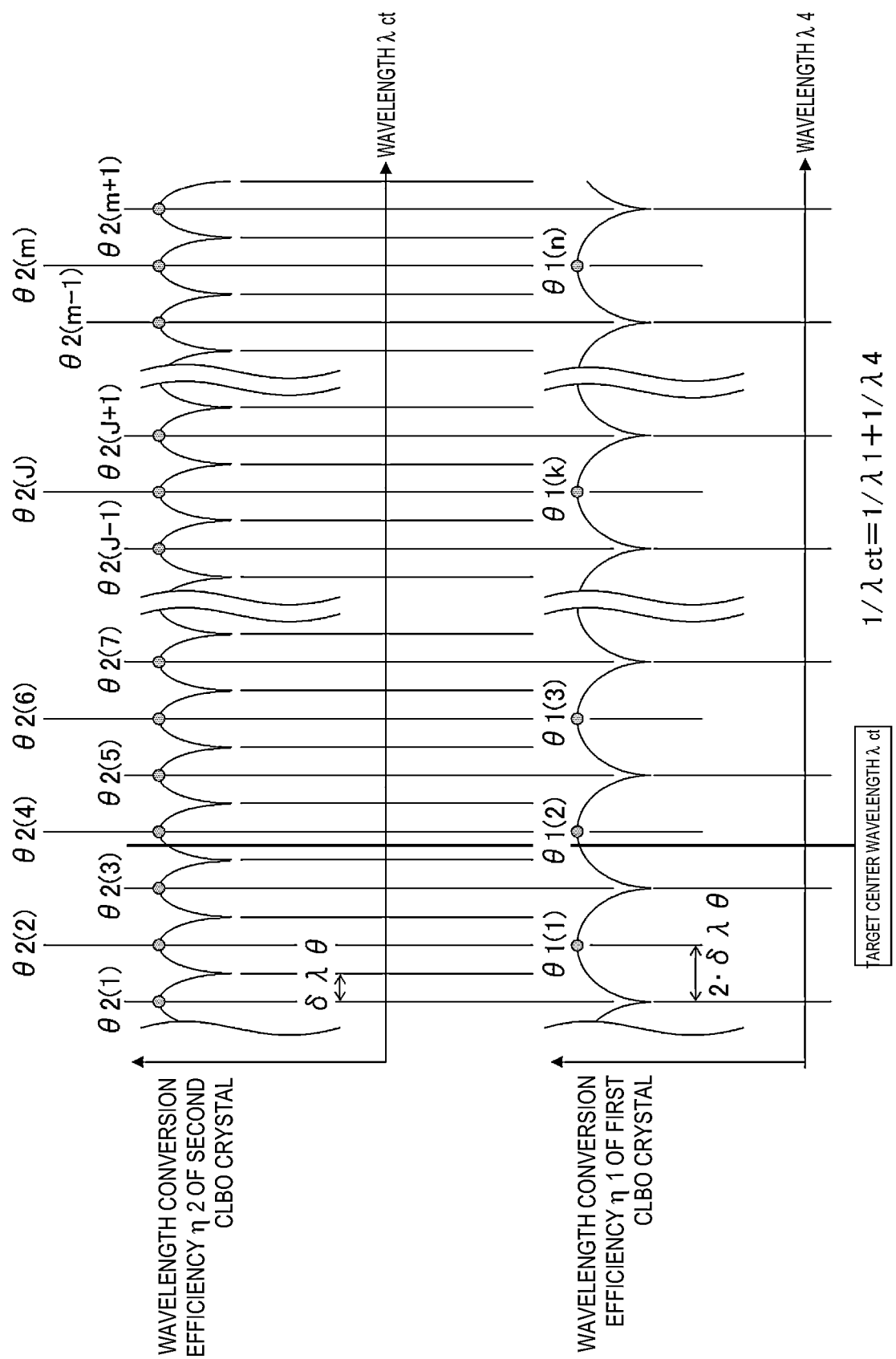
FIG. 42 shows graphs showing each wavelength range separated to include, as a boundary wavelength, a wavelength at which wavelength conversion efficiency is 80% of maximum conversion efficiency, and wavelength conversion efficiency.

FIG. 42 shows graphs showing each wavelength range separated to include, as a boundary wavelength, a wavelength at which wavelength conversion efficiency is 80% of maximum conversion efficiency, and wavelength conversion efficiency for each wavelength range. Specifically, FIG. 42 shows graphs representing each wavelength range and wavelength conversion efficiency when α1 is equal to α2 and is equal to 0.8. The bottom graph in FIG. 42 represents a relationship between the wavelength conversion efficiency η1 of the first CLBO crystal 316 and the wavelength λ4. The top graph in FIG. 42 represents a relationship between the wavelength conversion efficiency η2 of the second CLBO crystal 320 and the wavelength λct (target center wavelength). The wavelength λ4 and the wavelength λct have the relationship in Expression (15), and the wavelength λ4 can be converted into the wavelength λct. FIG. 42 shows a correspondence between the wavelength λ4 and the incident angles θ1(k) and θ2(J).

FIG. 43 is a table showing an example of the table data TD1. FIG. 44 is a table showing an example of the table data TD2. The table data TD1 in FIG. 43 and the table data TD2 in FIG. 44 are the table data for the example in FIG. 42. Each wavelength range (A1≤λct<B1) in the table data TD1 in FIG. 43 is an example of "first wavelength range" in the present disclosure. A center wavelength at which the wavelength conversion efficiency has a maximal value in each wavelength range is a middle wavelength in each wavelength range, and the incident angle θ1 on the first CLBO crystal 316 associated with each wavelength range in FIG. 43 is an incident angle at which the wavelength conversion efficiency has a maximal value. The incident angle θ1 defined for each wavelength range is an example of "specific first incident angle" in the present disclosure.

Also for the table data TD2 in FIG. 44, each wavelength range (A2≤λct<B2) of No. 2 and thereafter in the table data TD2 in FIG. 44 is an example of "second wavelength range" in the present disclosure. Except data of No. 1 in the table data TD2, a center wavelength at which the wavelength conversion efficiency has a maximal value in each wavelength range is a middle wavelength in each wavelength range, and the incident angle θ2 of the second CLBO crystal 320 associated with each wavelength range in FIG. 44 is an incident angle at which the wavelength conversion efficiency has a maximal value. The incident angle θ2 defined for each wavelength range is an example of "specific second incident angle" in the present disclosure.

For example, when the target center wavelength λct shown by a thick solid line in FIG. 42 is instructed, the incident angle θ1 on the first CLBO crystal 316 is calculated from the table data TD1 to be θ1(2), and the incident angle θ2 on the second CLBO crystal 320 is calculated from the table data TD2 to be θ2(4).

In FIGS. 41 to 44, a unit amount δλθ defining a width of a wavelength range may be, for example, 5 pm to 10 pm. The unit amount δλθ may be, for example, a predetermined fixed value such as 6 pm, 7 pm, 8 pm, or 10 pm.

When receiving data of the target center wavelength λct, the wavelength conversion system control unit 380 calculates incident angles θ1 and θ2 on the first CLBO crystal 316 and the second CLBO crystal 320 in accordance with the wavelength ranges in the table data TD1 and TD2.

In other words, the wavelength conversion system control unit 380 determines the incident angle θ1 on the first CLBO crystal 316 and the incident angle θ2 on the second CLBO crystal 320 such that the wavelength conversion efficiency has a maximal value at the middle wavelength in the wavelength range to which the target center wavelength λct belongs.

When the newly calculated incident angle(s) is(are) different from the current incident angle(s), the wavelength conversion system control unit 380 controls the first rotation stage 361 and/or the second rotation stage 362 as required such that the incident angle(s) on the first CLBO crystal 316 and/or second CLBO crystal 320 is(are) θ1 or θ2.

Further, the wavelength conversion system control unit 380 may call table data TDZ (not shown) to calculate wavelength conversion efficiency η from the target center wavelength λct, and transmit the value of η to the solid-state laser system control unit 350 and the laser control unit 18 and/or the solid-state laser system control unit 350.

4.3 Effect

According to Embodiment 2, the incident angles θ1 and θ2 are discretely controlled for each wavelength range defined in the table data TD1, TD2 for the target center wavelength λct. This allows stable drive control of the first rotation stage 361 and the second rotation stage 362. This can achieve wavelength control corresponding to the target center wavelength λct instructed by the exposure apparatus 20, and also achieve stability of pulse energy.

5. Embodiment 3

5.1 Configuration

The laser system 1A according to Embodiment 3 may have the same configuration as in FIG. 24.

5.2 Operation

The laser system 1A according to Embodiment 3 includes, in addition to the control in Embodiment 1 or 2, control to stabilize pulse energy of an excimer laser beam output from the excimer amplifier 14 against a change in pulse energy of a pulse laser beam wavelength-converted by the wavelength conversion system 300 due to a change in target center wavelength λct. To stabilize the pulse energy of the excimer laser beam, the laser control unit 18 and/or the solid-state laser system control unit 350 may perform Control 1 to Control 3 described below in accordance with wavelength conversion efficiency η of the wavelength conversion system 300.

[Control 1]

Pulse energy of the first pulse laser beam LP1 output from the first solid-state laser device 100 and pulse energy of the second pulse laser beam LP2 output from the second solid-state laser device 200 are controlled to be both constant, such that pulse energy of the pulse laser beam (third pulse laser beam LP3 output from the solid-state laser system 10) entering the excimer amplifier 14 is within a saturation region of an input/output characteristic of the excimer amplifier 14.

[Control 2]

Pulse energy of the first pulse laser beam LP1 output from the first solid-state laser device 100 and pulse energy of the second pulse laser beam LP2 output from the second solid-state laser device 200 are controlled to be both constant, and excitation intensity, that is, a charging voltage of the excimer amplifier 14 is controlled in accordance with the wavelength conversion efficiency η and the input/output characteristic of the excimer amplifier 14.

[Control 3]

Target pulse energy of at least one of the pulse energy of the first pulse laser beam LP1 and the pulse energy of the second pulse laser beam LP2 is controlled in accordance with the wavelength conversion efficiency 1 such that pulse energy Es of the third pulse laser beam LP3 output from the solid-state laser system 10 is a fixed value.

A detailed example of Control 1 above will be described as Embodiment 3. A detailed example of Control 2 will be described as Embodiment 4. Detailed examples of Control 3 will be described as Embodiments 5 and 6.

Figure 45:
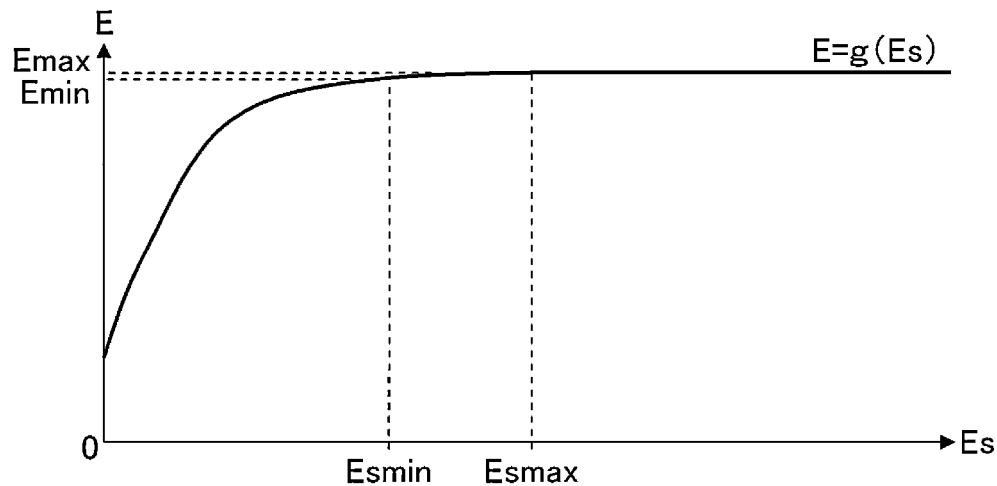
FIG. 45 is a graph showing an input/output characteristic of an excimer amplifier.

5.2.1 Example of Operation in Saturation Region with Respect to Injection Pulse Energy of Excimer Amplifier FIG. 45 is a graph showing the input/output characteristic of the excimer amplifier 14. The horizontal axis in FIG. 45 represents injection pulse energy to the excimer amplifier 14, that is, pulse energy Es of the third pulse laser beam LP3 output from the solid-state laser system 10. The vertical axis in FIG. 45 represents pulse energy E of the pulse laser beam (excimer laser beam) amplified by the excimer amplifier 14.

Pulse energy of the third pulse laser beam LP3 when the wavelength conversion efficiency of the wavelength conversion system 300 is maximum is Esmax. When the injection pulse energy to the excimer amplifier 14 is Esmax, the pulse energy of the pulse laser beam amplified by the excimer amplifier 14 is Emax. An allowable energy decrease rate allowed for Emax is Ear. When a minimum energy value allowed for the pulse energy E of the pulse laser beam output from the excimer amplifier 14 is Emin, the following expressions are obtained.

$$Ear = (E\max - E\min)/E\max \tag{20}$$

$$E\min = E\max(1 - Ear) \tag{21}$$

When a lower limit of a variation range in which the pulse energy Es of the third pulse laser beam LP3 output from the wavelength conversion system 300 changes due to the change in the target center wavelength λct is Esmin, and a rate of change in the pulse energy Es of the third pulse laser beam LP3 after wavelength conversion output from the wavelength conversion system 300 is Esr, an allowable range of the pulse energy Es of the third pulse laser beam LP3 can be calculated from a function of E being g(Es) of the input/output characteristic of the excimer amplifier 14 by the following expressions.

$$E\max = g(E s\max) \tag{22}$$

$$E\min = g(E s\min) \tag{23}$$

$$Esr = (E s\max - E s\min)/E s\max \tag{24}$$

$$Ear/Esr \leq 0.01 \tag{25}$$

As expressed by Expression (25), satisfying a condition that a ratio (Ear/Esr) between the rate of change Ear in the pulse energy of the excimer-amplified pulse laser beam and the rate of change Esr in the pulse energy of the third pulse laser beam LP3 is 0.01 or lower can stabilize the pulse energy of the pulse laser beam output from the excimer amplifier 14.

Expressions (22) and (23) can be expressed as Expressions (26) and (27) with an inverse function of Es being $g^{-1}(E)$ of the function of E being g(Es).

$$E s\max = g^{-1}(E\max) \tag{26}$$

$$E s\min = g^{-1}(E\min) \tag{27}$$

In Embodiment 3, target pulse energy E1t of the first pulse laser beam LP1 output from the first solid-state laser device 100 and target pulse energy E2t of the second pulse laser beam LP2 output from the second solid-state laser device 200 are set at fixed values E10 and E20, respectively. Then, operation is performed in a region in which the pulse energy E of the pulse laser beam amplified with respect to the injection pulse energy to the excimer amplifier 14 is saturated. As in this example, to facilitate saturation of the input/output characteristic, the excimer amplifier 14 is preferably an excimer amplifier including a ring resonator (see FIG. 66) or an excimer amplifier including three or more amplification optical paths (see FIG. 67) described later.

5.2.2 Example 2 of Processing of Laser Control Unit

Figure 46:
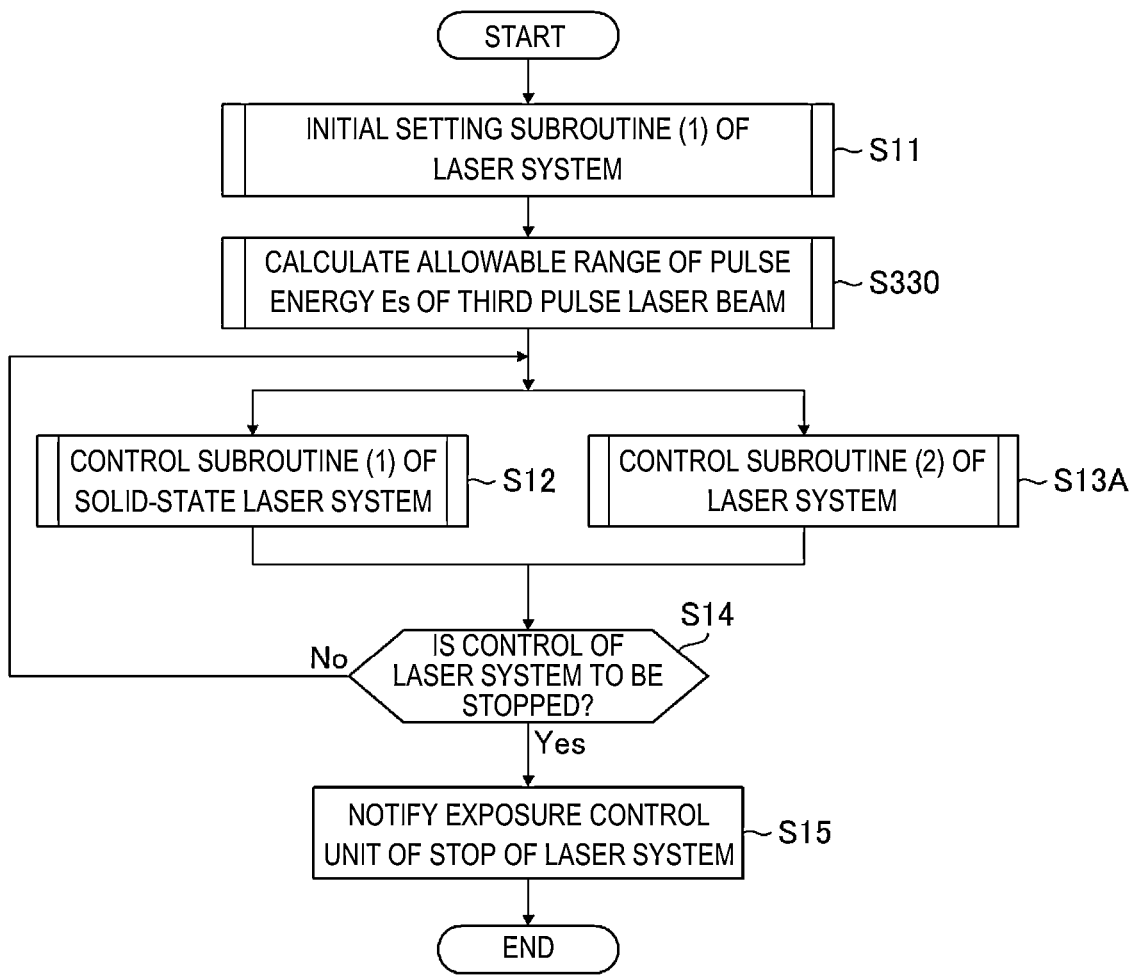
FIG. 46 is a flowchart of an example of processing of a laser control unit in Embodiment 3.

FIG. 46 is a flowchart of an example of processing of the laser control unit 18 in Embodiment 3. The flowchart in FIG. 46 is applied in place of the flowchart in FIG. 2. Differences from FIG. 2 will be described.

The flowchart in FIG. 46 further includes step S330 between steps S11 and S12. The flowchart in FIG. 46 also includes step S13A in place of step S13 in FIG. 2.

After step S11, the laser control unit 18 goes to step S330. In step S330, the laser control unit 18 performs a subroutine for calculating an allowable range of the pulse energy Es of the third pulse laser beam LP3.

Figure 47:
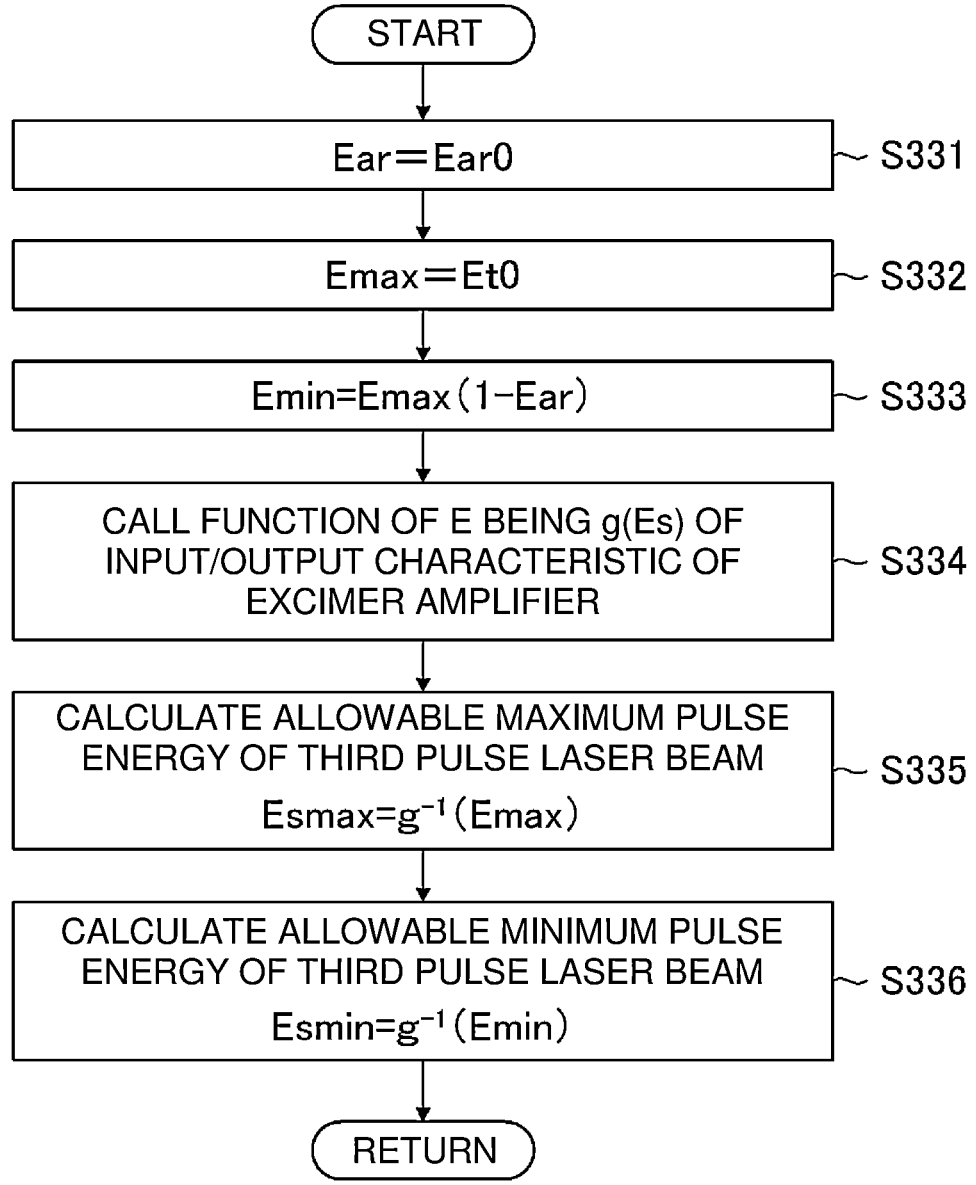
FIG. 47 is a flowchart of an example of a subroutine applied to step S330 in FIG. 46.

FIG. 47 is a flowchart of an example of the subroutine applied to step S330 in FIG. 46.

In step S331 in FIG. 47, the laser control unit 18 sets, to a predetermined fixed value Ear0, an energy decrease rate Ear allowed for the maximum value Emax of the pulse energy amplified by the excimer amplifier 14.

In step S332, the laser control unit 18 sets, to a predetermined fixed value Et0, the maximum value Emax of the pulse energy amplified by the excimer amplifier 14.

In step S333, the laser control unit 18 sets a minimum value Emin of the pulse energy allowed for the pulse energy amplified by the excimer amplifier 14. The minimum value Emin is calculated using Ear and Emax from the following expression:

$$Emin = Emax(1 - Ear).$$

In step S334, the laser control unit 18 calls the function of E being g(Es) of the input/output characteristic of the excimer amplifier 14. Instead of the function as shown in FIG. 45, the input/output characteristic of the excimer amplifier 14 may be previously measured, the measurement result of the input/output characteristic may be stored in the table data, and an approximate function may be calculated from the table data.

In step S335, the laser control unit 18 calculates allowable maximum pulse energy Esmax of the third pulse laser beam LP3 from the function of E being g(Es).

In step S336, the laser control unit 18 calculates allowable minimum pulse energy Esmin of the third pulse laser beam LP3 from the function of E being g(Es).

After calculating the allowable maximum pulse energy Esmax and the allowable minimum pulse energy Esmin in this manner, the laser control unit 18 finishes the flowchart in FIG. 47 and returns to the flowchart in FIG. 46.

After step S330 in FIG. 46, the laser control unit 18 goes to steps S12 and S13A.

Figure 48:
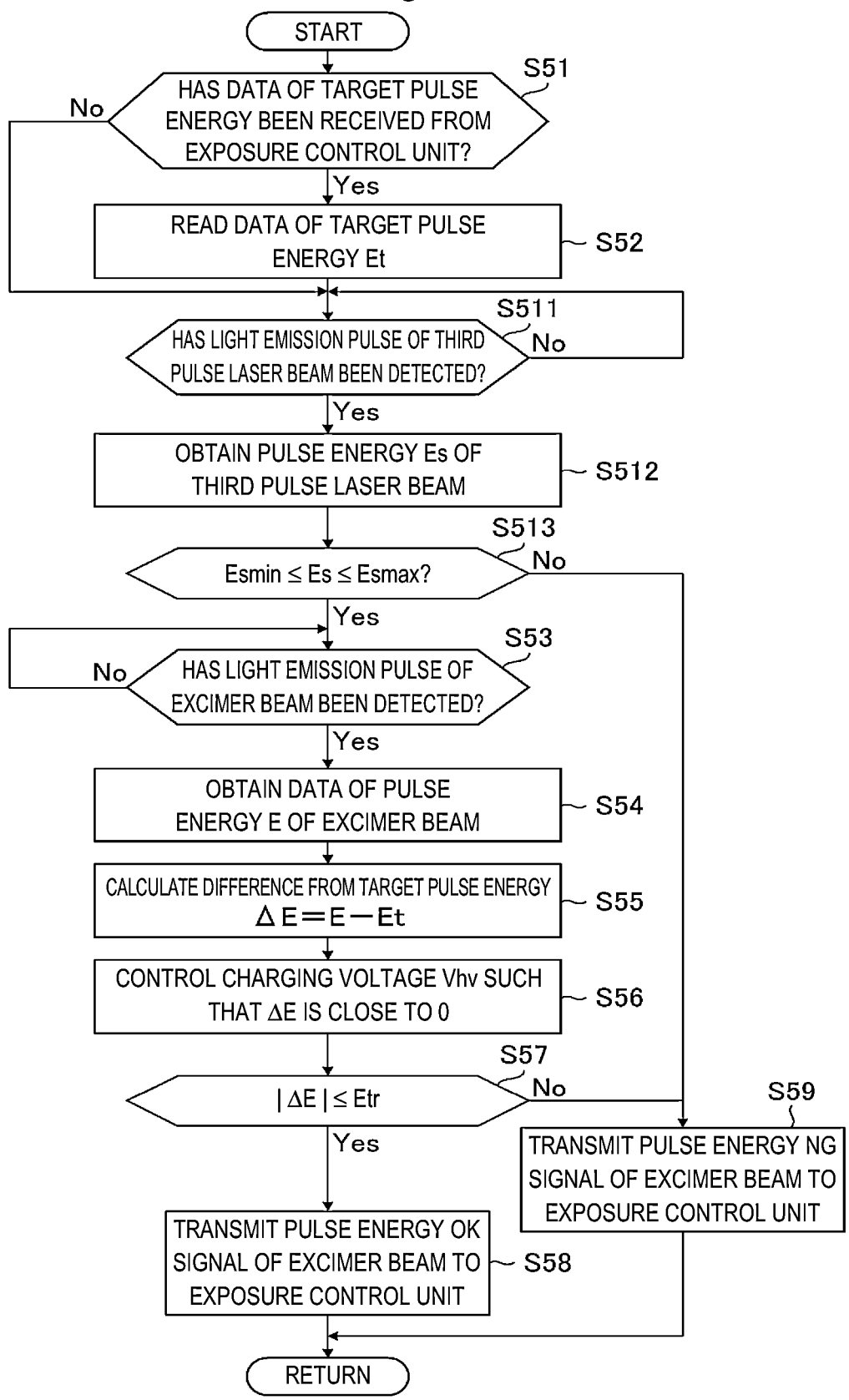
FIG. 48 is a flowchart of an example of a control subroutine (2) of a laser system applied to step S13A in FIG. 46.

FIG. 48 is a flowchart of an example of a control subroutine (2) of the laser system 1A applied to step S13A in FIG. 46. The flowchart in FIG. 48 is applied in place of the flowchart in FIG. 5. Differences from FIG. 5 will be described.

The flowchart in FIG. 48 further includes steps S511, S512, and S513 between steps S52 and S53.

After step S52, the laser control unit 18 goes to step S511. In step S511, the laser control unit 18 determines whether or not the pulse energy monitor 330 has detected a light emission pulse of the third pulse laser beam LP3. When the determination result in step S511 is No, the laser control unit 18 repeats step S511.

When the determination result in step S511 is Yes, the laser control unit 18 goes to step S512, and obtains a value of the pulse energy Es of the third pulse laser beam LP3.

Then, in step S513, the laser control unit 18 determines whether or not the pulse energy Es of the third pulse laser beam LP3 output from the solid-state laser system 10 is within an allowable range. Specifically, the laser control unit 18 determines whether or not the pulse energy Es is equal to or larger than Esmin and equal to or smaller than Esmax.

When the determination result in step S513 is Yes, the laser control unit 18 goes to step S53. When the determination result in step S513 is No, the laser control unit 18 goes to step S59. Steps S53 to S59 are the same as in FIG. 5.

After step S58 or S59 in FIG. 48, the laser control unit 18 finishes the flowchart in FIG. 48 and returns to the flowchart in FIG. 46.

5.3 Effect

According to Embodiment 3, even if the instruction for the target center wavelength λct changes at high speed to change the wavelength conversion efficiency, the operation is performed in the saturation region of the excimer amplifier 14, thereby suppressing a change in the pulse energy of the pulse laser beam output from the excimer amplifier 14 and facilitating pulse energy control.

6. Embodiment 4

6.1 Configuration

The laser system 1A according to Embodiment 4 may have the same configuration as in FIG. 24.

6.2 Operation

The laser system 1A according to Embodiment 4 controls, in addition to the control in Embodiment 1 or 2, excitation intensity of the excimer amplifier 14 in accordance with a change in pulse energy of the pulse laser beam wavelength-converted by the wavelength conversion system 300 due to a change in target center wavelength.

Figure 49:
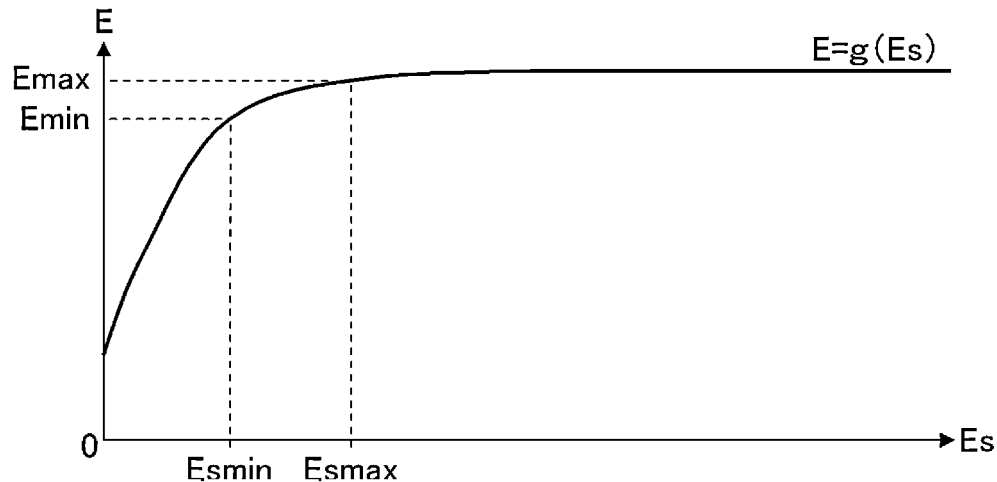
FIG. 49 is a graph showing an example of an input/output characteristic of the excimer amplifier.

6.2.1 Example of Controlling Excitation Intensity in Accordance with Injection Pulse Energy to Excimer Amplifier FIG. 49 is a graph showing an example of an input/output characteristic of the excimer amplifier 14. As shown in FIG. 49, if the pulse energy E of the pulse laser beam amplified by the excimer amplifier 14 more significantly changes than the pulse energy Es of the third pulse laser beam LP3 output from the solid-state laser system 10, stability of the pulse energy of the excimer laser beam output from the excimer amplifier 14 may decrease to affect exposure in the exposure apparatus 20.

In Embodiment 4, the target pulse energy E1t of the first pulse laser beam LP1 output from the first solid-state laser device 100 and the target pulse energy E2t of the second pulse laser beam LP2 output from the second solid-state laser device 200 are set at fixed values E10 and E20, respectively.

Then, pulse energy Eses of the third pulse laser beam LP3 injected into the excimer amplifier 14 is predictively calculated, and excitation intensity of the excimer amplifier 14 is controlled (charging voltage Vhv is controlled) such that the pulse energy is close to target pulse energy Et in accordance with a predicted value Esest.

6.2.2 Example 3 of Processing of Laser Control Unit

Figure 50:
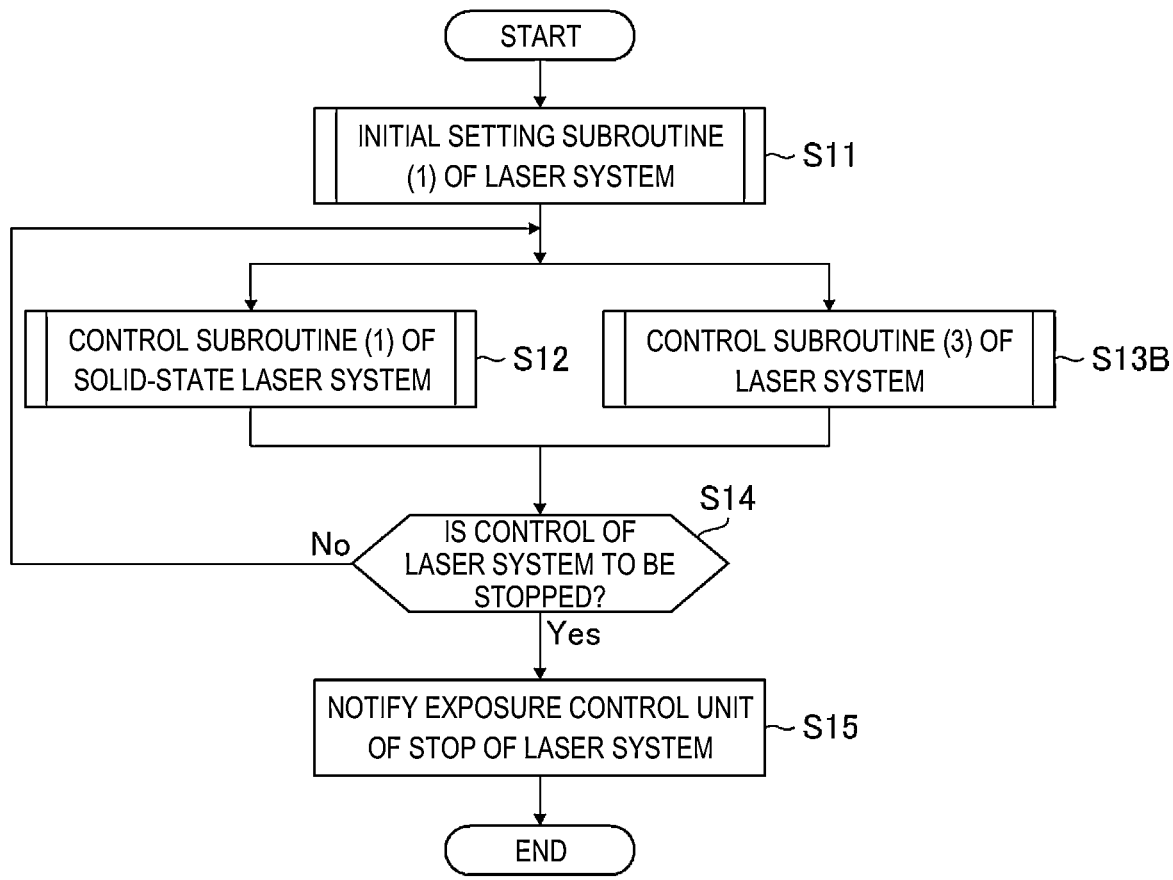
FIG. 50 is a flowchart of an example of processing of a laser control unit in Embodiment 4.

FIG. 50 is a flowchart of an example of processing of the laser control unit 18 in Embodiment 4. In Embodiment 4, the flowchart in FIG. 50 is applied in place of the flowchart in FIG. 2. Differences from FIG. 2 will be described.

The flowchart in FIG. 50 includes step S13B in place of step S13 in FIG. 2.

In step S13B, the laser control unit 18 performs a control subroutine (3) of the laser system 1A.

Figure 51:
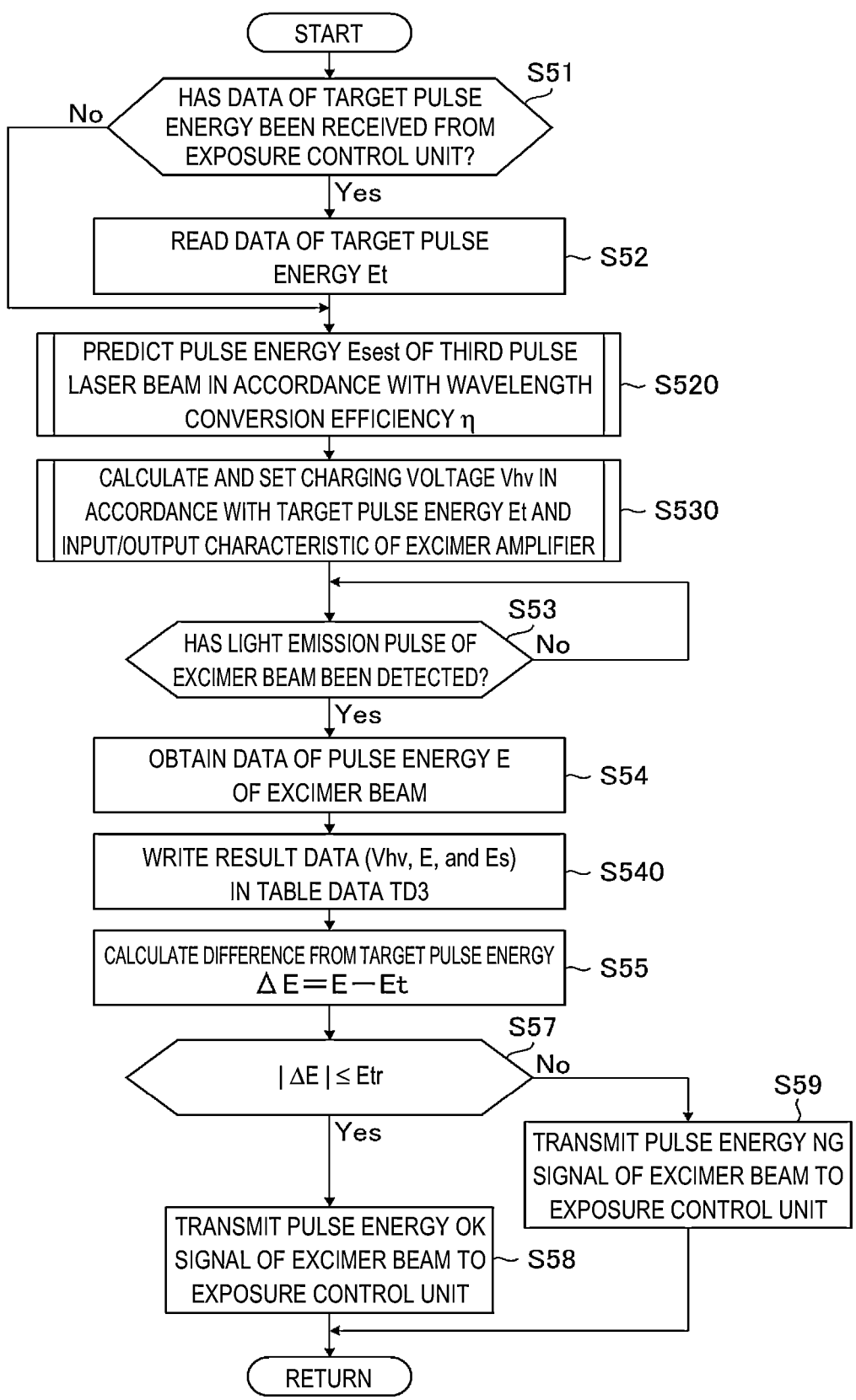
FIG. 51 is a flowchart of an example of a subroutine applied to step S13B in FIG. 46.

FIG. 51 is a flowchart of an example of the subroutine applied to step S13B in FIG. 46. The flowchart in FIG. 51 is applied in place of the flowchart in FIG. 5. Differences from FIG. 5 will be described.

The flowchart in FIG. 51 further includes steps S520 and S530 between steps S52 and S53, and includes step S540 between steps S54 and S55.

After step S52 or when the determination result in step S51 is No, the laser control unit 18 goes to step S520.

In step S520, the laser control unit 18 predicts the pulse energy of the third pulse laser beam LP3 in accordance with the wavelength conversion efficiency η.

Figure 52:
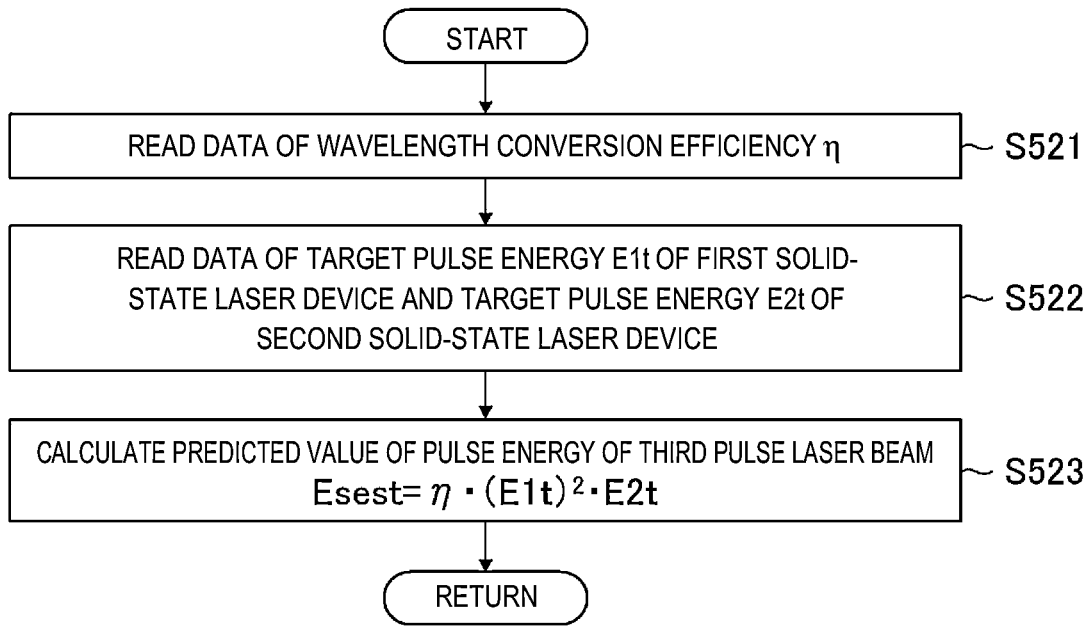
FIG. 52 is a flowchart of an example of a subroutine applied to step S520 in FIG. 51.

FIG. 52 is a flowchart of an example of a subroutine applied to step S520 in FIG. 51.

In step S521 in FIG. 52, the laser control unit 18 reads data of the wavelength conversion efficiency η from the wavelength conversion system control unit 380.

In step S522, the laser control unit 18 reads data of the target pulse energy E1t of the first solid-state laser device 100 and the target pulse energy E2t of the second solid-state laser device 200.

Then, in step S523, the laser control unit 18 calculates a predicted value Esest of the pulse energy of the third pulse laser beam LP3. The predicted value Esest is expressed by Expression (28) below.

$$Esest = \eta \cdot (E1t)^2 \cdot E2t \qquad (28)$$

After step S523, the laser control unit 18 finishes the flowchart in FIG. 52 and returns to the flowchart in FIG. 51.

After step S520 in FIG. 51, the laser control unit 18 goes to step S530, and calculates and sets a charging voltage Vhv in accordance with the target pulse energy Et and the input/output characteristic of the excimer amplifier 14.

Figure 53:
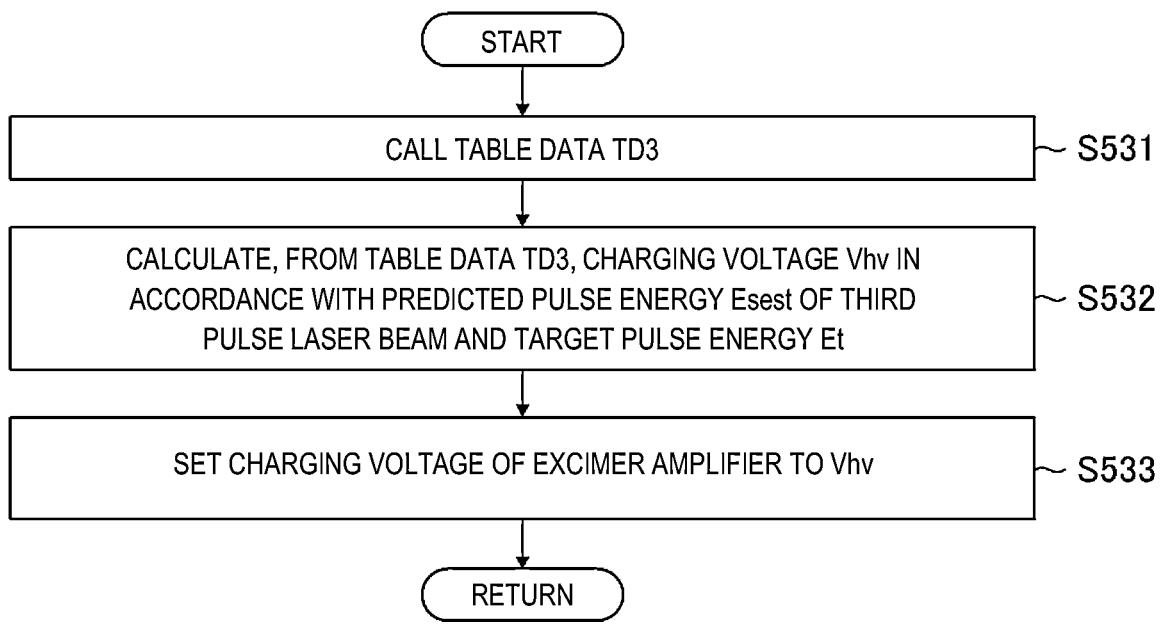
FIG. 53 is a flowchart of an example of a subroutine applied to step S530 in FIG. 51.

FIG. 53 is a flowchart of an example of a subroutine applied to step S530 in FIG. 51.

In step S531 in FIG. 53, the laser control unit 18 calls table data TD3. The table data TD3 describes a relationship between the charging voltage Vhv of the excimer amplifier 14, the pulse energy Es of the third pulse laser beam LP3 entering the excimer amplifier 14, and pulse energy E of a pulse laser beam LP6 amplified by the excimer amplifier 14.

Figures 54, 55:
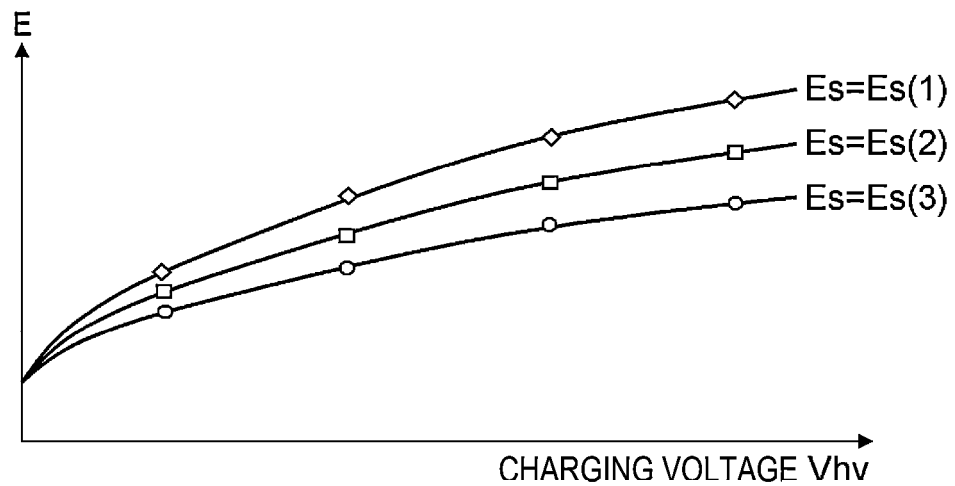
FIG. 54 is a table showing an example of table data TD3.
FIG. 55 is a graph plotting the table data TD3.

FIG. 54 is a table showing an example of the table data TD3. FIG. 55 is a graph plotting the table data TD3.

Adjustment oscillation may be previously performed to measure dependence of the input/output characteristic of the excimer amplifier 14 on the energy of the injection laser beam, and data of the measurement result may be stored in the table data TD3.

After step S531 in FIG. 53, the laser control unit 18 goes to step S532, and calculates, from the table data TD3, a charging voltage Vhv in accordance with the predicted pulse energy Esest of the third pulse laser beam LP3 and the target pulse energy Et.

Then, in step S533, the laser control unit 18 sets the charging voltage of the excimer amplifier 14 to Vhv.

After step S533, the laser control unit 18 finishes the flowchart in FIG. 53 and returns to the flowchart in FIG. 51.

After step S54 in FIG. 51, the laser control unit 18 goes to step S540. In step S540, the laser control unit 18 writes, in the table data TD3, result data including the value of the charging voltage Vhv obtained in step S530, the value of the pulse energy E of the excimer beam obtained in step S54, and the value of the pulse energy Es of the third pulse laser beam LP3. The processing in step S540 updates the table data TD3, and increases calculation accuracy of the charging voltage Vhv in step S530. Steps S55 to S59 in FIG. 51 are the same as in FIG. 5. After step S58 or S59 in FIG. 51, the laser control unit 18 finishes the flowchart in FIG. 51 and returns to the flowchart in FIG. 46.

6.2.3 Example 3 of Processing of Wavelength Conversion System Control Unit

Figure 56:
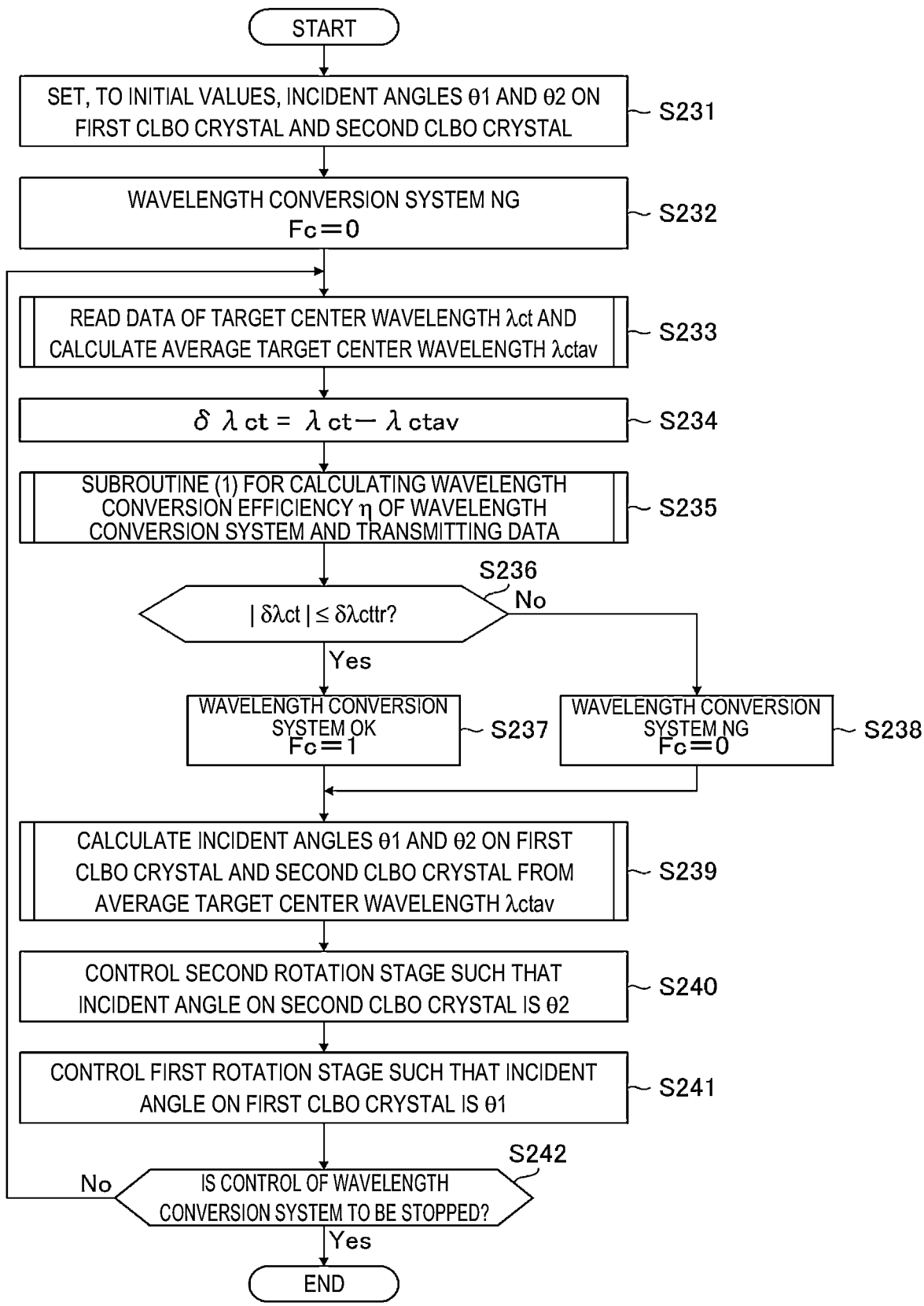
FIG. 56 is a flowchart of an example of processing of a wavelength conversion system control unit in Embodiment 4.

FIG. 56 is a flowchart of an example of processing of the wavelength conversion system control unit 380 in Embodiment 4. The flowchart in FIG. 56 is applied in place of the flowchart in FIG. 31. Differences from FIG. 31 will be described.

The flowchart in FIG. 56 further includes step S235 between steps S234 and S236. After step S234, the wavelength conversion system control unit 380 goes to step S235. In step S235, the wavelength conversion system control unit 380 performs a subroutine (1) for calculating wavelength conversion efficiency η of the wavelength conversion system 300 and transmitting data. Specifically, in step S235, the wavelength conversion system control unit 380 calculates the wavelength conversion efficiency η of the wavelength conversion system 300 in accordance with the value of δλct obtained in step S234, and transmits data of the calculation result to the laser control unit 18.

FIG. 57 is a flowchart of an example of the subroutine applied to step S235 in FIG. 56. In step S351 in FIG. 57, the wavelength conversion system control unit 380 calls table data TD4 describing a relationship between the wavelength conversion efficiency 1 for the pulse energy of the first pulse laser beam LP1 and act.

In step S352, the wavelength conversion system control unit 380 calculates, from the table data TD4, wavelength conversion efficiency η at the difference δλct between the target center wavelength λct and the average target center wavelength λctav.

Then, in step S353, the wavelength conversion system control unit 380 transmits, to the laser control unit 18, data of the wavelength conversion efficiency η calculated in step S352. After step S353, the wavelength conversion system control unit 380 finishes the flowchart in FIG. 57 and returns to the flowchart in FIG. 56.

FIG. 58 is a table showing an example of the table data TD4. The table data TD4 describes a relationship between the difference δλct between the target center wavelength λct and the average target center wavelength λctav and the wavelength conversion efficiency η of the wavelength conversion system 300. Adjustment oscillation may be previously performed to measure δλct and the wavelength conversion efficiency η for each point, and data of the measurement result may be stored in the table data TD4.

Figure 59:
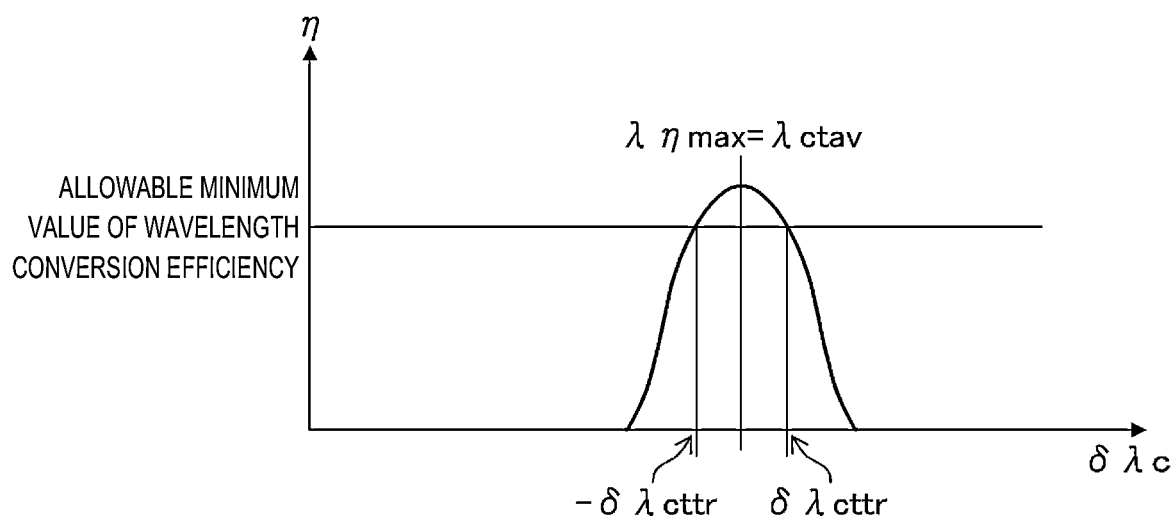
FIG. 59 is a graph showing a relationship between a difference $\delta\lambda c$ between a target center wavelength $\lambda ct$ and an average target center wavelength $\lambda ctav$ and wavelength conversion efficiency $\eta$.

FIG. 59 is a graph showing a relationship between λct and the wavelength conversion efficiency η. When a wavelength ληmax at which the wavelength conversion efficiency η is maximum is equal to the average target center wavelength λctav, the wavelength conversion efficiency η has a maximum value. As shown in FIG. 59, a value of δλcttr is determined in accordance with an allowable minimum value of the wavelength conversion efficiency.

When δλct satisfies a condition in Expression (29) below, the wavelength conversion efficiency η is equal to or higher than the allowable minimum value of the wavelength conversion efficiency.

$$-\delta\lambda cttr \leq \delta\lambda ct \leq \delta\lambda cttr \qquad (29)$$

6.3 Effect

According to Embodiment 4, even if the target center wavelength λct changes at high speed to change the wavelength conversion efficiency of the wavelength conversion system 300, the pulse energy of the third pulse laser beam LP3 due to the change in wavelength conversion efficiency is predicted, and the excitation intensity (charging voltage) of the excimer amplifier 14 is controlled in accordance with the predicted value. This suppresses a change in pulse energy of the pulse laser beam output from the excimer amplifier 14.

7. Embodiment 5

7.1 Configuration

The laser system 1A according to Embodiment 5 may have the same configuration as in FIG. 24.

7.2 Operation

The laser system 1A according to Embodiment 5 controls, in addition to the control in Embodiment 1 or 2, pulse energy of at least one of the first solid-state laser device 100 and the second solid-state laser device 200 in accordance with a change in pulse energy of the pulse laser beam wavelength-converted by the wavelength conversion system 300 due to a change in target center wavelength.

As expressed by Expression (8) above, the wavelength conversion efficiency η of the wavelength conversion system 300 changes with changes in the target center wavelength λct.

The wavelength conversion efficiency η of the wavelength conversion system 300 is expressed by Expression (7) above.

$$Es = E2 \cdot E1^2 \eta \qquad (7)$$

To provide constant pulse energy Es of the third pulse laser beam LP3 irrespective of the change in the wavelength conversion efficiency η, at least one of the pulse energy E1 of the first pulse laser beam LP1 and the pulse energy E2 of the second pulse laser beam LP2 needs to be controlled.

7.2.1 Example of Suppressing Pulse Energy Variation by Pulse Energy Control of First Solid-State Laser Device In Embodiment 5, the target pulse energy E1t of the first pulse laser beam LP1 is controlled such that a target value Est of the pulse energy of the third pulse laser beam LP3 is Es0 (fixed value).

The target pulse energy E2t of the second pulse laser beam LP2 is a fixed value E20.

Under this condition, E1t is expressed from Expression (7) by Expression (30) below.

$$E1t = \{Es0/(\eta \cdot E20)\}^{1/2} \qquad (30)$$

7.2.2 Example 3 of Processing of Solid-State Laser System Control Unit

Figure 60:
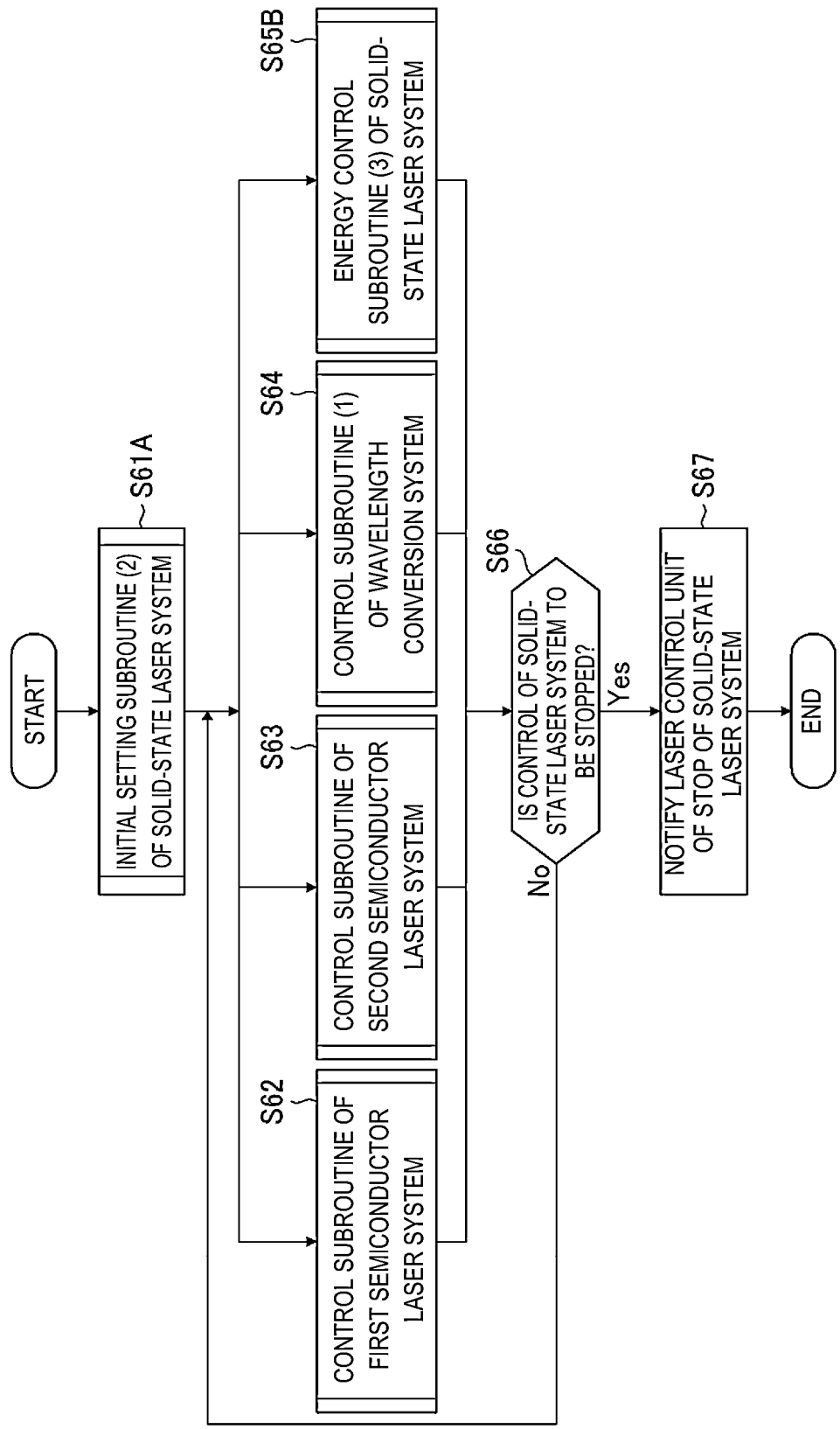
FIG. 60 is a flowchart of an example of processing of a solid-state laser system control unit in Embodiment 5.

FIG. 60 is a flowchart of an example of processing of the solid-state laser system control unit 350 in Embodiment 5. The flowchart in FIG. 60 can be applied in place of the flowchart in FIG. 27. Differences from FIG. 27 will be described.

The flowchart in FIG. 60 includes step S65B in place of step S65A in FIG. 27.

In step S65B, the solid-state laser system control unit 350 performs an energy control subroutine (3) of the solid-state laser system 10.

Figure 61:
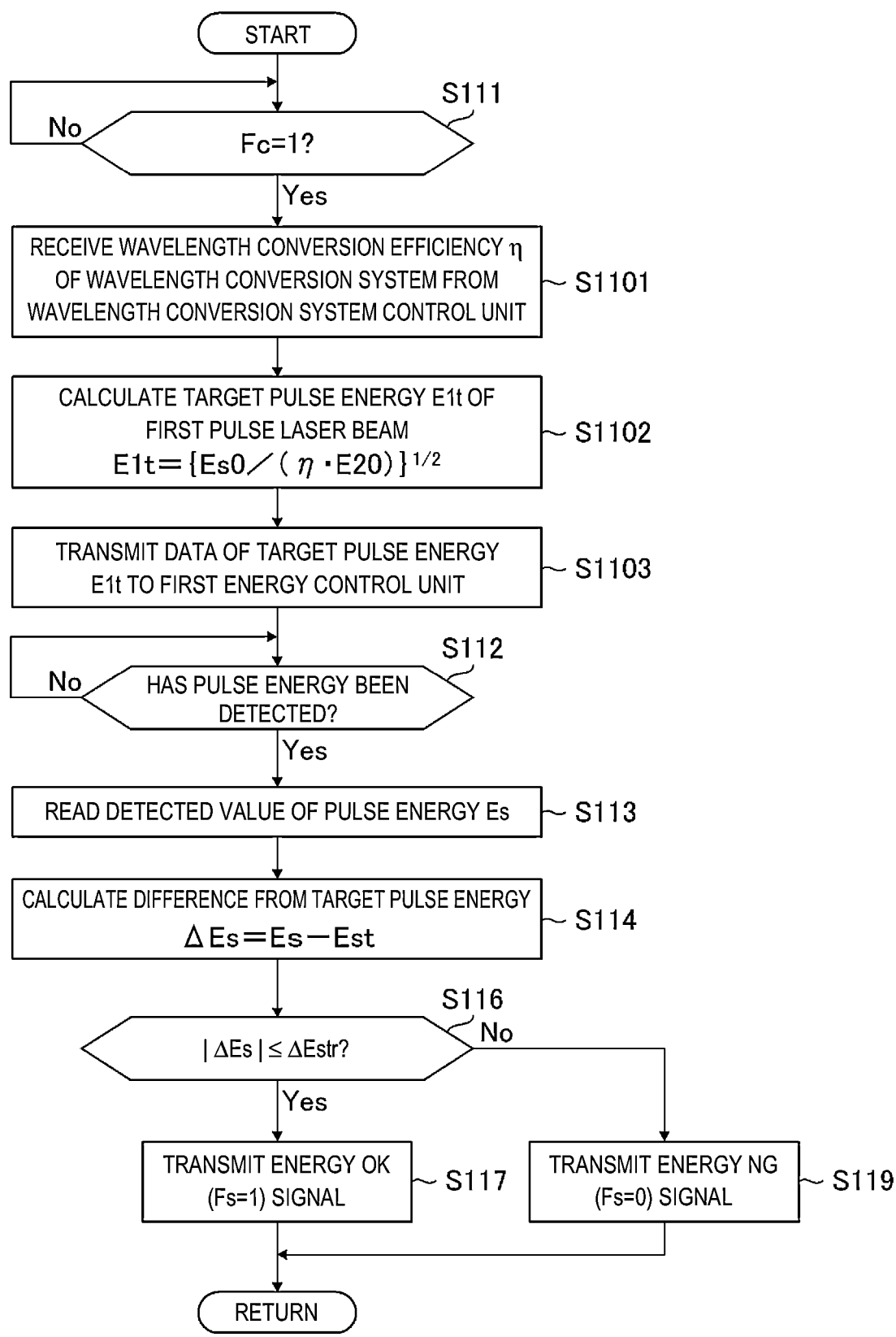
FIG. 61 is a flowchart of an example of an energy control subroutine (3) of a solid-state laser system.

FIG. 61 is a flowchart of an example of the energy control subroutine (3) of the solid-state laser system 10. The flowchart in FIG. 61 is applied to step S65B in FIG. 60.

For the flowchart in FIG. 61, differences from FIG. 29 will be described. The flowchart in FIG. 61 includes steps S1101, S1102, and S1103 between steps S111 and S112. In the flowchart in FIG. 61, step S118 is removed.

When the solid-state laser system control unit 350 receives a flag signal of Fc being 1 (OK signal) from the wavelength conversion system 300 and the determination result in step S111 is Yes, the solid-state laser system control unit 350 goes to step S1101. In steps S1101 to S1103, the solid-state laser system control unit 350 calculates the target pulse energy E1t of the first pulse laser beam LP1 from the wavelength conversion efficiency η and the target pulse energy E2t (=E20) of the second pulse laser beam LP2.

In step S1101, the solid-state laser system control unit 350 receives data of the wavelength conversion efficiency η of the wavelength conversion system 300 from the wavelength conversion system control unit 380.

In step S1102, the solid-state laser system control unit 350 calculates the target pulse energy E1t of the first pulse laser beam LP1. As a calculation expression, Expression (30) may be used or table data corresponding to Expression (30) may be used.

In step S1103, the solid-state laser system control unit 350 transmits, to the first energy control unit 168, data of the target pulse energy E1t calculated in step S1102.

After step S1103, the solid-state laser system control unit 350 goes to step S112.

The processes in steps S112 to S117 are the same as in FIG. 30. When the determination result in step S116 in FIG. 61 is No, the solid-state laser system control unit 350 goes to step S119.

After step S117 or S119, the solid-state laser system control unit 350 finishes the flowchart in FIG. 61 and returns to the flowchart in FIG. 60.

7.2.3 Example 4 of Processing of Wavelength Conversion System Control Unit

Figure 62:
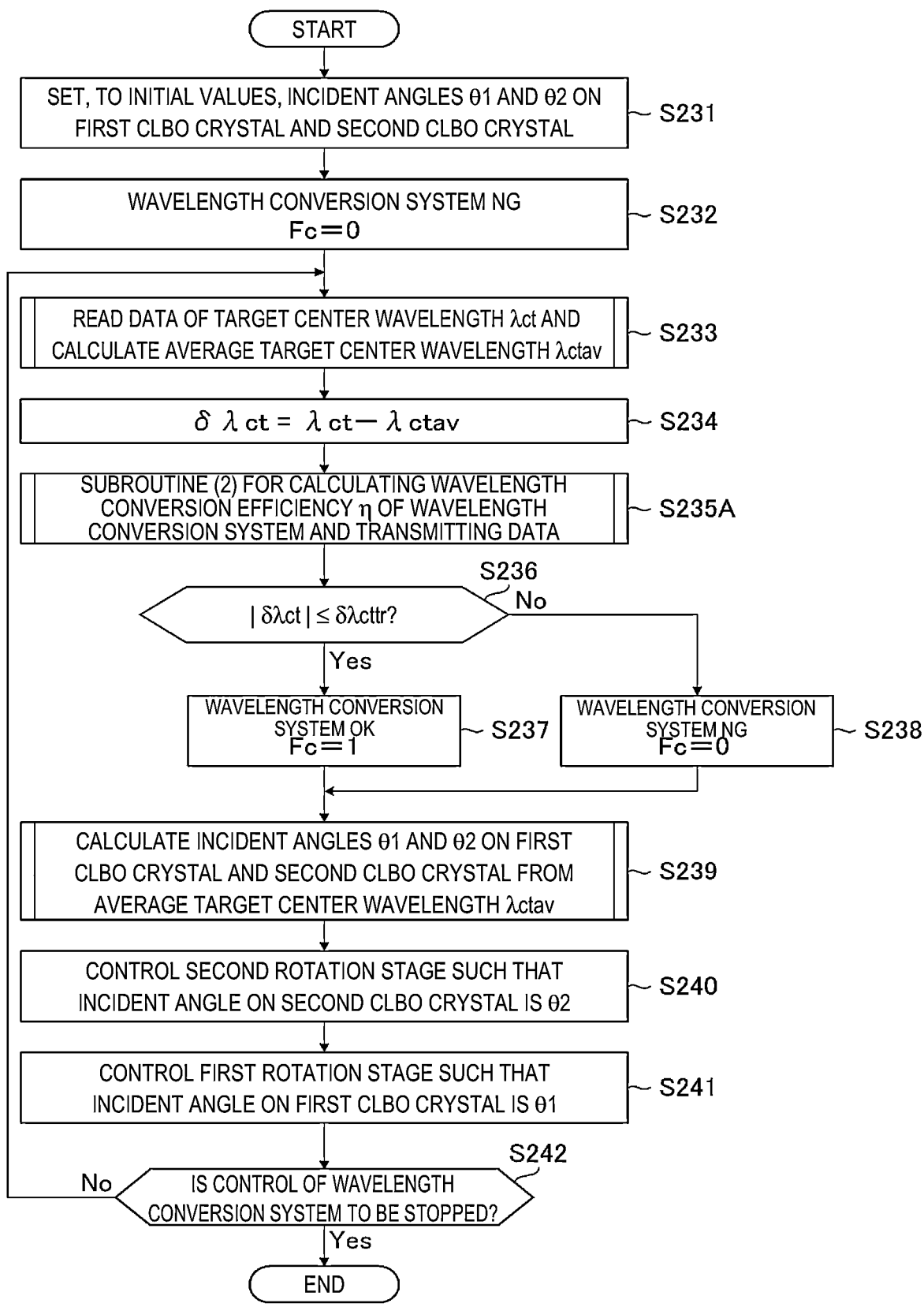
FIG. 62 is a flowchart of an example of processing of a wavelength conversion system control unit in Embodiment 5.

FIG. 62 is a flowchart of an example of processing of the wavelength conversion system control unit 380 in Embodiment 5. The flowchart in FIG. 62 is applied in place of the flowchart in FIG. 56. Differences from FIG. 56 will be described.

The flowchart in FIG. 62 includes step S235A in place of step S235.

In step S235A, the wavelength conversion system control unit 380 performs a subroutine (2) for calculating the wavelength conversion efficiency η of the wavelength conversion system 300 and transmitting data. Specifically, in step S235A, the wavelength conversion system control unit 380 calculates the wavelength conversion efficiency η of the wavelength conversion system 300 in accordance with the value of δλct obtained in step S234, and transmits data of the calculation result to the solid-state laser system control unit 350.

The processes in step S236 and thereafter are the same as in FIG. 56.

Figure 63:
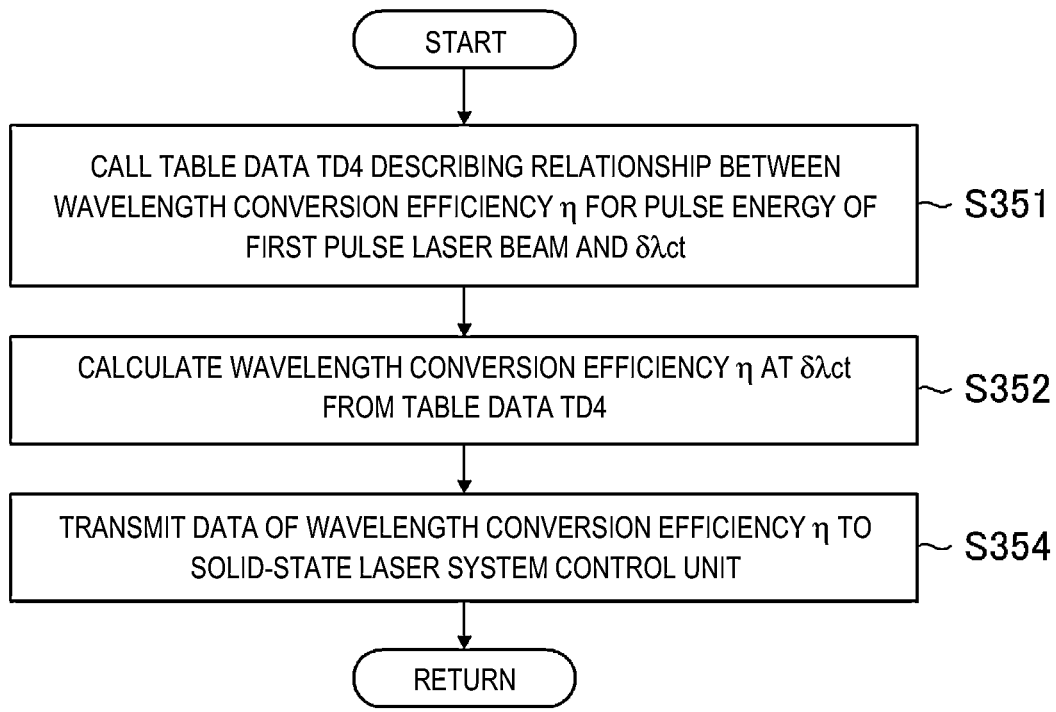
FIG. 63 is a flowchart of an example of a subroutine applied to step S235A in FIG. 62.

FIG. 63 is a flowchart of an example of the subroutine applied to step S235A in FIG. 62. For the flowchart in FIG. 63, differences from FIG. 57 will be described. The flowchart in FIG. 63 includes step S354 in place of step S353 in FIG. 57.

As shown in FIG. 63, after step S352, the wavelength conversion system control unit 380 goes to step S354. In step S354, the wavelength conversion system control unit 380 transmits, to the solid-state laser system control unit 350, the data of the wavelength conversion efficiency η obtained in step S352. After step S354, the wavelength conversion system control unit 380 finishes the flowchart in FIG. 63 and returns to the flowchart in FIG. 62.

7.3 Effect

According to Embodiment 5, the target pulse energy E1t of the first pulse laser beam LP1 is controlled such that the pulse energy of the third pulse laser beam LP3 is the target value Est (=Es0 (fixed value)) in accordance with the wavelength conversion efficiency η due to the change in the target center wavelength λct. This improves stability of the pulse energy of the pulse laser beam (excimer laser beam) amplified by the excimer amplifier 14.

8. Embodiment 6

8.1 Configuration

The laser system 1A according to Embodiment 6 may have the same configuration as in FIG. 24.

8.2 Operation

8.2.1 Example of Suppressing Pulse Energy Variation by Pulse Energy Control of Second Solid-State Laser Device The laser system 1A according to Embodiment 6 controls, in addition to the control in Embodiment 1 or 2, pulse energy of the second solid-state laser device 200 in accordance with a change in pulse energy of the pulse laser beam wavelength-converted by the wavelength conversion system 300 due to a change in target center wavelength λct.

Specifically, in Embodiment 6, the target pulse energy E2t of the second pulse laser beam LP2 is controlled such that a target value Est of the pulse energy of the third pulse laser beam LP3 is Es0 (fixed value).

The target pulse energy E1t of the first pulse laser beam LP1 is a fixed value E10.

Under this condition, E2t is expressed from Expression (7) by Expression (31) below.

$$E2t = Es0/\{\eta \cdot (E10)^2\} \quad (31)$$

8.2.2 Example 4 of Processing of Solid-State Laser System Control Unit

Figure 64:
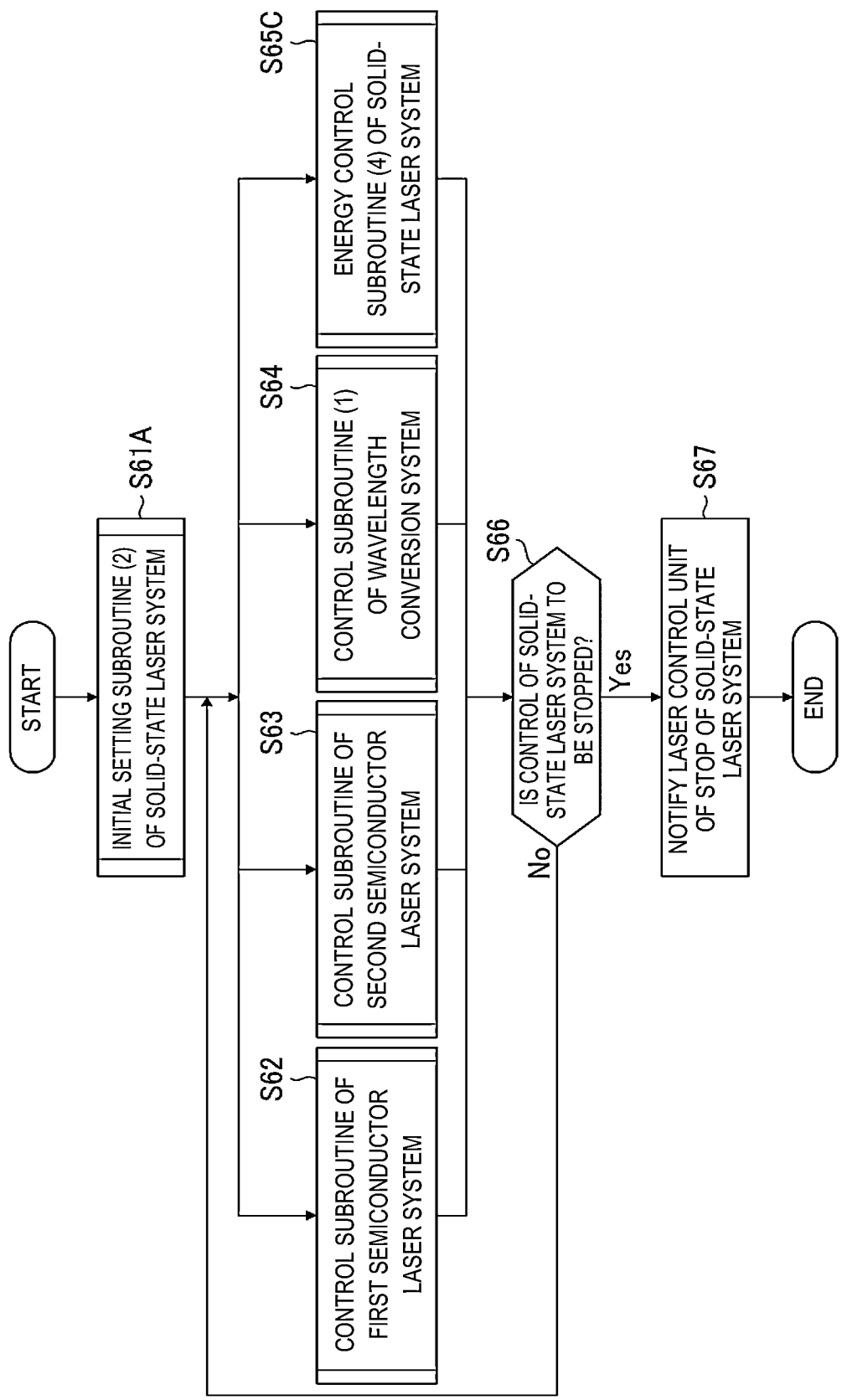
FIG. 64 is a flowchart of an example of processing of a solid-state laser system control unit in Embodiment 6.

FIG. 64 is a flowchart of an example of processing of the solid-state laser system control unit 350 in Embodiment 6. The flowchart in FIG. 64 is applied in place of the flowchart in FIG. 60. Differences from FIG. 60 will be described.

The flowchart in FIG. 64 includes step S65C in place of step S65B in FIG. 60.

In step S65C, the solid-state laser system control unit 350 performs an energy control subroutine (4) of the solid-state laser system 10.

Figure 65:
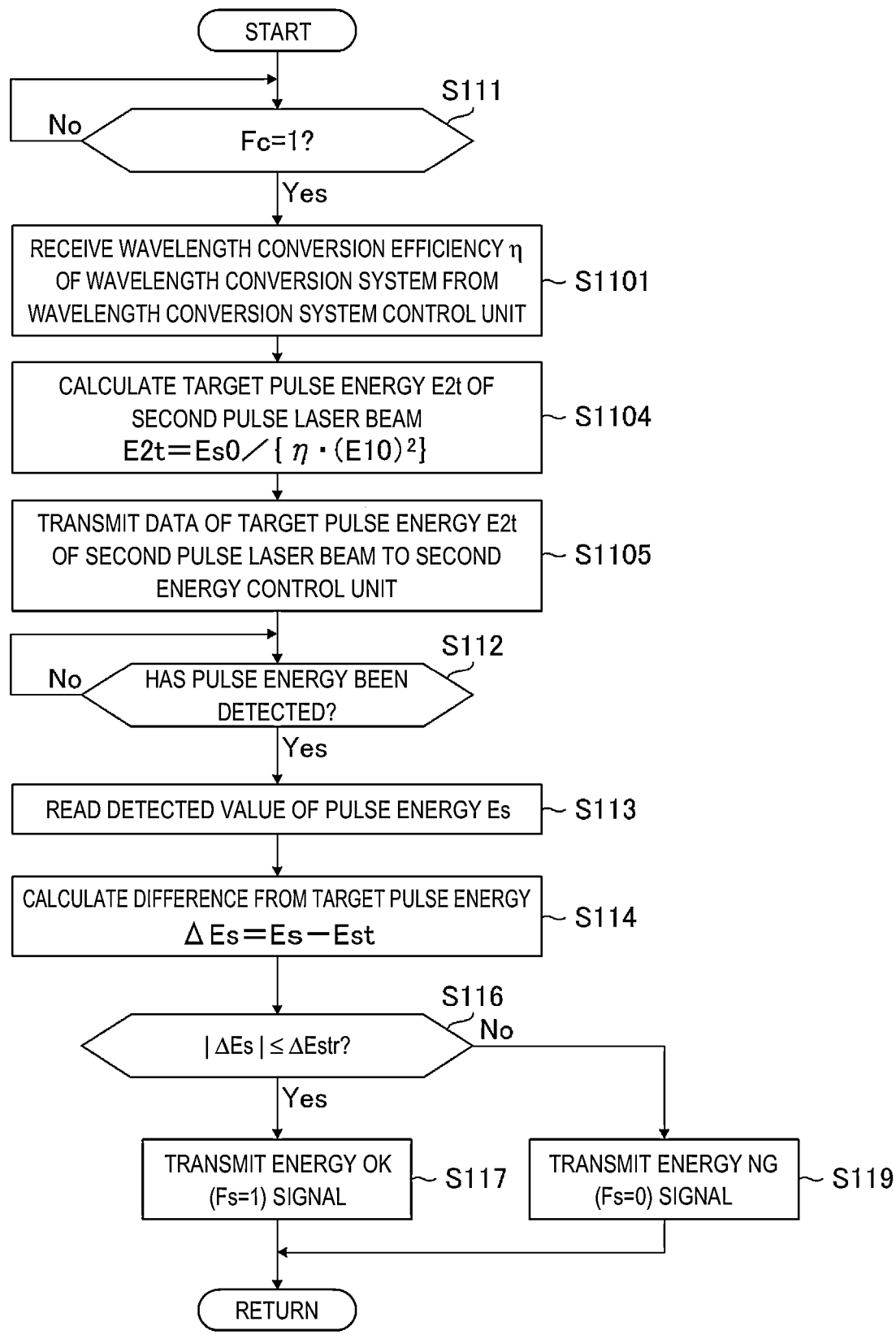
FIG. 65 is a flowchart of an example of an energy control subroutine (4) of a solid-state laser system.

FIG. 65 is a flowchart of an example of the energy control subroutine (4) of the solid-state laser system 10. The flowchart in FIG. 65 is applied to step S65C in FIG. 64.

For the flowchart in FIG. 65, differences from FIG. 61 will be described. The flowchart in FIG. 65 includes steps S1104 and S1105 in place of steps S1102 and S1103 in FIG. 61.

After step S1101, in step S1104, the solid-state laser system control unit 350 calculates the target pulse energy E2t of the second pulse laser beam LP2. As a calculation expression, Expression (31) may be used or table data corresponding to Expression (31) may be used.

In step S1105, the solid-state laser system control unit 350 transmits, to the second energy control unit 268, data of the target pulse energy E2t calculated in step S1104.

After step S1105, the solid-state laser system control unit 350 goes to step S112. The processes in step S112 and thereafter are the same as in FIG. 61.

The operation of the wavelength conversion system control unit 380 in Embodiment 6 may be the same as in Embodiment 5.

8.3 Effect

According to Embodiment 6, the target pulse energy E2t of the second pulse laser beam LP2 is controlled such that the pulse energy of the third pulse laser beam LP3 is the target value Est (=Es0 (fixed value)) in accordance with the wavelength conversion efficiency η due to the change in the target center wavelength λct. This improves stability of the pulse energy of the pulse laser beam amplified by the excimer amplifier 14.

8.4 Variant

In Embodiments 5 and 6, the examples have been described in which the target pulse energy of the first pulse laser beam LP1 or the second pulse laser beam LP2 is controlled to suppress the change in the pulse energy of the third pulse laser beam LP3. However, not limited to the two examples, the target pulse energy E1t of the first pulse laser beam LP1 and the target pulse energy E2t of the second pulse laser beam LP2 may be controlled such that the target pulse energy of the third pulse laser beam LP3 is the target value Est (=Es0).

In this case, Expression (32) below is obtained from Expression (7).

$$Es0 = E2t \cdot (E1t)^2 \cdot \eta \quad (32)$$

Expression (32) is modified to obtain Expressions (33) and (34) below.

$$E1t = \{Es0/(\eta \cdot E2t)\}^{1/2} \quad (33)$$

$$E2t = Es0/\{\eta \cdot (E1t)^2\} \quad (34)$$

Thus, the target pulse energy E1t of the first pulse laser beam LP1 may be calculated by Expression (33), the target pulse energy E2t of the second pulse laser beam LP2 may be calculated by Expression (34), and the first pulse excitation light source 132 of the first solid-state laser device 100 and the second pulse excitation light source 232 and the third pulse excitation light source 244 of the second solid-state laser device 200 may be controlled in accordance with the obtained target pulse energies E1t, E2t.

9. Example of Excimer Amplifier

9.1 Multipath Amplification

Figure 66:
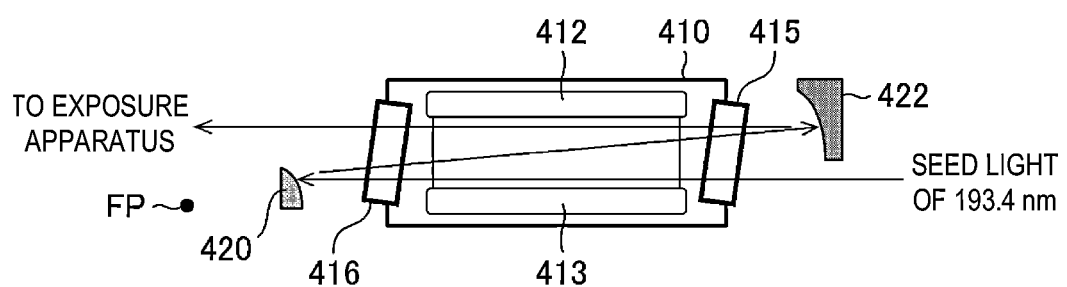
FIG. 66 schematically shows an exemplary configuration of an excimer amplifier.

FIG. 66 schematically shows an exemplary configuration of the excimer amplifier 14. The excimer amplifier 14 in FIG. 66 passes three times seed light having a wavelength of 193.4 nm through a discharge space between a pair of discharge electrodes 412, 413 for amplification. Here, the seed light having the wavelength of 193.4 nm is the third pulse laser beam LP3 output from the solid-state laser system 10.

In FIG. 66, the excimer amplifier 14 includes a convex mirror 420 and a concave mirror 422 in an optical path of the seed light outside a chamber 410. The convex mirror 420 and the concave mirror 422 are arranged such that their focal points FP are substantially aligned with each other.

The seed light having the wavelength of 193.4 nm having entered the excimer amplifier 14 is reflected by the convex mirror 420 and the concave mirror 422 to pass three times through the discharge space between the discharge electrodes 412, 413. This expands and amplifies the seed light, which is output toward the exposure apparatus 20.

9.2 Amplification with Ring Resonator

Figure 67:
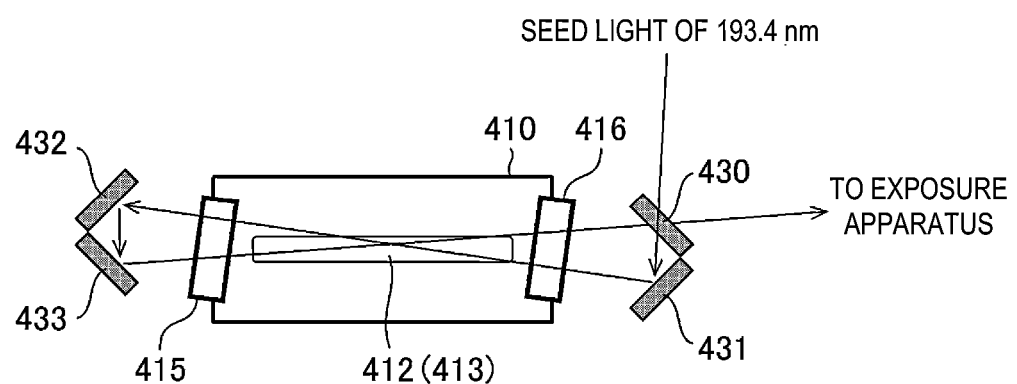
FIG. 67 shows an example in which a ring resonator is used as the excimer amplifier.

FIG. 67 shows an example in which a ring resonator is used as the excimer amplifier 14. The ring resonator includes an output coupling mirror 430 and highly reflective mirrors 431 to 433. The excimer amplifier 14 may further include a highly reflective mirror (not shown) that guides seed light having a wavelength of 193.4 nm to the ring resonator, and a highly reflective mirror (not shown) that guides a pulse laser beam output from the ring resonator to the exposure apparatus 20.

A chamber 410 includes windows 415, 416. A pair of discharge electrodes 412, 413 are arranged in the chamber 410. In FIG. 67, the discharge electrodes 412, 413 are arranged to face each other in a direction perpendicular to the sheet surface. A discharge direction is perpendicular to the sheet surface.

In the excimer amplifier 14, the seed light repeatedly travels and is amplified through the output coupling mirror 430, the highly reflective mirror 431, a discharge space between the discharge electrodes 412, 413, the highly reflective mirror 432, the highly reflective mirror 433, and the discharge space between the discharge electrodes 412, 413 in this order.

10. Specific Example of Spectrum Monitor

10.1 Example of Spectrum Monitor Using Spectrometer and Reference Laser Beam Source

10.1.1 Configuration

Figure 68:
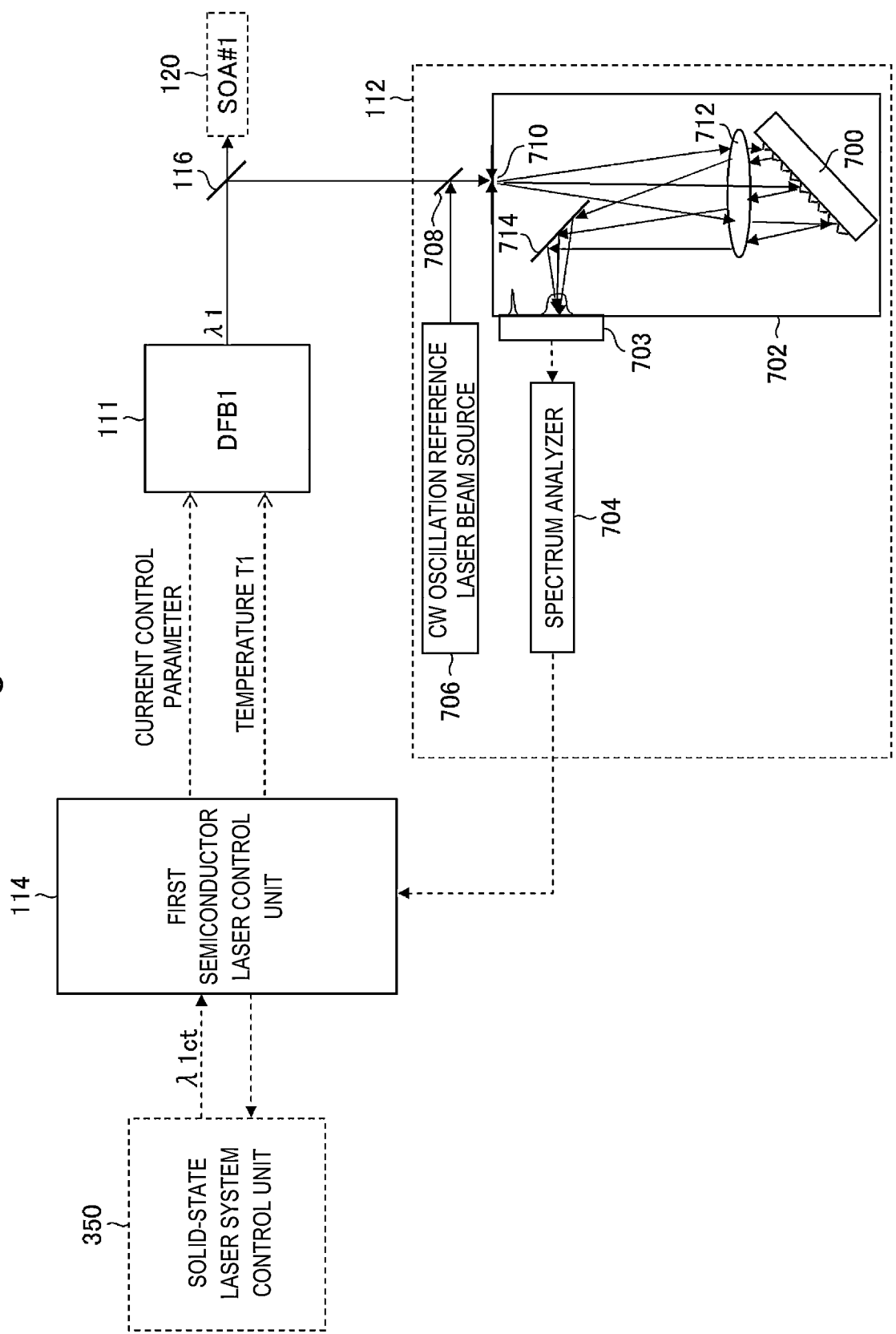
FIG. 68 schematically shows an exemplary configuration of a spectrum monitor.

FIG. 68 schematically shows an exemplary configuration of the spectrum monitor. FIG. 68 shows an example of the first spectrum monitor 112, but the second spectrum monitor 212 may have the same configuration as in FIG. 68.

The first spectrum monitor 112 in FIG. 68 includes a spectrometer 702 including a grating 700, a line sensor 703, a spectrum analyzer 704, a CW oscillation reference laser beam source 706, and a beam splitter 708.

The spectrometer 702 includes an entrance slit 710, a collimator lens 712, and a highly reflective mirror 714. The CW oscillation reference laser beam source 706 is a reference light source that outputs a laser beam having a reference wavelength by CW oscillation. Here, the laser beam having a reference wavelength output from the CW oscillation reference laser beam source 706 is referred to as "reference laser beam". The laser beam output from the first semiconductor laser 111 is referred to as "first semiconductor laser beam". In FIG. 68, "λ1" denotes a wavelength of the first semiconductor laser beam.

10.1.2 Operation

In FIG. 68, part of the laser beam (first semiconductor laser beam) output from the first semiconductor laser 111 is reflected by the first beam splitter 116. The laser beam reflected by the first beam splitter 116 passes through the beam splitter 708. The reference laser beam output from the CW oscillation reference laser beam source 706 is reflected by the beam splitter 708 and overlapped with the first semiconductor laser beam having passed through the beam splitter 708.

The laser beam overlapped with the reference laser beam by the beam splitter 708 enters the spectrometer 702 through the entrance slit 710. The laser beam having passed through the entrance slit 710 enters the grating 700 via the collimator lens 712 and is dispersed by the grating 700. A slit image of the first semiconductor laser beam and the reference laser beam formed on the line sensor 703 via the collimator lens 712 and the highly reflective mirror 714 can be measured to measure a center wavelength and a spectral line width of the first semiconductor laser 111.

In FIG. 68, the example of the spectrometer 702 including the grating 700 is shown, but an etalon spectrometer may be used.

10.2 Example of Spectrum Monitor Using Heterodyne Interferometer

10.2.1 Configuration

Figure 69:
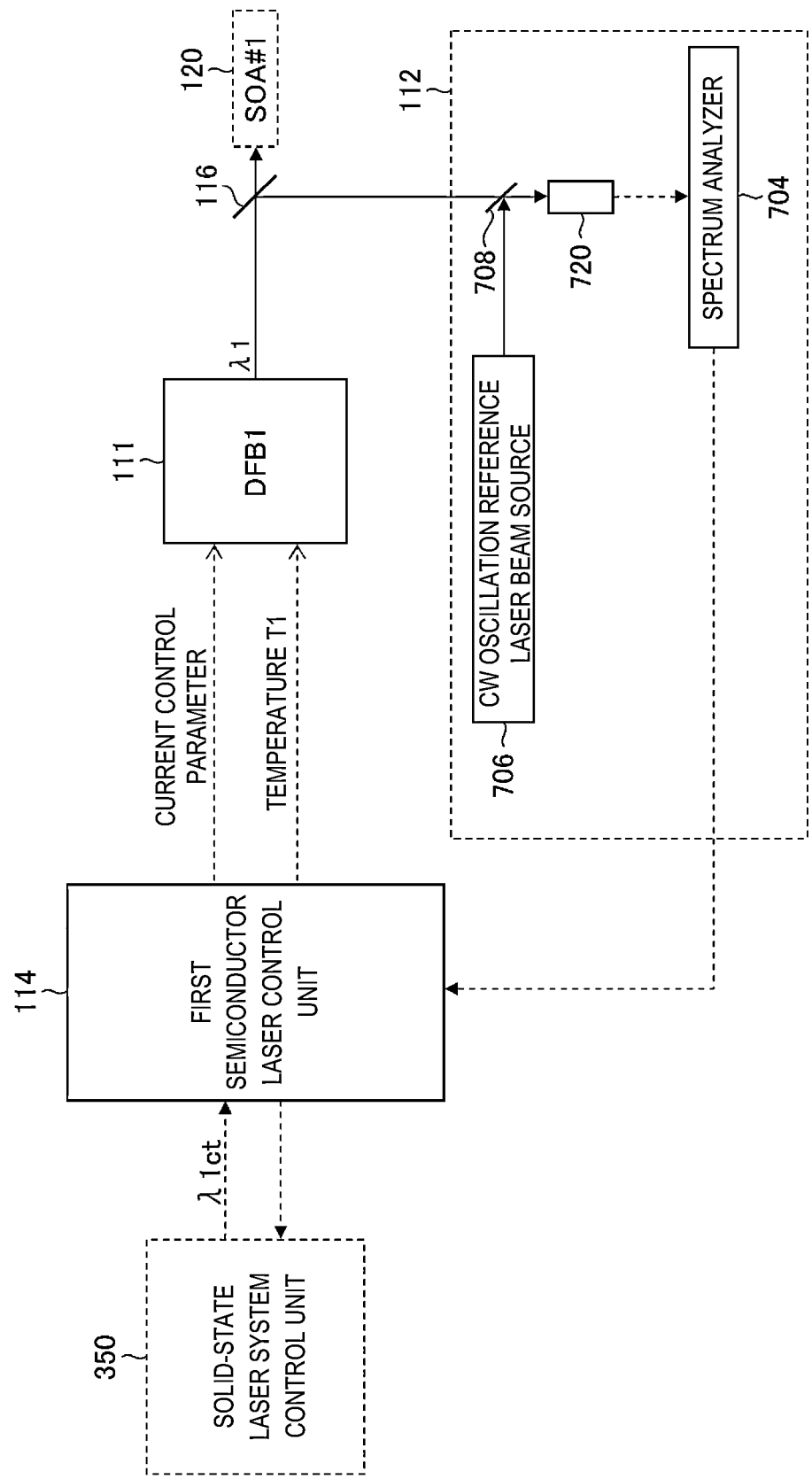
FIG. 69 schematically shows another exemplary configuration of the spectrum monitor.

FIG. 69 schematically shows another exemplary configuration of the spectrum monitor. FIG. 69 shows an example of the first spectrum monitor 112. As shown in FIG. 69, the first spectrum monitor 112 may include a heterodyne interferometer. The first spectrum monitor 112 in FIG. 69 includes a CW oscillation reference laser beam source 706, a beam splitter 708, a light intensity sensor 720, and a spectrum analyzer 704.

As shown in FIG. 69, the beam splitter 708 is arranged in the optical path between the first beam splitter 116 and the light intensity sensor 720. The beam splitter 708 is arranged such that a beam obtained by superimposing a reference laser beam from the CW oscillation reference laser beam source 706 and part of the first semiconductor laser beam output from the first semiconductor laser 111, enters the light intensity sensor 720.

10.2.2 Operation

The first spectrum monitor 112 in FIG. 69 uses the light intensity sensor 720 to measure a change in light intensity of the beam obtained by superimposing the reference laser beam output from the CW oscillation reference laser beam source 706 and part of the laser beam output from the first semiconductor laser 111.

The spectrum analyzer 704 can analyze a beat signal detected by the light intensity sensor 720 to measure a frequency difference between the laser beam of the first semiconductor laser 111 and the reference laser beam and the light intensity. A wavelength difference can be calculated from the frequency difference.

The beat signal is expressed by Expression (35) below.

[Expression 35]

$$I_{PD}=R\cdot[P_C+P_Q+2\sqrt{P_C\cdot P_Q}\cdot\cos\{2\pi(f_c-f_q)t)\}] \quad (35)$$

$I_{PD}$: sensor output signal (beat signal)
R: light sensitivity
t: time
$P_C$: light intensity of reference beam source
$P_Q$: light intensity of detected light
$f_C$: frequency of reference beam source
$f_q$: frequency of detected light Not limited to the first spectrum monitor 112, the second spectrum monitor 212 (see FIG. 24) may have the same configuration as in FIG. 69.

Figure 70:
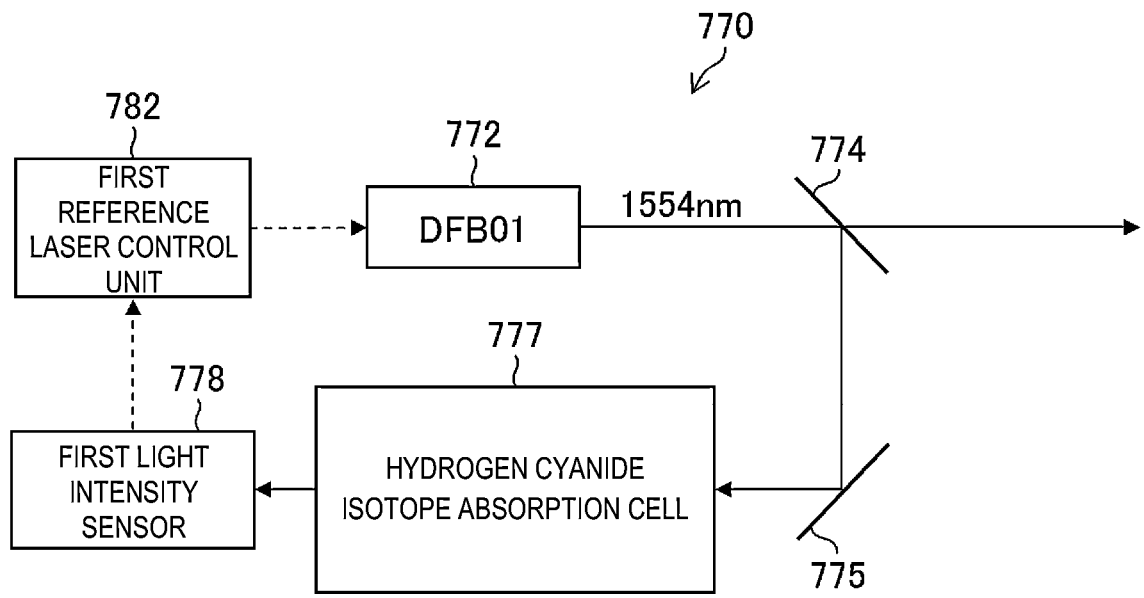
FIG. 70 is a block diagram of an example of a CW oscillation reference laser beam source.

11. Example of CW Oscillation Reference Laser Beam Source 11.1 CW Oscillation Reference Laser Beam Source of Wavelength Region of 1547.2 nm or 1554 nm FIG. 70 is a block diagram of an example of a CW oscillation reference laser beam source. The CW oscillation reference laser beam source 770 includes a first reference semiconductor laser 772, a beam splitter 774, a highly reflective mirror 775, a hydrogen cyanide isotope absorption cell 777, a first light intensity sensor 778, and a first reference laser control unit 782.

The first reference semiconductor laser 772 performs CW oscillation of a laser beam in a wavelength region of 1554 nm. The laser beam reflected by the beam splitter 774 enters the hydrogen cyanide isotope absorption cell 777 via the highly reflective mirror 775.

The absorption cell 777 contains isotope hydrogen cyanide gas. A specific absorption line of the hydrogen cyanide isotope includes, for example, an absorption line of 1553.756 nm.

An acetylene isotope absorption cell may be used as the absorption cell of this wavelength region. Specifically, an absorption cell containing isotope acetylene gas may be used in place of the hydrogen cyanide isotope absorption cell 777.

The laser beam having passed through the hydrogen cyanide isotope absorption cell 777 enters the first light intensity sensor 778.

The first reference laser control unit 782 controls an oscillation wavelength of the first reference semiconductor laser 772 in accordance with a detected signal from the first light intensity sensor 778 such that an absorption line of the hydrogen cyanide isotope absorption cell 777 coincides with the wavelength of the laser beam of the first reference semiconductor laser 772.

The CW oscillation reference laser beam source 770 can be applied as the CW oscillation reference laser beam source 706 of the first spectrum monitor 112 in FIGS. 1, 24, 68, and 69.

11.2 CW Oscillation Reference Laser Beam Source of Wavelength Region of 1030 nm

Figure 71:
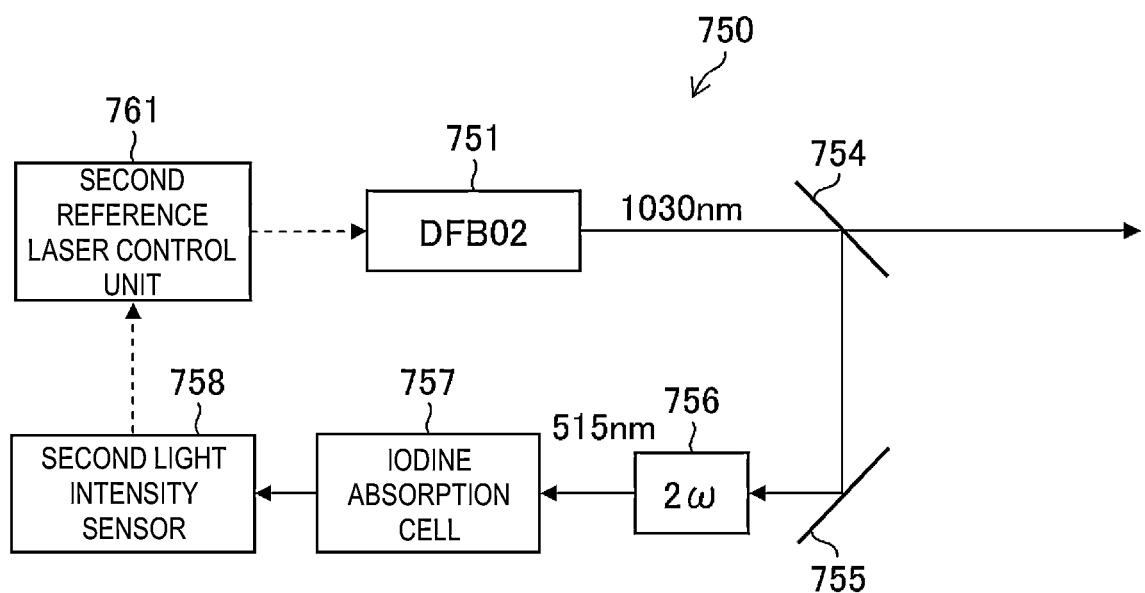
FIG. 71 is a block diagram of another example of the CW oscillation reference laser beam source.

FIG. 71 is a block diagram of another example of a CW oscillation reference laser beam source. A CW oscillation reference laser beam source 750 includes a second reference semiconductor laser 751, a beam splitter 754, a highly reflective mirror 755, a nonlinear crystal 756, an iodine absorption cell 757, a second light intensity sensor 758, and a second reference laser control unit 761.

The second reference semiconductor laser 751 performs CW oscillation of a laser beam in a wavelength region of 1030 nm. The laser beam reflected by the beam splitter 754 enters the nonlinear crystal 756 via the highly reflective mirror 755. The nonlinear crystal 756 generates second harmonic light to obtain a laser beam having a wavelength of about 515 nm. The laser beam having the wavelength of about 515 nm enters the iodine absorption cell 757.

The iodine absorption cell 757 contains iodine gas. A specific absorption line of iodine in the iodine absorption cell 757 includes, for example, an absorption line of 514.581 nm. The laser beam having passed through the iodine absorption cell 757 enters the second light intensity sensor 758.

The second reference laser control unit 761 controls an oscillation wavelength of the second reference semiconductor laser 751 in accordance with a detected signal from the second light intensity sensor 758 such that the absorption line of the iodine absorption cell 757 coincides with the wavelength of the second harmonic light.

The CW oscillation reference laser beam source 750 can be applied as the CW oscillation reference laser beam source of the second spectrum monitor 212 in FIGS. 1 and 24.

12. Example of Semiconductor Optical Amplifier 12.1 Configuration

Figure 72:
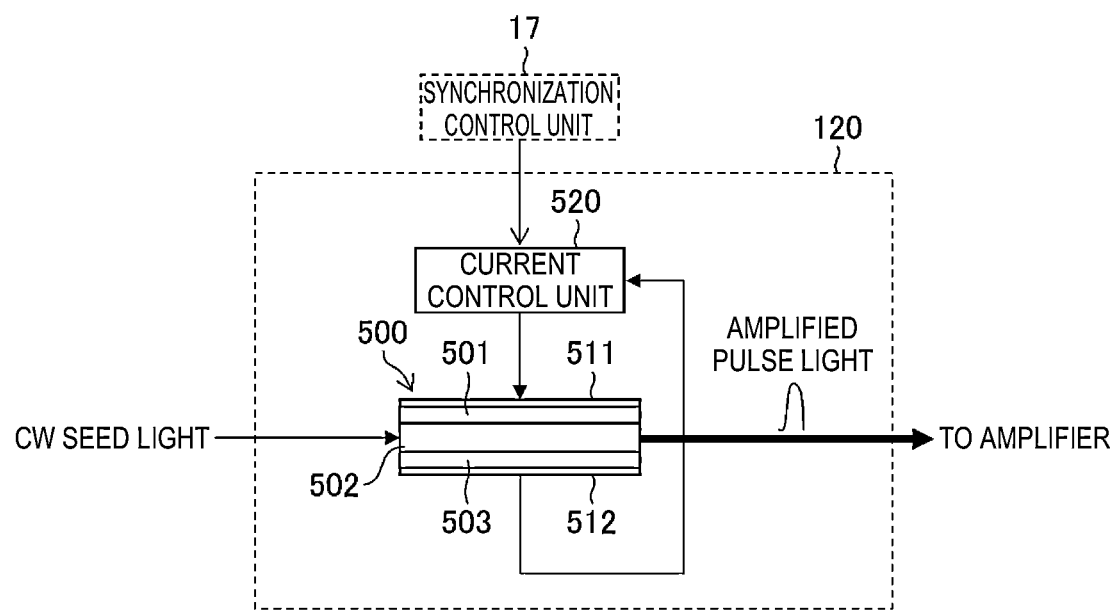
FIG. 72 schematically shows an exemplary configuration of a semiconductor optical amplifier.

FIG. 72 schematically shows an exemplary configuration of a semiconductor optical amplifier. Here, the first semiconductor optical amplifier 120 is exemplified, but other semiconductor optical amplifiers such as the second semiconductor optical amplifier 220 may have the same configuration as in FIG. 72.

The first semiconductor optical amplifier 120 includes a semiconductor element 500 and a current control unit 520. The semiconductor element 500 includes a P-type semiconductor element 501, an active layer 502, an N-type semiconductor element 503, a first electrode 511, and a second electrode 512. The current control unit 520 is connected to the first electrode 511 and the second electrode 512.

12.2 Operation

When current is passed from the first electrode 511 to the second electrode 512, the active layer 502 is excited. When seed light enters the excited active layer 502 and passes through the active layer 502, the seed light is amplified.

Pulse current is passed with the CW seed light entering the active layer 502, and thus the seed light having passed through the active layer 502 is output as a pulse laser beam.

The current control unit 520 controls a value of current passing through the semiconductor element 500 in accordance with a control signal (pulse signal) output from the synchronization control unit 17, and thus the seed light is amplified to light intensity of a laser beam according to the current value.

Pulse current is passed through the first semiconductor optical amplifier 120 and the second semiconductor optical amplifier 220 in FIGS. 1 and 24, and thus CW seed light is amplified in a pulse shape.

Figure 73:
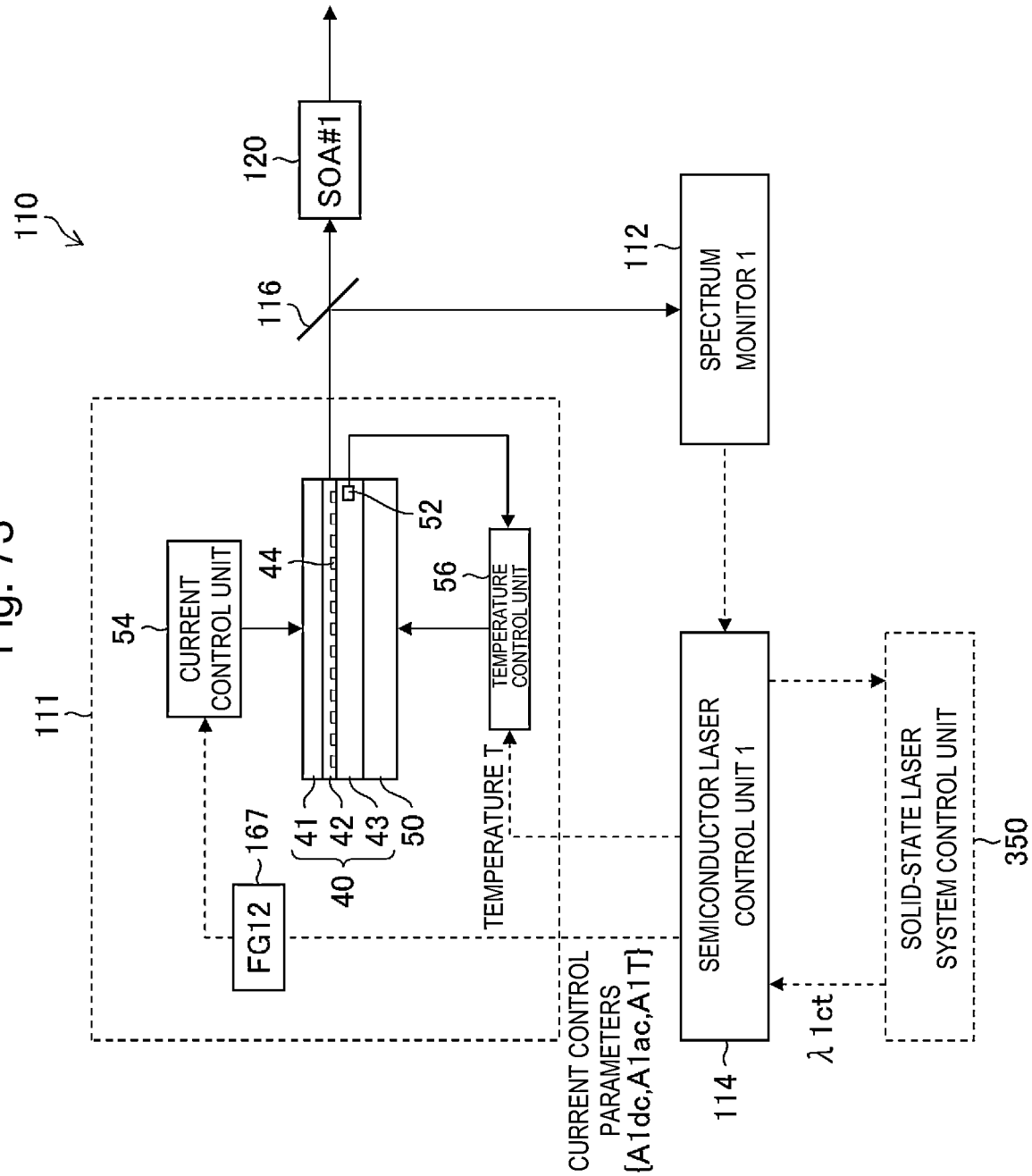
FIG. 73 is a block diagram of another exemplary configuration of the first semiconductor laser system.

13. Example of Semiconductor Laser System Suppressing Stimulated Brillouin Scattering (SBS) of Optical Fiber Amplifier 13.1 Configuration FIG. 73 is a block diagram of another exemplary configuration of the first semiconductor laser system 110. Differences from FIG. 12 will be described. The first semiconductor laser system 110 in FIG. 73 further includes a function generator (FG) 167 for modulation control of current to be passed through the first semiconductor laser 111.

If a seed laser beam is pulse-amplified using an optical fiber amplifier so as to have high pulse energy in use of a semiconductor laser that oscillates in a single longitudinal mode, stimulated Brillouin scattering (SBS) that is a nonlinear phenomenon in an optical fiber occurs due to a narrow spectral line width, which may damage a solid-state laser device. To suppress SBS, increasing the spectral line width of the seed laser beam entering the optical fiber amplifier is effective. The first semiconductor laser system 110 in FIG. 73 uses the function generator 167 to cause chirping by passing current of a sum of a DC component and a high frequency AC component through a single longitudinal mode distributed feedback semiconductor laser (DFB laser), thereby suppressing SBS.

13.2 Operation

An oscillation center wavelength of the DFB laser can be changed by changing a current value and/or a semiconductor setting temperature of the semiconductor element 40.

Control of the spectral line width by chirping of a wavelength at high speed can be realized by changing, at high speed, a value of the current passing through the first semiconductor laser 111.

As shown in FIG. 73, the first semiconductor laser control unit 114 transmits, to the function generator 167, a DC component value A1dc, a variation width A1ac of the AC component, and a period A1T of the AC component as current control parameters, thereby allowing chirping of the wavelength at high speed. This can maintain a spectral line width that suppresses SBS in the optical fiber amplifier (first fiber amplifier 140).

The function generator 167 outputs, to the current control unit 54, an electric signal having a waveform corresponding to the current control parameters specified by the first semiconductor laser control unit 114. The current control unit 54 performs current control to pass current corresponding to the electric signal from the function generator 167 through the semiconductor element 40. The function generator 167 may be provided outside the first semiconductor laser 111. For example, the function generator 167 may be included in the first semiconductor laser control unit 114.

Figure 74:
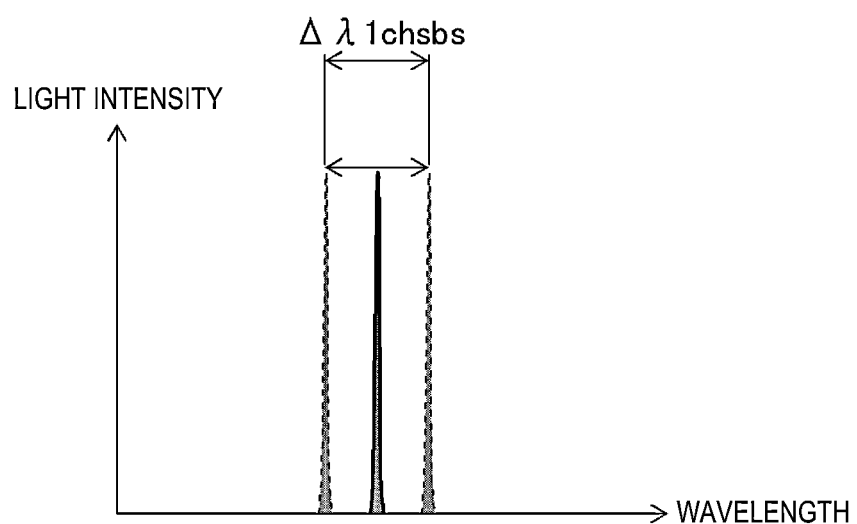
FIG. 74 is a conceptual view of a spectral line width realized by chirping.

FIG. 74 is a conceptual view of a spectral line width realized by chirping. A spectral line width 4λ1chsbs is measured as a difference between a maximum wavelength and a minimum wavelength generated by chirping.

The current control parameters of the first semiconductor laser system 110 include the following values.

A1dc: DC component value of current passing through semiconductor element

A1ac: variation width of AC component of current passing through semiconductor element (difference between maximal value and minimal value of current)

A1T: period of AC component of current passing through semiconductor element

The AC component value A1ac as the current control parameter is such that a spectral line width 4λ1chsbs is obtained at which SBS is suppressed in the first fiber amplifier 140.

The DC component value A1dc as the current control parameter can be controlled to control the center wavelength at high speed.

A relationship between a duration D of a pulse amplified by the first semiconductor optical amplifier 120 and the period A1T of the AC component preferably satisfies Expression (36) below.

$$D = n \cdot A1T \qquad (36)$$

where n is an integer of one or more.

By satisfying the relationship in Expression (36), a change in spectral waveform of the pulse laser beam amplified at any timing by the first semiconductor optical amplifier 120 can be suppressed.

Even if Expression (36) is not satisfied, a pulse width range of the first semiconductor optical amplifier 120 is, for example, 10 ns to 50 ns. The period A1T of the AC component of the current passing through the semiconductor element is sufficiently shorter than the pulse width (duration D of amplified pulse) of the first semiconductor optical amplifier 120. For example, the period is preferably one thousandth or longer and one tenth or shorter of the pulse width of the first semiconductor optical amplifier 120. The period may be more preferably one thousandth or longer and one hundredth or shorter.

13.3 Effect

The configuration described in FIG. 73 can be used to suppress SBS in the first fiber amplifier 140.

13.4 Others

FIG. 73 illustrates the first semiconductor laser system 110, but the second semiconductor laser system 210 may have the same configuration as in FIG. 73.

14. Embodiment 7

14.1 Configuration

Figure 75:
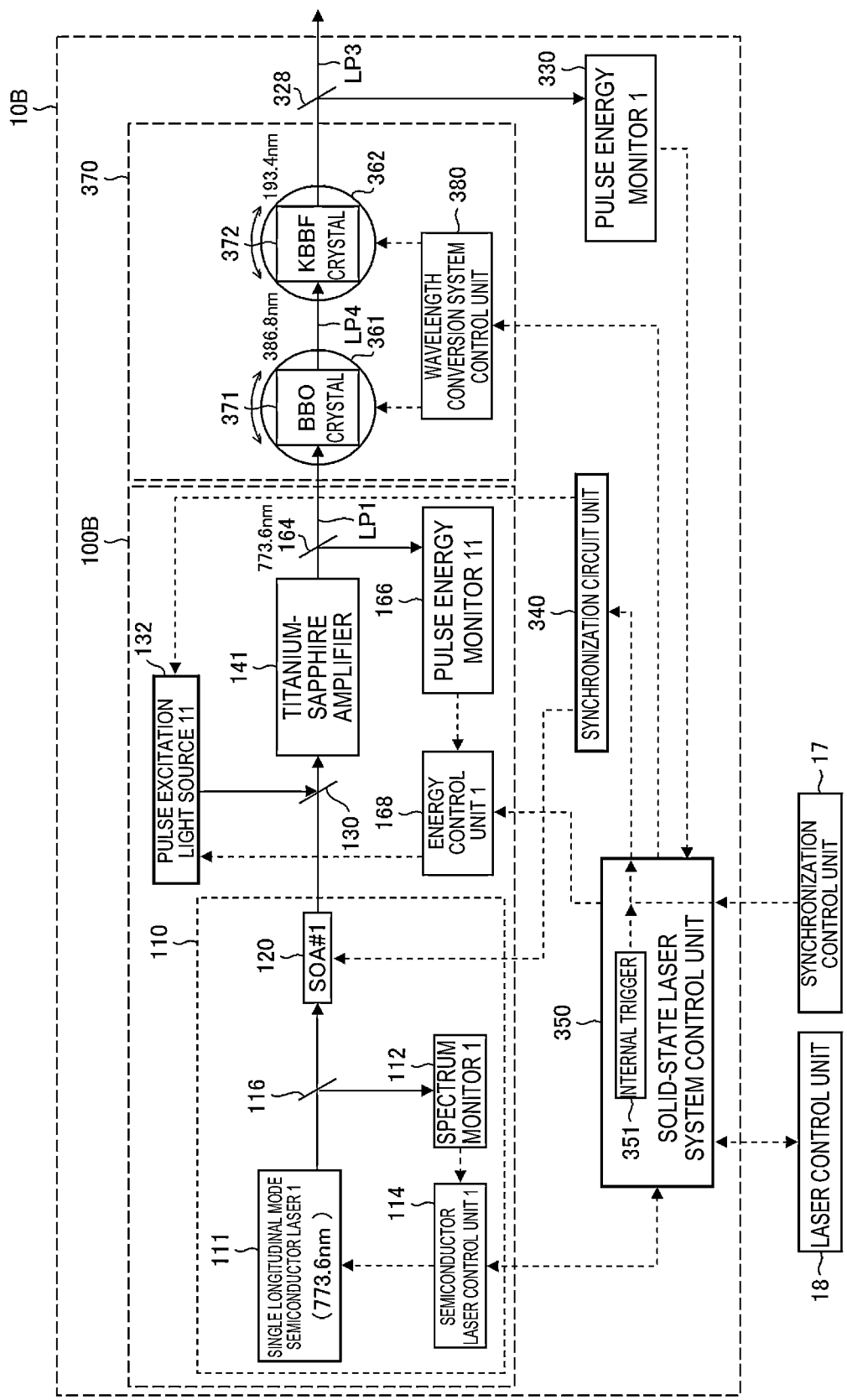
FIG. 75 schematically shows an example of a laser system according to Embodiment 7.

FIG. 75 schematically shows an example of a laser system according to Embodiment 7. Here, only a solid-state laser system 10B is shown. The solid-state laser system 10B in FIG. 75 may be applied in place of the solid-state laser system 10 in Embodiments 1 and 2 described with reference to FIG. 24. Differences from FIG. 24 will be described.

The solid-state laser system 10B in FIG. 75 includes a first solid-state laser device 100B and a wavelength conversion system 370 in place of the first solid-state laser device 100 and the wavelength conversion system 300 in FIG. 24. The solid-state laser system 10B does not include the second solid-state laser device 200.

In the solid-state laser system 10B, the first solid-state laser device 100B outputs a first pulse laser beam LP1 having a wavelength of about 773.6 nm, and the wavelength conversion system 370 wavelength-converts the first pulse laser beam LP1 into fourth harmonic light to obtain a pulse laser beam (third pulse laser beam LP3) having a wavelength of about 193.4 nm.

The first solid-state laser device 100B has the same configuration as the first solid-state laser device 100 in FIG. 24. A difference is that the first solid-state laser device 100 in FIG. 24 has an oscillation wavelength of about 1547.2 nm, while the first solid-state laser device 100B in FIG. 75 has an oscillation wavelength of about 773.6 nm.

The first solid-state laser device 100B includes a titanium-sapphire amplifier 141 in place of the first fiber amplifier 140 in FIG. 24, and uses, as the first pulse excitation light source 132, a laser device that outputs a pulse laser beam that is second harmonic light of an yttrium lithium fluoride (YLF) laser. The titanium-sapphire amplifier 141 includes a titanium-sapphire crystal as a gain medium. "YLF" is a solid-state laser crystal represented by a chemical formula $LiYF_4$.

The wavelength conversion system 370 includes a plurality of nonlinear crystals, and wavelength-converts the received pulse laser beam to output a pulse laser beam that is fourth harmonic light. For example, the wavelength conversion system 370 includes a BBO crystal 371 and a KBBF crystal 372. "BBO" is represented by a chemical formula β-$BaB_2O_4$. "KBBF" is represented by a chemical formula $KBe_2BO_3F_2$.

The BBO crystal 371 is an example of "first nonlinear crystal" in the present disclosure. The KBBF crystal 372 is an example of "second nonlinear crystal" in the present disclosure.

The BBO crystal 371 is arranged on the first rotation stage 361. The KBBF crystal 372 is arranged on the second rotation stage 362.

14.2 Operation

The first pulse laser beam LP1 output from the first solid-state laser device 100B enters the BBO crystal 371 in the wavelength conversion system 370. The BBO crystal 371 converts the pulse laser beam having a wavelength of about 773.6 nm into a pulse laser beam having a wavelength of about 386.8 nm that is second harmonic light.

The KBBF crystal 372 converts the pulse laser beam having the wavelength of about 386.8 nm output from the BBO crystal 371 into the pulse laser beam having the wavelength of about 193.4 nm that is fourth harmonic light.

The pulse laser beam output from the wavelength conversion system 370 is output from the solid-state laser system 10B via the beam splitter 328.

When a variable range of the wavelength of the pulse laser beam output from the laser system including the solid-state laser system 10B is, for example, 193.2 nm to 193.5 nm, a variable range of the wavelength of the first semiconductor laser 111 is 772.8 nm to 774.0 nm.

When pulse energy of the first pulse laser beam LP1 having the wavelength of 773.6 nm is E1, and pulse energy of the fourth pulse laser beam LP4 having the wavelength of 386.8 nm is E4, pulse energy Es of the third pulse laser beam LP3 having the wavelength of 193.4 nm output from the wavelength conversion system 370 is expressed by the following expressions.

$$E1^2 \cdot \eta 1 = E4 \tag{37}$$

$\eta 1$: efficiency of wavelength conversion from first pulse laser beam LP1 into fourth pulse laser beam LP4

$$E4^2 \cdot \eta 2 = Es \tag{38}$$

$\eta 2$: efficiency of wavelength conversion from fourth pulse laser beam LP4 into third pulse laser beam LP3

$$E1^4 \cdot \eta = Es \tag{39}$$

$$\eta = \eta 1^2 \cdot \eta 2 \tag{40}$$

As shown in Expression (39), the pulse energy Es of the third pulse laser beam LP3 output from the solid-state laser system 10B is proportional to the fourth power of the pulse energy E1 of the first pulse laser beam LP1.

As described with reference to FIGS. 58 and 59, the wavelength dependence of the wavelength conversion efficiency $\eta$ of the wavelength conversion system 370 may be stored as the table data TD4.

The wavelength conversion system control unit 380 uses the table data TD4 to control an incident angle θ1 on the BBO crystal 371 and an incident angle θ2 on the KBBF crystal 372. Specifically, the wavelength conversion system control unit 380 controls the first rotation stage 361 to obtain an incident angle θ1 on the BBO crystal 371 such that the wavelength of the fourth pulse laser beam LP4 is 386.8 nm and the wavelength conversion efficiency $\eta 1$ is maximum, and controls the second rotation stage 362 to obtain an incident angle θ2 on the KBBF crystal 372 such that the wavelength of the third pulse laser beam LP3 is 193.4 nm and the wavelength conversion efficiency is maximum.

Then, from the pulse energy E1 of the first pulse laser beam LP1 and the pulse energy Es of the third pulse laser beam LP3 when the target center wavelength λct changes around 193.4 nm, the wavelength conversion efficiency $\eta$ may be calculated by Expression (41) below.

$$\eta = Es/E1^4 \tag{41}$$

14.3 Control Example of Wavelength

When receiving data of the target center wavelength λct from the exposure apparatus 20, the laser control unit 18 transmits the data of the target center wavelength λct to the solid-state laser system control unit 350. The solid-state laser system control unit 350 calculates, from the target center wavelength λct instructed by the exposure control unit 22 of the exposure apparatus 20, a target center wavelength λ1ct instructed to the first semiconductor laser control unit 114 by Expression (42) below.

$$\lambda 1ct = 4 \cdot \lambda ct \tag{42}$$

Specifically, the solid-state laser system control unit 350 calculates the target center wavelength λ1ct of the first semiconductor laser 111 from Expression (42), and transmits data of the target center wavelength λ1ct to the first semiconductor laser control unit 114. Further, the solid-state laser system control unit 350 transmits the data of the target center wavelength λ1ct to the wavelength conversion system control unit 380.

The first semiconductor laser control unit 114 performs feedback control of the first semiconductor laser 111 in accordance with a measurement result from the first spectrum monitor 112 such that the center wavelength of the first semiconductor laser 111 is λ1ct.

When receiving the data of the target center wavelength λct, the wavelength conversion system control unit 380 calculates an average value (average target center wavelength λctav) of a predetermined sample number of target center wavelengths λct. Then, the wavelength conversion system control unit 380 controls the first rotation stage 361 and the second rotation stage 362 to obtain incident angles θ1 and θ2 on the BBO crystal 371 and the KBBF crystal 372 such that the wavelength conversion efficiency is maximum at the calculated average target center wavelength λctav.

The wavelength conversion system control unit 380 calculates a difference δλct (=λct−λctav) between the target center wavelength λct and the average target center wavelength λctav, calculates wavelength conversion efficiency $\eta$ from the table data TD4, and transmits data of the wavelength conversion efficiency $\eta$ to the solid-state laser system control unit 350 and the laser control unit 18.

14.4 Control Example of Pulse Energy

14.4.1 Case of Operation in Saturation Region of Input/Output Characteristic of Excimer Amplifier Embodiment 7 may include the combination of control as in Embodiment 3. Specifically, as described with reference to FIG. 45, satisfying a condition of Expression (25) that a ratio between the rate of change Ear in the pulse energy of the excimer-amplified pulse laser beam and the rate of change Esr in the pulse energy of the third pulse laser beam LP3 (Ear/Esr) is 0.01 or lower can stabilize the pulse energy of the pulse laser beam output from the excimer amplifier 14.

In this case, the first energy control unit 168 performs pulse energy control with target pulse energy E1t of the first pulse laser beam LP1 output from the first solid-state laser device 100B being set to a predetermined fixed value E10.

14.4.2 Case of Correction of Pulse Energy by Controlling Excitation Intensity of Excimer Amplifier Embodiment 7 may include the combination of control as in Embodiment 4. Specifically, the target pulse energy E1t of the first pulse laser beam LP1 output from the first solid-state laser device 100B is set to the predetermined fixed value E10. Then, the laser control unit 18 predictively calculates the pulse energy of the third pulse laser beam LP3 injected into the excimer amplifier 14, and controls, in accordance with a predicted value Esest, excitation intensity (charging voltage Vhv) of the excimer amplifier 14 such that the pulse energy is close to target pulse energy Et.

14.4.3 Example of Suppressing Pulse Energy Variation by Pulse Energy Control of First Solid-State Laser Device Embodiment 7 may include the combination of control as in Embodiment 5. Specifically, the target pulse energy E1t of the first pulse laser beam LP1 may be controlled such that the pulse energy of the third pulse laser beam LP3 output from the solid-state laser system 10B is a target value Est (=Es0 (fixed value)). In this case, the target pulse energy E1t is expressed from Expression (39) by Expression (43) below.

$$E1t = (Es0/\eta)^{1/4} \quad (43)$$

14.5 Variant

In the same configuration as in the laser system according to Embodiment 7 (FIG. 75), the table data TD1, TD2 as in Embodiment 2 may be used to control the incident angles θ1, θ2 for each wavelength range.

15. Electronic Device Manufacturing Method

Figure 76:
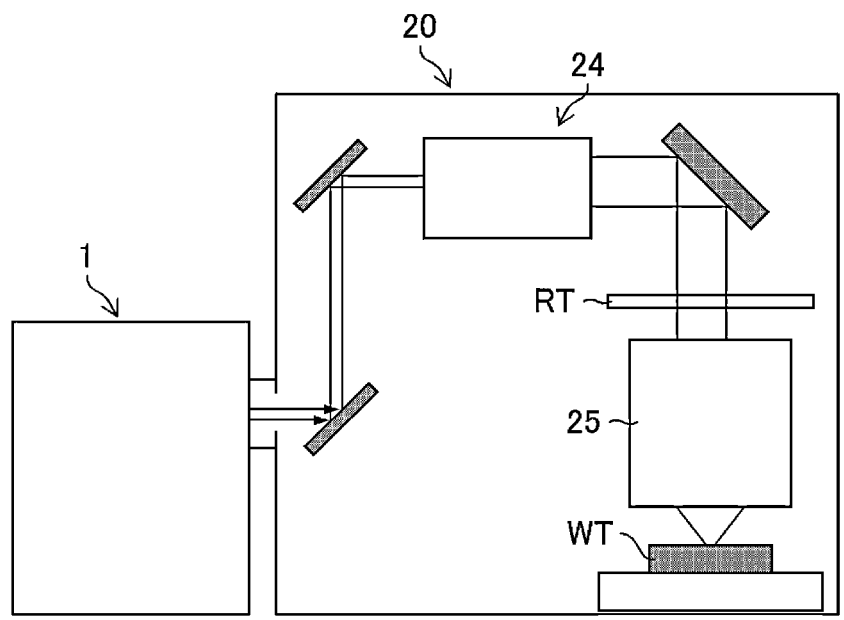
FIG. 76 schematically shows an exemplary configuration of an exposure apparatus.

FIG. 76 schematically shows an exemplary configuration of the exposure apparatus 20. In FIG. 76, the exposure apparatus 20 includes an illumination optical system 24 and a projection optical system 25. The illumination optical system 24 illuminates, with a laser beam incident from the laser system 1, a reticle pattern on a reticle stage RT. The projection optical system 25 reduces and projects the laser beam having passed though the reticle and forms an image thereof on a workpiece (not shown) arranged on a workpiece table WT. The workpiece is a photosensitive substrate such as a semiconductor wafer coated with photoresist. The exposure apparatus 20 synchronously translates the reticle stage RT and the workpiece table WT to expose the laser beam reflecting the reticle pattern onto the workpiece. Through the exposure process as described above, a device pattern is transferred onto the semiconductor wafer, thereby manufacturing a semiconductor device. The semiconductor device is an example of "electronic device" in the present disclosure. The laser system 1 may be the laser system 1A or the like described in the embodiments.

16. Others

The description above is intended to be illustrative and the present disclosure is not limited thereto. Therefore, it will be obvious to those skilled in the art that various modifications to the embodiments of the present disclosure would be possible without departing from the spirit and the scope of the claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A laser system comprising:
   a wavelength-variable first solid-state laser device configured to output a first pulse laser beam;
   a wavelength conversion system including a first nonlinear crystal configured to wavelength-convert the first pulse laser beam output from the first solid-state laser device and a first rotation stage configured to change a first incident angle of the first pulse laser beam on the first nonlinear crystal;
   an excimer amplifier configured to amplify a pulse laser beam wavelength-converted by the wavelength conversion system; and
   a control unit configured to receive, from an external device, data of a target center wavelength of an excimer laser beam output from the excimer amplifier, and control the first incident angle on the first nonlinear crystal such that wavelength conversion efficiency of the first nonlinear crystal has a maximal value at a middle wavelength in a first wavelength range to which the target center wavelength belongs,
   the first wavelength range being separated to include, as a boundary wavelength in the first wavelength range, a wavelength at which a first allowable efficiency minimum value lower than maximum conversion efficiency of the first nonlinear crystal is obtained in accordance with a characteristic of the wavelength conversion efficiency of the first nonlinear crystal changing depending on the first incident angle and the wavelength, and the wavelength conversion efficiency of the first nonlinear crystal being determined to be equal to or higher than the first allowable efficiency minimum value at a specific first incident angle for each first wavelength range.

2. The laser system according to claim 1, wherein the first allowable efficiency minimum value is 80% or higher of the maximum conversion efficiency of the first nonlinear crystal.

3. The laser system according to claim 1, wherein the control unit controls the first solid-state laser device such that pulse energy of the first pulse laser beam output from the first solid-state laser device has a predetermined constant value, and
   when pulse energy of the excimer laser beam output from the excimer amplifier with wavelength conversion efficiency of the wavelength conversion system being maximum is Emax, an allowable energy decrease rate allowed for Emax is Ear, a minimum energy value allowed for the pulse energy of the excimer laser beam is Emin, pulse energy of the pulse laser beam after wavelength conversion output from the wavelength conversion system with the wavelength conversion efficiency of the wavelength conversion system being maximum is Esmax, a lower limit of a range of variation of the pulse energy of the pulse laser beam after wavelength conversion output from the wavelength conversion system due to a change in the wavelength of the first pulse laser beam is Esmin, and a rate of change in the pulse energy of the pulse laser beam after wavelength conversion output from the wavelength conversion system is Esr, the following expressions are satisfied:

$Ear=(Emax-Emin)/Emax$ $Esr=(Esmax-Esmin)/Esmax$ $Ear/Esr \leq 0.01.$

4. The laser system according to claim 1, wherein the control unit controls the first solid-state laser device such that the pulse energy of the first pulse laser beam output from the first solid-state laser device has a predetermined constant value, calculates a predicted value of the pulse energy of the pulse laser beam after wavelength conversion output from the wavelength conversion system in accordance with the pulse energy of the first pulse laser beam and the wavelength conversion efficiency of the wavelength conversion system, and controls a charging voltage of the excimer amplifier in accordance with the predicted value and target pulse energy of the excimer laser beam output from the excimer amplifier.

5. The laser system according to claim 1, wherein the control unit controls the pulse energy of the first pulse laser beam output from the first solid-state laser device such that the pulse energy of the pulse laser beam after wavelength conversion output from the wavelength conversion system has a predetermined target value.

6. The laser system according to claim 1, wherein the wavelength conversion system includes a second nonlinear crystal that the pulse laser beam wavelength-converted by the first nonlinear crystal enters, and a second rotation stage configured to change a second incident angle, on the second nonlinear crystal, of the pulse laser beam wavelength-converted by the first nonlinear crystal, the control unit controls the second incident angle on the second nonlinear crystal such that wavelength conversion efficiency of the second nonlinear crystal has a maximal value at a middle wavelength in a second wavelength range to which the target center wavelength instructed by the external device belongs, the second wavelength range is separated to include, as a boundary wavelength in the second wavelength range, a wavelength at which a second allowable efficiency minimum value lower than maximum conversion efficiency of the second nonlinear crystal is obtained in accordance with a characteristic of the wavelength conversion efficiency of the second nonlinear crystal changing depending on the second incident angle and the target center wavelength, and the wavelength conversion efficiency of the second nonlinear crystal is determined to be equal to or higher than the second allowable efficiency minimum value at a specific second incident angle for each second wavelength range.

7. The laser system according to claim 1, further comprising a second solid-state laser device configured to output a second pulse laser beam having a wavelength different from the wavelength of the first pulse laser beam, wherein the first nonlinear crystal generates first sum frequency light from the first pulse laser beam and the second pulse laser beam, the wavelength conversion system outputs a third pulse laser beam as the pulse laser beam after wavelength conversion from the first pulse laser beam and the second pulse laser beam, and the third pulse laser beam enters the excimer amplifier.

* * * * *